(12) United States Patent
Hwang et al.

(10) Patent No.: US 11,024,640 B2
(45) Date of Patent: Jun. 1, 2021

(54) THREE-DIMENSIONAL SEMICONDUCTOR MEMORY DEVICE AND METHOD OF FABRICATING THE SAME

(71) Applicant: Samsung Electronics Co., Ltd., Suwon-si (KR)

(72) Inventors: Sung-Min Hwang, Hwaseong-si (KR); Joon-Sung Lim, Suwon-si (KR); Jiyoung Kim, Yongin-si (KR); Jiwon Kim, Seoul (KR); Woosung Yang, Gwangmyeong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/514,557

(22) Filed: Jul. 17, 2019

(65) Prior Publication Data

US 2020/0152654 A1 May 14, 2020

(30) Foreign Application Priority Data

Nov. 12, 2018 (KR) .................. 10-2018-0138049

(51) Int. Cl.
*H01L 27/11578* (2017.01)
*H01L 27/11573* (2017.01)
(Continued)

(52) U.S. Cl.
CPC .. *H01L 27/11578* (2013.01); *H01L 27/11519* (2013.01); *H01L 27/11521* (2013.01);
(Continued)

(58) Field of Classification Search
CPC ......... H01L 27/11578; H01L 27/11519; H01L 27/11521; H01L 27/11526; H01L 27/11551; H01L 27/11565; H01L 27/11568; H01L 27/11573; H01L 27/11524; H01L 27/11517–1156; H01L 29/42324–42336; H01L 29/788–7889;
(Continued)

(56) References Cited

U.S. PATENT DOCUMENTS 7,799,672 B2  9/2010  Hashimoto et al.
8,592,912 B2  11/2013  Hwang et al.
(Continued)

*Primary Examiner* — Shahed Ahmed
(74) *Attorney, Agent, or Firm* — Harness, Dickey & Pierce, P.L.C.

(57) ABSTRACT

Disclosed are three-dimensional semiconductor memory devices and methods of fabricating the same. A three-dimensional semiconductor memory device including a substrate including a cell array region and a connection region, an electrode structure including a plurality of electrodes and a plurality of dielectric layers alternately stacked on the substrate, the electrode structure having a stepwise portion on the connection region, an etch stop structure on the stepwise portion of the electrode structure, and a plurality of contact plugs on the connection region, the contact plugs penetrating the etch stop structure and connected to corresponding pad portions of the electrodes, respectively, may be provided. The etch stop structure may include an etch stop pattern and a horizontal dielectric layer, which has have a uniform thickness and covers a top surface and a bottom surface of an etch stop pattern.

20 Claims, 44 Drawing Sheets

(51) Int. Cl.
*H01L 27/11568* (2017.01)
*H01L 27/11551* (2017.01)
*H01L 27/11519* (2017.01)
*H01L 27/11521* (2017.01)
*H01L 27/11526* (2017.01)
*H01L 27/11565* (2017.01)

(52) U.S. Cl.
CPC .. *H01L 27/11526* (2013.01); *H01L 27/11551* (2013.01); *H01L 27/11565* (2013.01); *H01L 27/11568* (2013.01); *H01L 27/11573* (2013.01)

(58) Field of Classification Search
CPC .... G11C 11/5621–5642; G11C 16/0408–0458
See application file for complete search history.

(56) References Cited

U.S. PATENT DOCUMENTS

| | | | |
|---|---|---|---|
| 8,704,288 B2 | 4/2014 | Lee et al. | |
| 8,828,884 B2 | 9/2014 | Lee et al. | |
| 9,425,209 B1 | 8/2016 | Yang et al. | |
| 9,570,393 B2 | 2/2017 | Oh | |
| 9,865,540 B2 | 1/2018 | Kim et al. | |
| 2013/0313627 A1* | 11/2013 | Lee | H01L 27/11565 |
| | | | 257/324 |
| 2014/0054787 A1* | 2/2014 | Eun | H01L 21/76877 |
| | | | 257/773 |
| 2019/0096810 A1* | 3/2019 | Zhu | H01L 21/76832 |
| 2020/0258837 A1* | 8/2020 | Zhu | H01L 21/76895 |

* cited by examiner

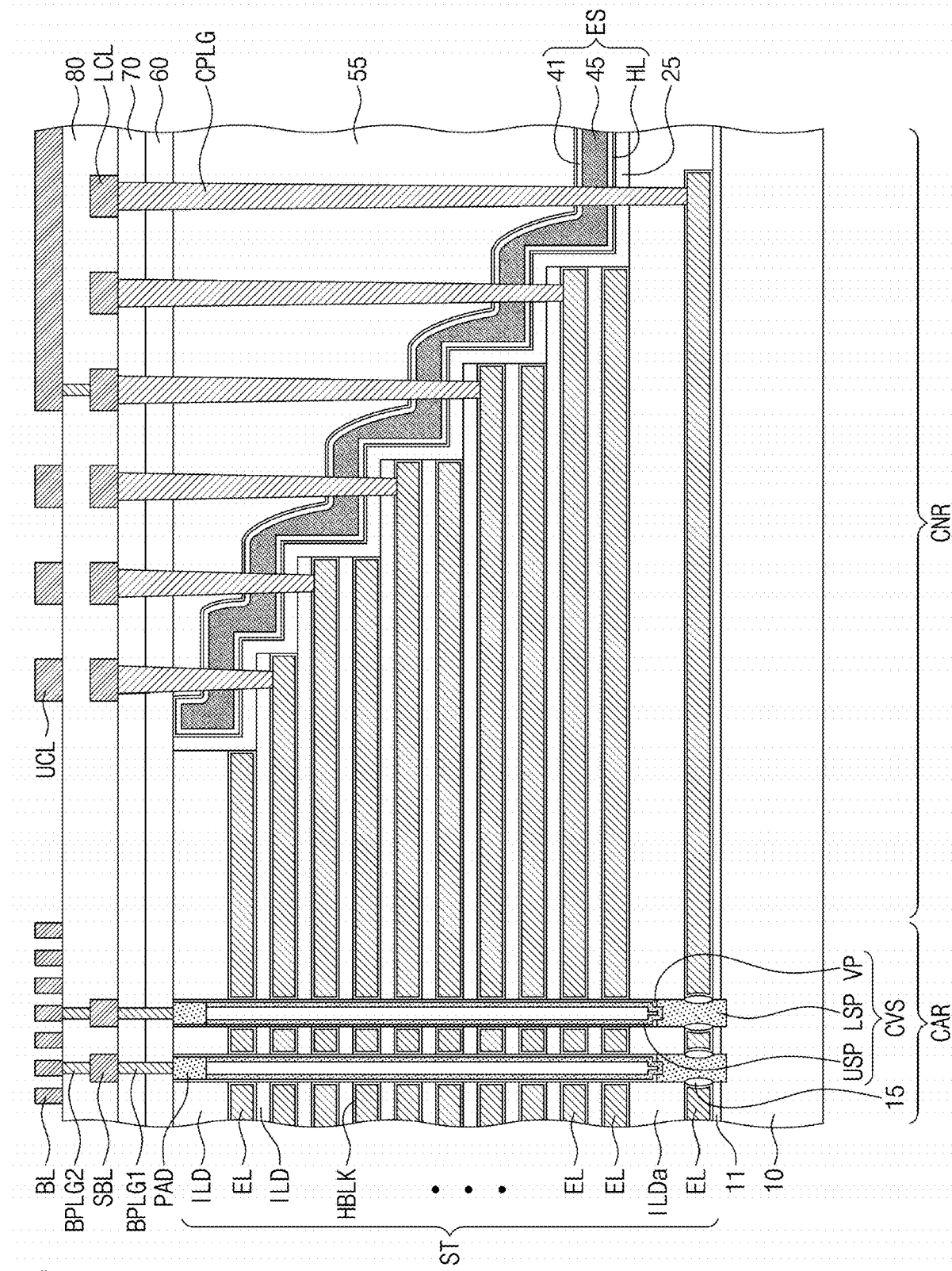

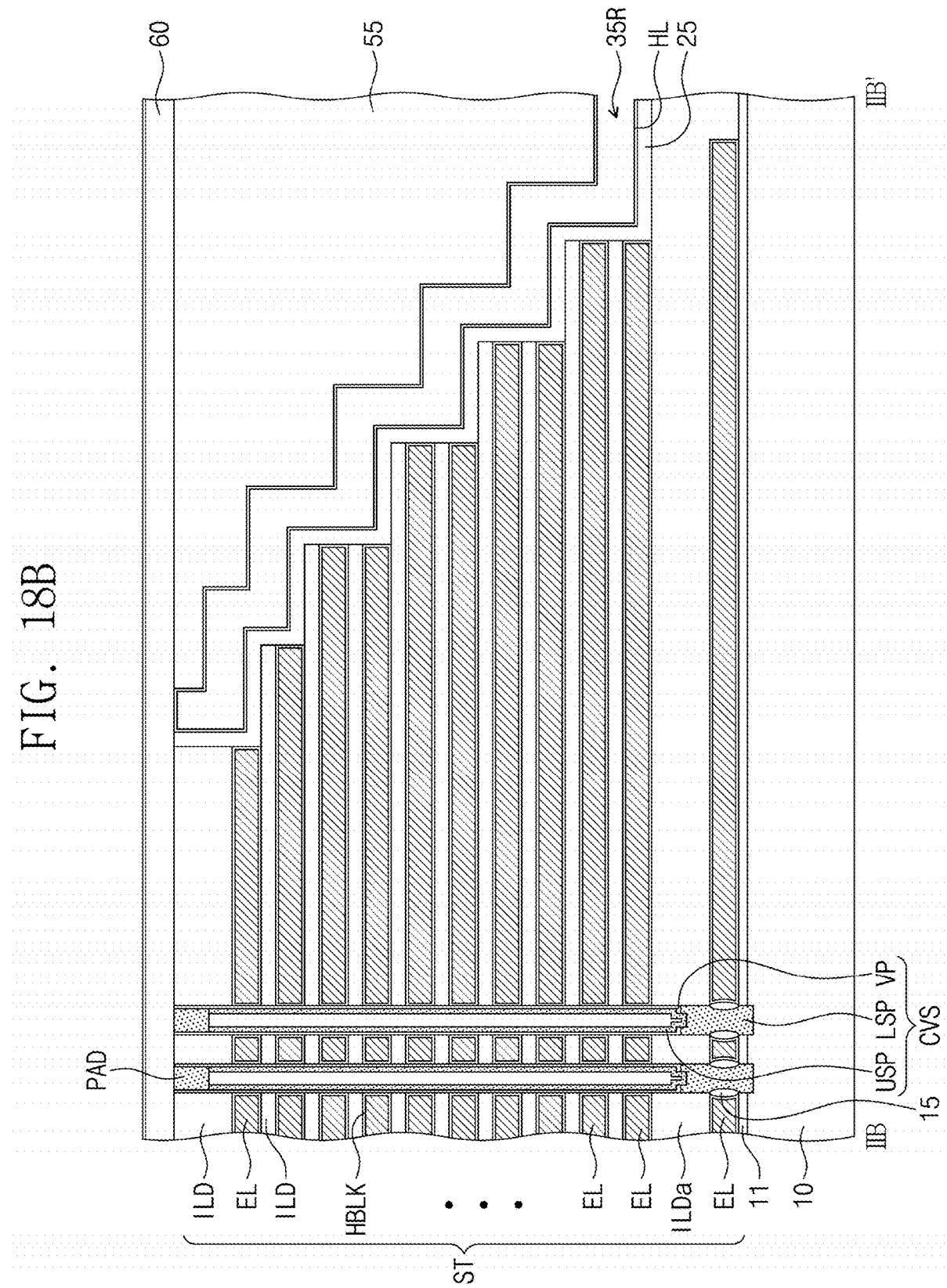

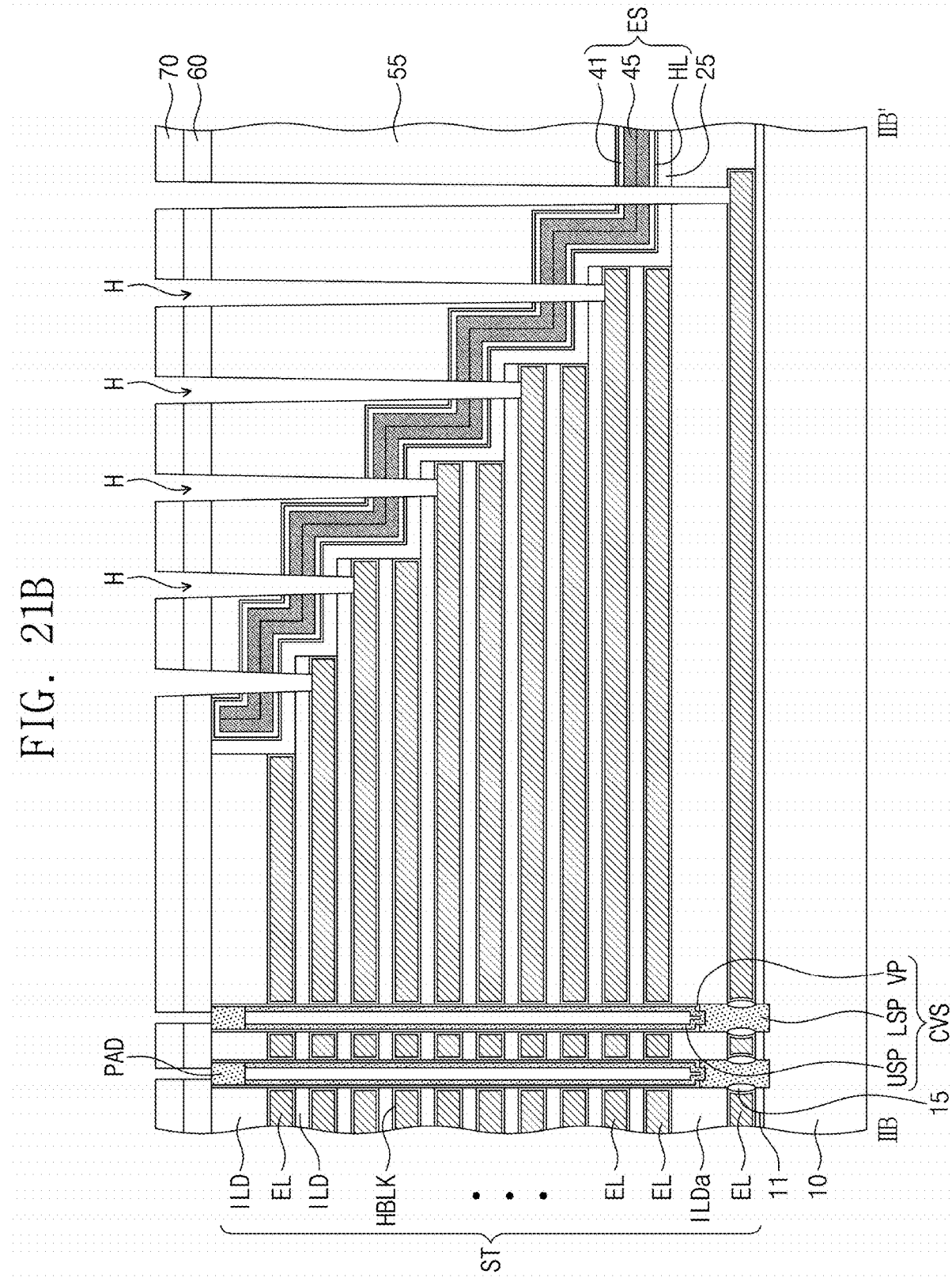

THREE-DIMENSIONAL SEMICONDUCTOR MEMORY DEVICE AND METHOD OF FABRICATING THE SAME

CROSS-REFERENCE TO RELATED APPLICATION

This U.S. non-provisional application claims priority under 35 U.S.C. § 119 to Korean Patent Application No. 10-2018-0138049 filed on Nov. 12, 2018 in the Korean Intellectual Property Office, the entire contents of which are hereby incorporated by reference.

BACKGROUND

The present inventive concepts relate to semiconductor devices and/or methods of fabricating the same, and more particularly, to highly integrated three-dimensional semiconductor memory devices and/or methods of fabricating the same.

Semiconductor devices have been highly integrated to meet high performance and low manufacturing cost which are desired by customers. Because integration of the semiconductor devices is an important factor in determining product price, high integration is increasingly desired. Therefore, there have been proposed three-dimensional semiconductor memory devices in which memory cells are three-dimensionally arranged.

SUMMARY

Some example embodiments of the present inventive concepts provide three-dimensional semiconductor memory devices with increased integration and/or methods of fabricating the same.

According to an example embodiment of the present inventive concepts, a three-dimensional semiconductor memory device may include a substrate including a cell array region and a connection region, an electrode structure including a plurality of electrodes and a plurality of dielectric layers alternately stacked on the substrate, the electrode structure having a stepwise portion on the connection region, an etch stop structure on the stepwise portion of the electrode structure, and a plurality of contact plugs on the connection region, the contact plugs penetrating the etch stop structure and connected to corresponding pad portions of the electrodes, respectively. The etch stop structure may include an etch stop pattern and a horizontal dielectric layer, which has have a uniform thickness and covers a top surface and a bottom surface of an etch stop pattern.

According to an example embodiment of the present inventive concepts, a three-dimensional semiconductor memory device may include a substrate including a cell array region and a connection region, an electrode structure including a plurality of electrodes and a plurality of dielectric layers alternately stacked in a first direction perpendicular to a top surface of the substrate, the electrode structure extending in a second direction parallel to the top surface of the substrate, the electrode structure having a stepwise portion on the connection region, an etch stop pattern covering the stepwise portion of the electrode structure, and a common source plug penetrating the electrode structure in the first direction and extending in the second direction. A first distance between a sidewall of the common source plug and a sidewall of the etch stop pattern may be different from a second distance between the sidewall of the common source plug and sidewalls of the electrodes.

According to an example embodiment of the present inventive concepts, a three-dimensional semiconductor memory device may include a substrate including a cell array region and a connection region, an electrode structure including a plurality of electrodes and a plurality of dielectric layers alternately stacked on the substrate, the electrode structure having a stepwise portion on the connection region, an etch stop structure covering the stepwise portion of the electrode structure, and a plurality of contact plugs on the connection region, the contact plugs penetrating the etch stop structure and connected to corresponding pad portions of the electrodes, respectively. The etch stop structure may include an etch stop pattern, which includes a dielectric material different from a dielectric material of the dielectric layers, and has therein an interface that is defined along the stepwise portion.

According to an example embodiment of the present inventive concepts, a three-dimensional semiconductor memory device may include a substrate including a cell array region and a connection region, an electrode structure including a plurality of electrodes and a plurality of dielectric layers alternately stacked on the substrate, the electrode structure having a stepwise portion on the connection region, a horizontal blocking dielectric layer covering both a top surface and a bottom surface of the electrodes, an etch stop structure on the stepwise portion of the electrode structure, and a plurality of contact plugs on the connection region, the contact plugs penetrating the etch stop structure and connected to corresponding pad portions of the electrodes, respectively. The etch stop structure may include an etch stop pattern and a horizontal dielectric layer, which covers both a top surface and a bottom surface of the etch stop pattern, and includes a material same as a material of the horizontal blocking dielectric layer.

According to an example embodiment of the present inventive concepts, a method of fabricating a three-dimensional semiconductor memory device may include providing a substrate including a cell array region and a connection region, forming a mold structure on the substrate, the mold structure including a plurality of sacrificial layers and a plurality of dielectric layers alternately stacked on each other, the mold structure having a stepwise portion on the connection region, forming a pad sacrificial layer to conformally cover the stepwise portion of the mold structure, replacing the sacrificial layers with electrodes, and replacing the pad sacrificial layer with an etch stop layer.

Details of some example embodiments are included in the description and drawings.

BRIEF DESCRIPTION OF THE DRAWINGS

FIGS. 6 to 12 illustrate cross-sectional views showing three-dimensional semiconductor memory devices according to some example embodiments of the present inventive concepts.

FIGS. 13A to 21A, 13B to 21B, and 13C to 21C illustrate cross-sectional views taken along lines IIA-IIA', IIB-IIB', and IIC-IIC' of FIG. 1, showing a method of fabricating a three-dimensional semiconductor memory device according to an example embodiment of the present inventive concepts.

DETAILED DESCRIPTION

It will be hereinafter discussed in detail three-dimensional semiconductor memory devices and methods of fabricating the same according to some example embodiments of the present inventive concepts in conjunction with the accompanying drawings.

While the term "same" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure.

Figure 1:
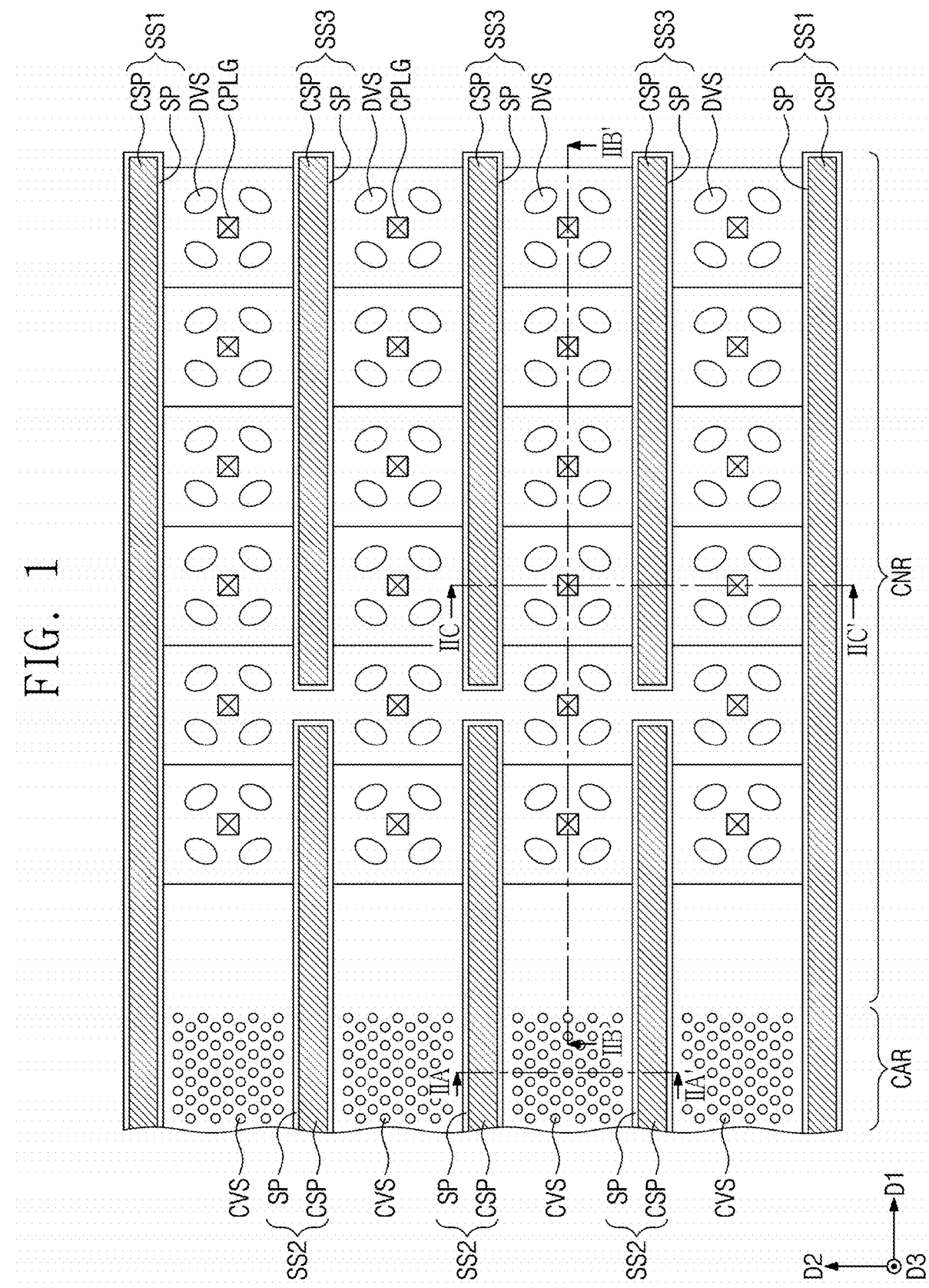
FIG. 1 illustrates a plan view showing a three-dimensional semiconductor memory device according to an example embodiment of the present inventive concepts.
Figure 2A:
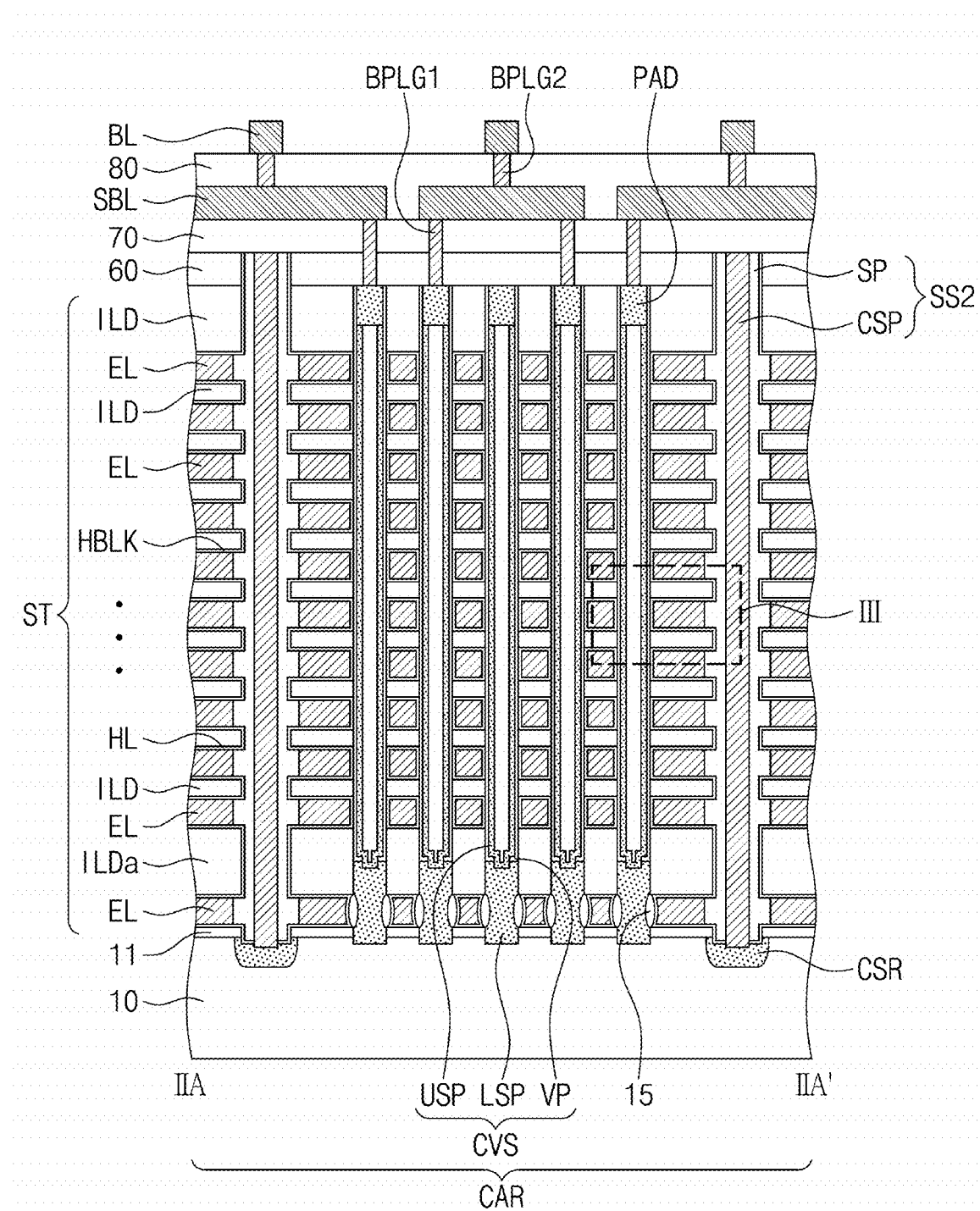
FIGS. 2A, 2B, and 2C illustrates cross-sectional views taken along lines IIA-IIA', IIB-IIB', and IIC-IIC' of FIG. 1, showing a three-dimensional semiconductor memory device according to an example embodiment of the present inventive concepts.
Figure 2B:
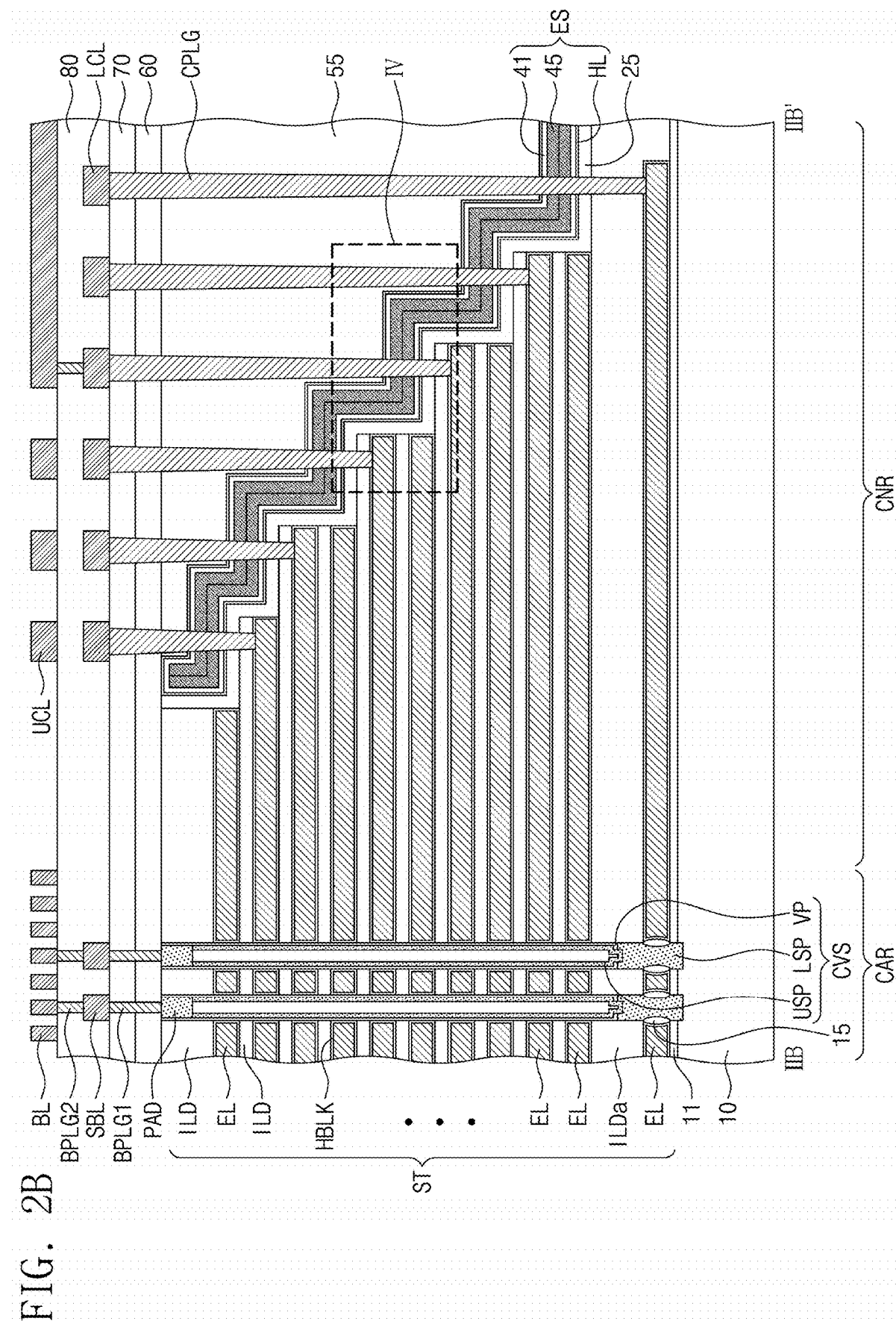
Figure 2C:
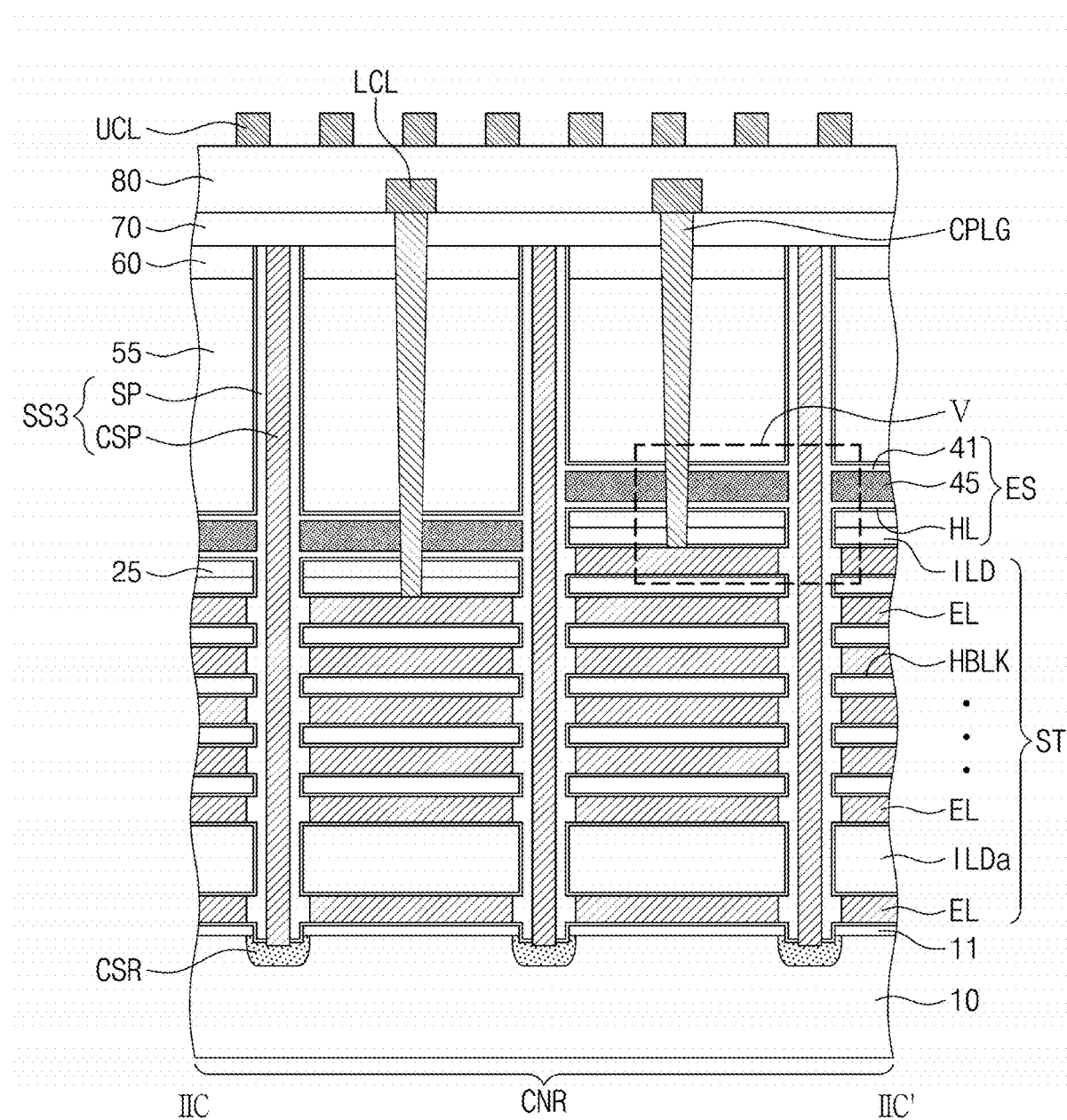

FIG. 1 illustrates a plan view showing a three-dimensional semiconductor memory device according to an example embodiment of the present inventive concepts. FIGS. 2A, 2B, and 2C illustrates cross-sectional views taken along lines IIA-IIA', IIB-IIB', and IIC-IIC' of FIG. 1, showing a three-dimensional semiconductor memory device according to an example embodiment of the present inventive concepts.

Figure 3A:
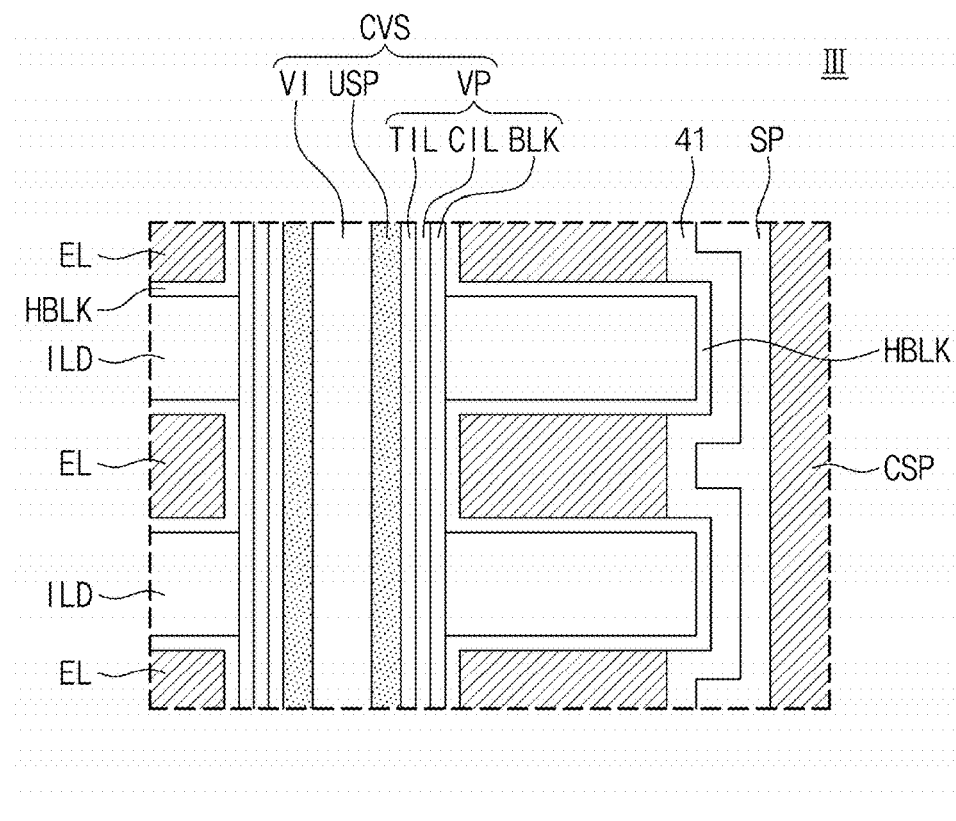
FIGS. 3A, 3B, 3C, and 3D illustrate enlarged views of section III shown in FIG. 2A.
Figure 3B:
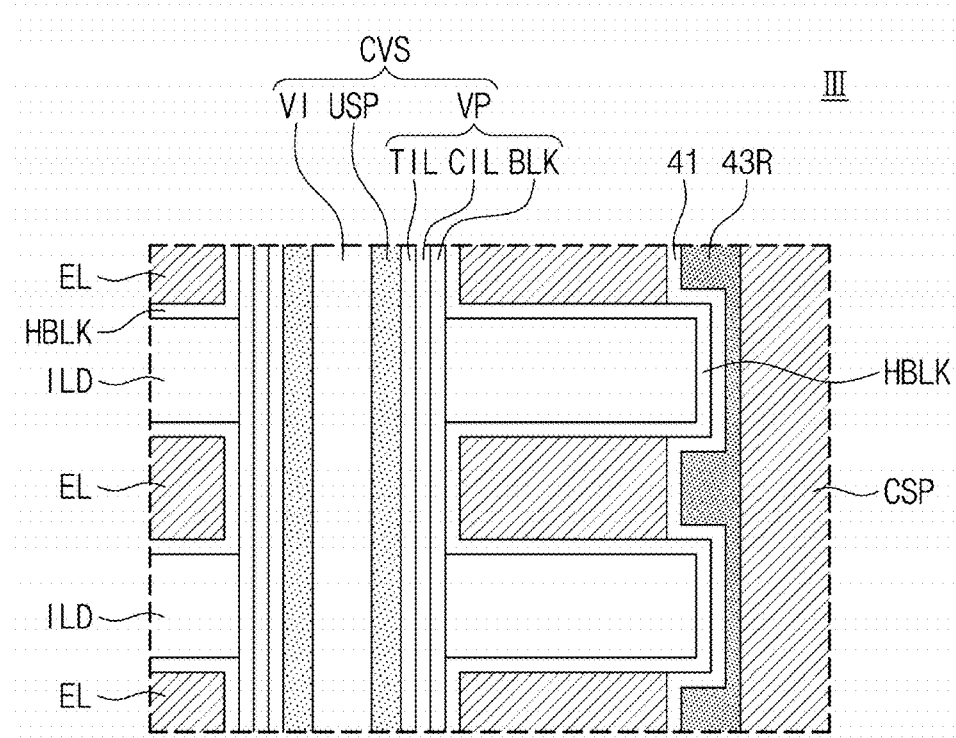
Figure 3C:
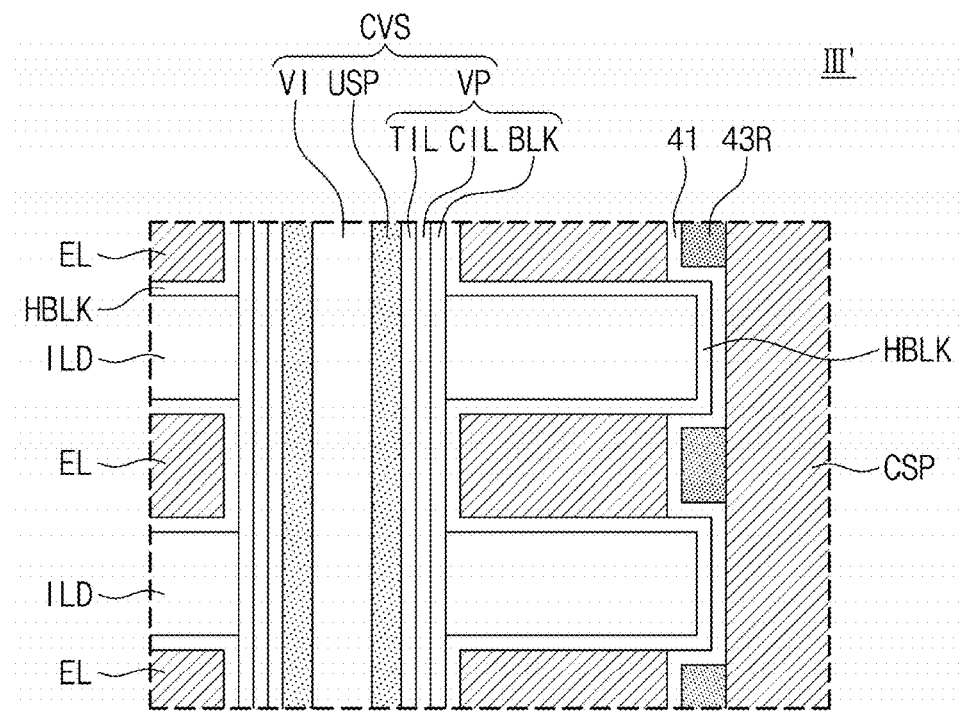

FIGS. 3A, 3B, 3C, and 3D illustrate enlarged views of section III shown in FIG. 2A. FIGS. 4A, 4B, and 4C illustrate enlarged views of section IV shown in FIG. 2B. FIGS. 5A and 5B illustrate enlarged views of section V shown in FIG. 2C.

Referring to FIGS. 1A, 2A, 2B, and 2C, a substrate 10 may include a cell array region CAR and a connection region CNR adjacent to the cell array region CAR. The substrate 10 may be one of a semiconductor material (e.g., silicon wafer), a dielectric material (e.g., glass), and a semiconductor or conductor covered with a dielectric material. For example, the substrate 10 may be a silicon wafer having a first conductive type.

The cell array region CAR may include a memory cell array that consists of a plurality of three-dimensionally arranged memory cells. The connection region CNR may include a connection line structure that electrically connects the memory cell array to a row decoder.

In certain example embodiments, a three-dimensional semiconductor memory device may be a vertical NAND Flash memory device. The cell array region CAR may be provided thereon with cell strings extending along a third direction D3 perpendicular to first and second directions D1 and D2. Each of the cell strings may include string select transistors, memory cell transistors, and a ground select transistor that are connected in series. Each of the memory cell transistors may include a data storage element.

An electrode structure ST may be disposed on the substrate 10 and may include dielectric layers ILD and electrodes EL that are alternately stacked along the third direction D3 perpendicular to a top surface of the substrate 10. The electrode structure ST may extend along the first direction D1 from the cell array region CAR toward the connection region CNR. A buffer dielectric layer 11 may include a silicon oxide layer interposed between the electrode structure ST and the substrate 10.

The electrodes EL may have the same or substantially similar thickness, and the dielectric layers ILD may have thicknesses that are changed depending on characteristics of a semiconductor memory device. Each dielectric layer ILD may be thinner than each electrode EL. Among the dielectric layers ILD, one (referred to hereinafter as a lowermost dielectric layer ILDa) covering a lowermost electrode EL may be thicker than the others.

The electrodes EL may include, for example, at least one selected from doped semiconductor (e.g., doped silicon), metal (e.g., tungsten, copper, or aluminum), conductive metal nitride (e.g., titanium nitride or tantalum nitride), or transition metal (e.g., titanium or tantalum). The dielectric layers ILD may include, for example, a silicon oxide layer.

The electrode structure ST may have a stepwise portion on the connection region CNR, and each of the electrodes EL may have a pad portion on the connection region CNR. The pad portions of the electrodes EL may be arranged along the first and second directions D1 and D2 intersecting each other when viewed in plan, and may be located at different levels from the top surface of the substrate 10.

The electrodes EL may have lengths in the first direction D1 that decrease with increasing distance from the substrate 10. The electrodes EL may have sidewalls that are spaced apart in the first direction D1 at a regular interval. On the connection region CNR, the sidewall of each electrode EL may be vertically aligned with a sidewall of a directly overlying dielectric layer ILD. In addition, the sidewalls of two vertically adjacent electrodes EL may be aligned with each other. In certain example embodiments, the stepwise portion of the electrode structure ST may be changed in various shapes.

On the connection region CNR, a planarized buried dielectric layer 55 may cover the stepwise portion of the electrode structure ST. For example, the planarized buried dielectric layer 55 may cover the pad portions of the electrodes EL. The planarized buried dielectric layer 55 may have a substantially flat top surface, and include a single dielectric layer or a plurality of stacked dielectric layers. The planarized buried dielectric layer 55 may include a silicon oxide layer.

In certain example embodiments, on the connection region CNR, an etch stop structure ES may be disposed between the planarized buried dielectric layer 55 and the electrode structure ST. A pad dielectric layer 25 also may be disposed between the etch stop structure ES and the electrode structure ST.

The etch stop structure ES and the pad dielectric layer 25 may extend along the first direction D1, and may conformally cover the stepwise portion of the electrode structure ST. The etch stop structure ES may include a material having an etch selectivity with respect to the electrodes EL and the dielectric layers ILD of the electrode structure ST, the pad dielectric layer 25, and the planarized buried dielectric layer 55. The pad dielectric layer 25 may include the same dielectric material as that of the dielectric layers ILD of the electrode structure ST.

Referring to FIGS. 4A and 5A, the etch stop structure ES may include an etch stop pattern 45, a horizontal dielectric layer HL, and a first buffer dielectric layer 41.

The etch stop pattern 45 may include a material having an etch selectivity with respect to the dielectric layers ILD of the electrode structure ST. On the pad portions of the electrodes EL, the etch stop pattern 45 may have a thickness greater than those of the dielectric layers ILD. The thickness of the etch stop pattern 45 may be greater than those of the electrodes EL. The etch stop pattern 45 may include a different dielectric material from that of the horizontal dielectric layer HL. For example, the etch stop pattern 45 may include a silicon nitride layer or a silicon oxynitride layer.

The etch stop pattern 45 may have a discontinuous interface S at an inside thereof. In this description, the term "discontinuous interface S" may mean the presence of material or a boundary detected by analysis tools such as transmission electron microscope (TEM) or scanning electron microscope (SEM) in terms of difference in composition of material, difference in grain of material, or void. The discontinuous interface S of the etch stop pattern 45 may be formed along the stepwise portion of the electrode structure ST. For example, the discontinuous interface S of the etch stop pattern 45 may be a seam. For another example, the etch stop pattern 45 may include voids formed in portions of an inside thereof.

The horizontal dielectric layer HL may have a substantially uniform thickness, and may cover top and bottom surfaces of the etch stop pattern 45. For example, the horizontal layer HL may have a lower segment between the pad dielectric layer 25 and the bottom surface of the etch stop pattern 45 and an upper segment between the planarized buried dielectric layer 55 and the top surface of the etch stop pattern 45. The upper and lower segments of the horizontal dielectric layer HL may include the same material.

A horizontal blocking dielectric layer HBLK may cover top and bottom surfaces of the electrodes EL, and also cover first sidewalls of the electrodes EL, which are adjacent to cell and dummy vertical structures CVS and DVS that will be discussed below. The upper and lower segments of the horizontal dielectric layer HL each may have a thickness, which is less than that of the horizontal blocking dielectric layer HBLK on the first sidewalls of the electrodes EL.

The horizontal dielectric layer HL may include the same material as that of the horizontal blocking dielectric layer HBLK. The horizontal dielectric layer HL and the horizontal blocking dielectric layer HBLK may include a dielectric material having an etch selectivity with respect to the planarized buried dielectric layer 55, the pad dielectric layer 25, and the etch stop pattern 45. In some example embodiments, the horizontal dielectric layer HL and the horizontal blocking dielectric layer HBLK may include a dielectric material different from that of the first buffer dielectric layer 41. For example, the horizontal dielectric layer HL and the horizontal blocking dielectric layer HBLK may include a high-k dielectric layer such as an aluminum oxide layer or a hafnium oxide layer.

The first buffer dielectric layer 41 may be disposed between the etch stop pattern 45 and the horizontal dielectric layer HL Likewise the horizontal dielectric layer HL, the first buffer dielectric layer 41 may have substantially uniform thickness and may cover the top and bottom surfaces of the etch stop pattern 45.

The first buffer dielectric layer 41 may include a dielectric material having an etch selectivity with respect to the etch stop pattern 45 and the horizontal dielectric layer HL. For example, the first buffer dielectric layer 41 may include a silicon oxide layer.

The first buffer dielectric layer 41 may extend onto a sidewall of the electrode structure ST. For example, referring to FIGS. 3A, 3B, 3C, and 5A, the first buffer dielectric layer 41 may extend onto sidewalls of the electrodes EL and sidewalls of the dielectric layers ILD, and may directly contact the sidewalls of the electrodes EL. In this case, a portion of the first buffer dielectric layer 41 may be disposed between a common source plug CSP and second sidewalls of the electrodes EL that are adjacent to the common source plug CSP. A thickness of the first buffer dielectric layer 41 between the etch stop pattern 45 and the horizontal dielectric layer HL may be greater than that of the first buffer dielectric layer 41 on the second sidewalls of the electrodes EL. A thickness of the first buffer dielectric layer 41 may be greater than that of the horizontal blocking dielectric layer HBLK.

Referring to FIG. 5A, a first horizontal distance A1 between the common source plug CSP and one sidewall of the etch stop pattern 45 may be different from a second horizontal distance A2 between the common source plug CSP and the second sidewalls of the electrodes EL, which are adjacent to the common source plug CSP. For example, the first horizontal distance A1 may be greater than the second horizontal distance A2. The etch stop pattern 45 may have a rounded sidewall adjacent to first and third separation structures SS1 and SS3 illustrated in FIG. 1.

Figure 3D:
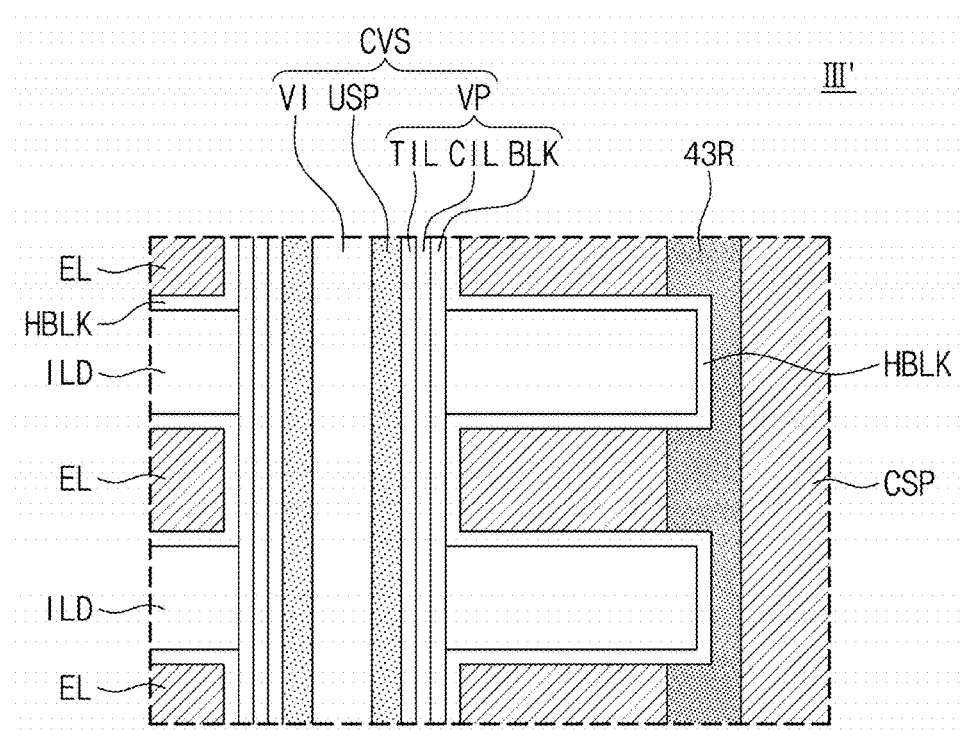
Figure 4A:
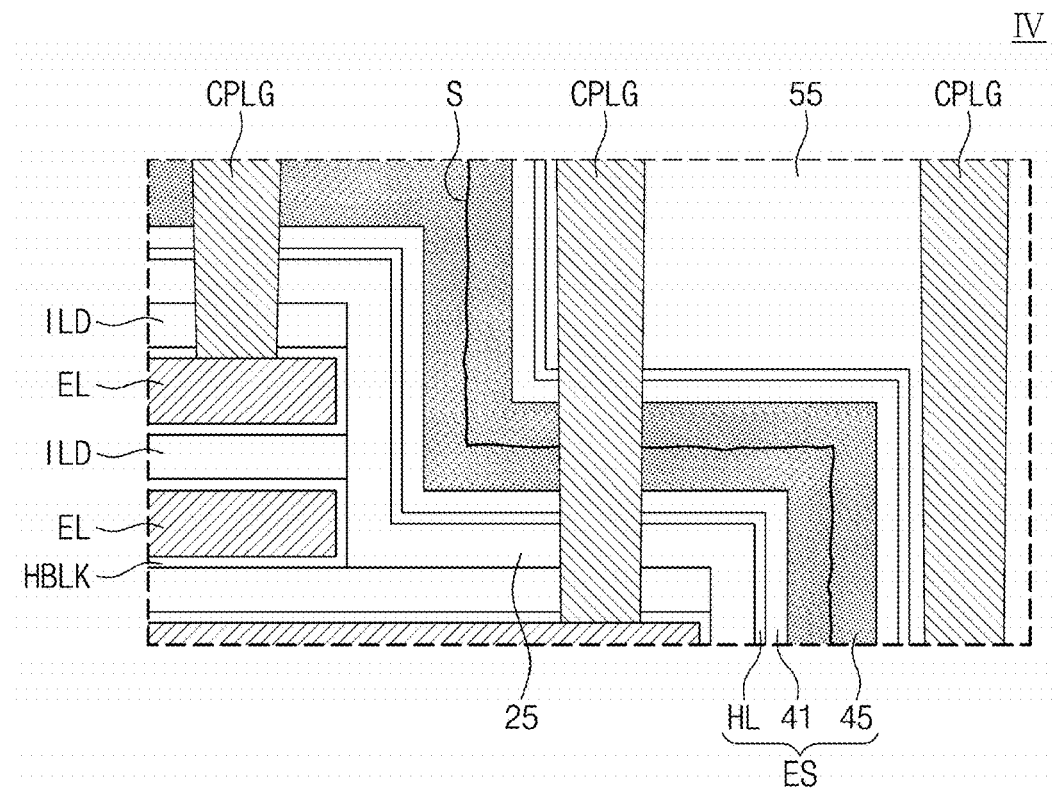
FIGS. 4A, 4B, and 4C illustrate enlarged views of section IV shown in FIG. 2B.
Figure 4B:
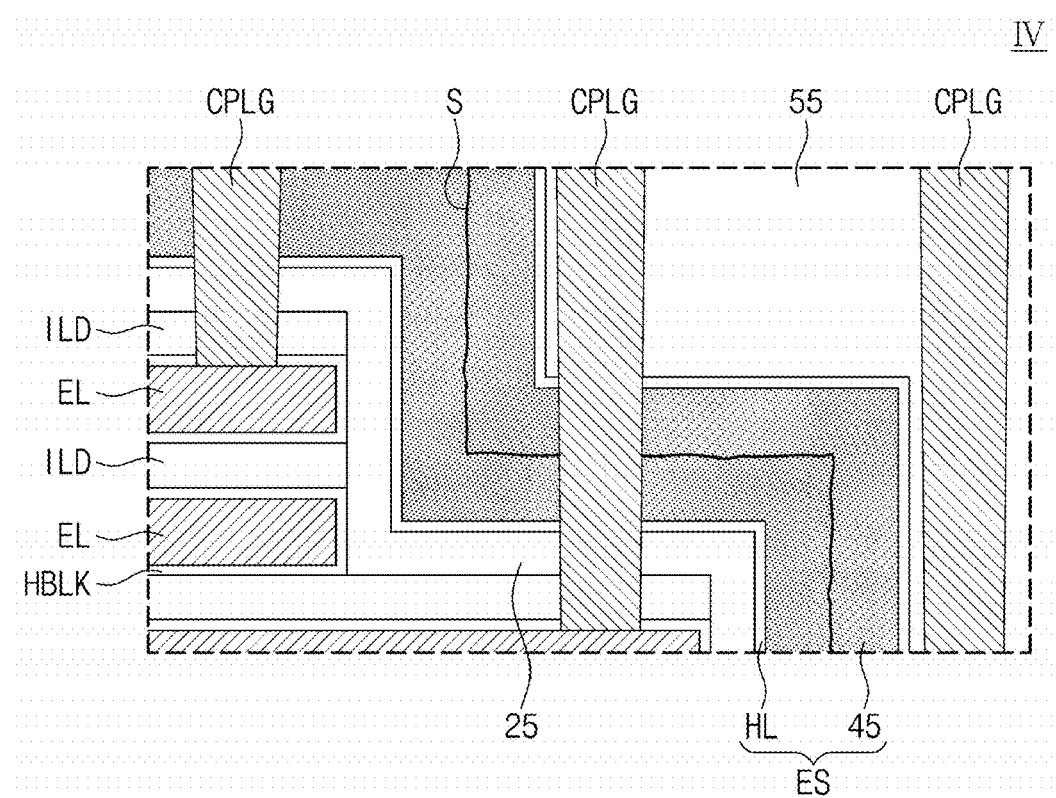
Figure 4C:
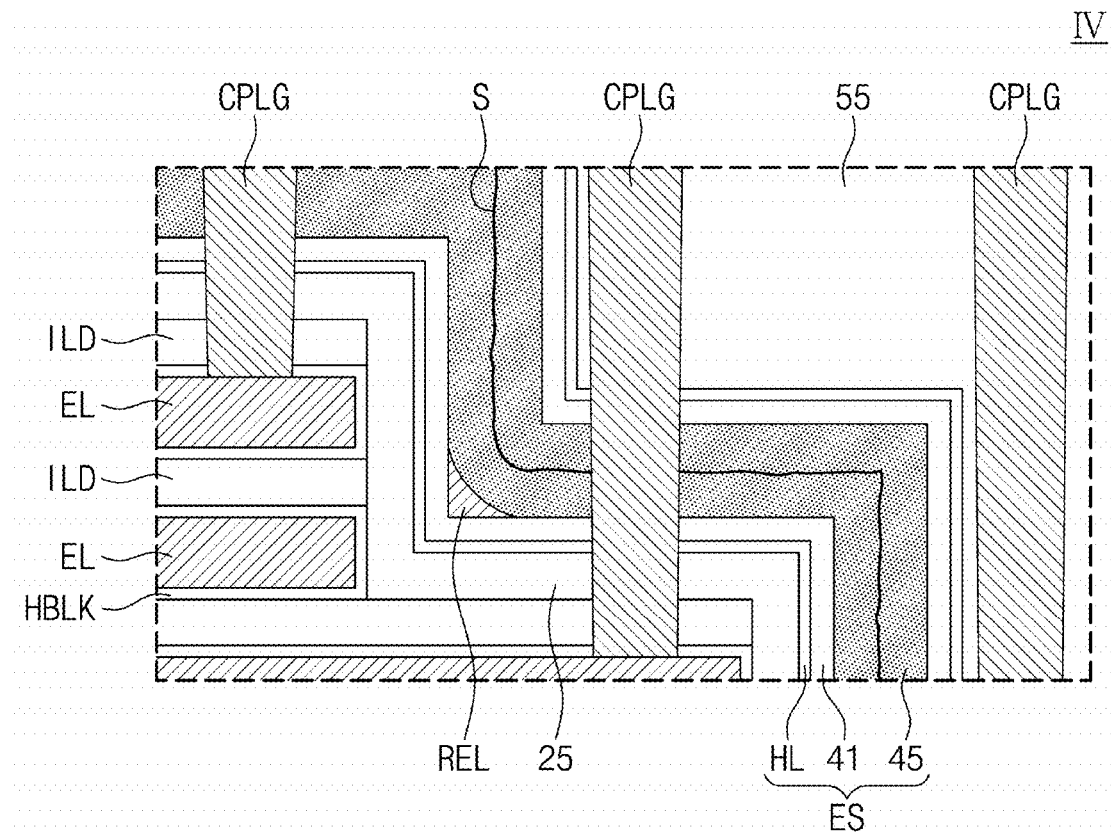
Figure 5A:
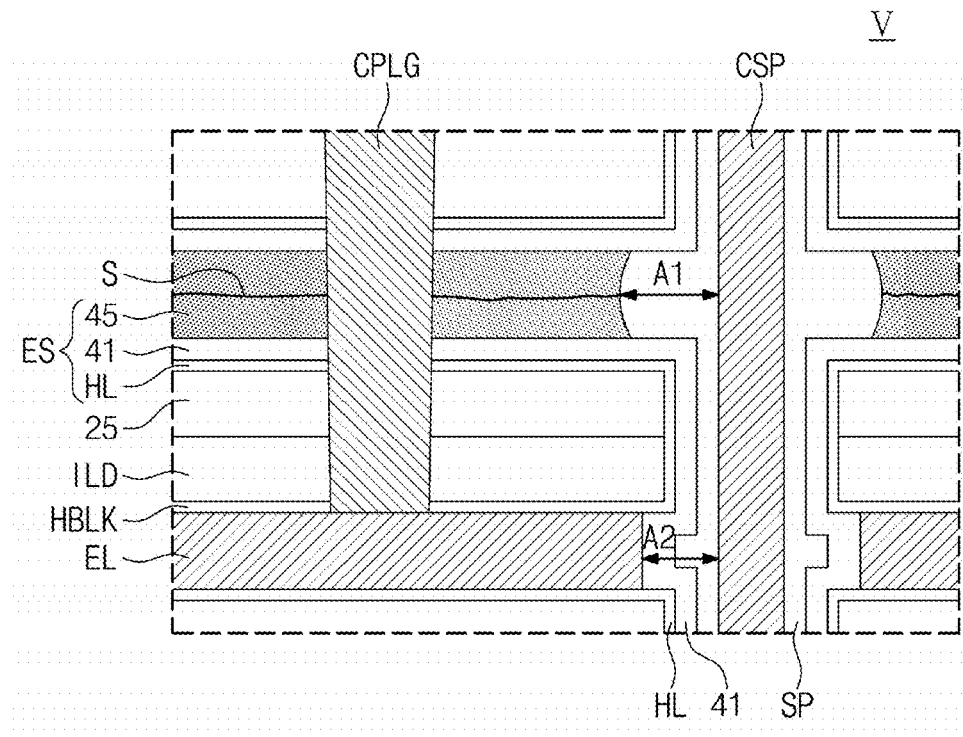
FIGS. 5A and 5B illustrate enlarged views of section V shown in FIG. 2C.
Figure 5B:
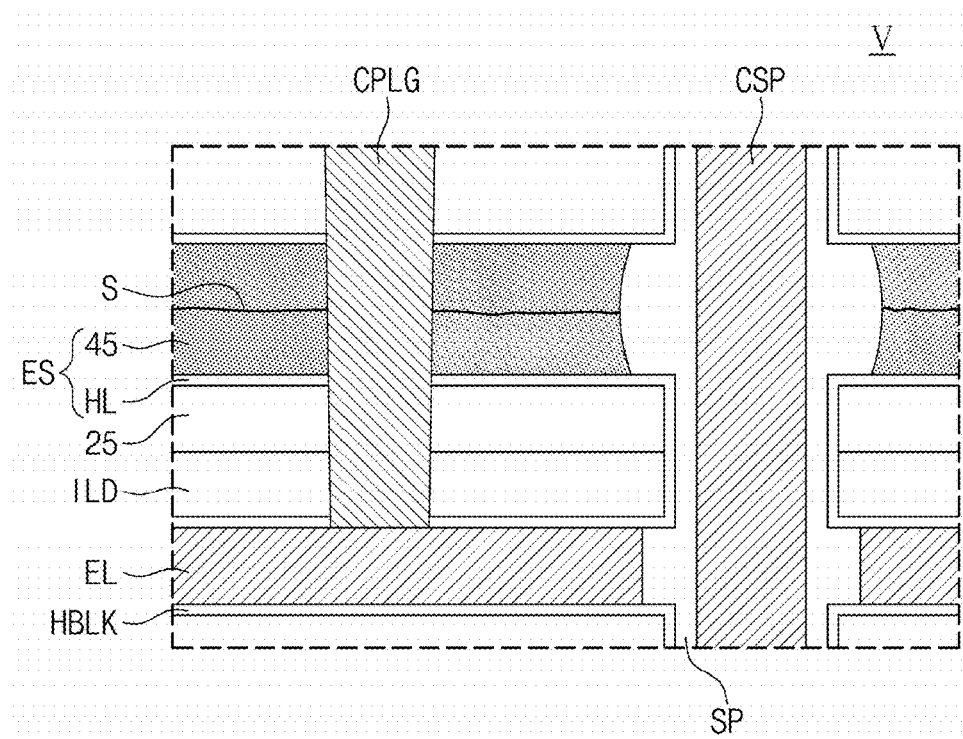

Referring to FIGS. 3D, 4B, and 5B, the etch stop structure ES may not include the first buffer dielectric layer 41. For example, the etch stop structure ES may include the etch stop pattern 45 and the horizontal dielectric layer HL, and the horizontal dielectric layer HL may directly contact the top and bottom surfaces of the etch stop pattern 45.

Referring to FIG. 4C, a residual conductive pattern REL including the same conductive material as that of the electrodes EL may partially be provided between the etch stop pattern 45 and the first buffer dielectric layer 41. The residual conductive pattern REL may be locally positioned at one or more of stair-steps of the electrode structure ST.

In certain example embodiments, on the cell array region CAR, a plurality of cell vertical structures VS may penetrate the electrode structure ST and have connection with the substrate 10. When viewed in plan, the cell vertical structures CVS may be arranged in one direction or in a zigzag shape. The cell vertical structures CVS may have circular top surfaces.

The cell vertical structures CVS may include a semiconductor material, such as silicon (Si), germanium (Ge), or a mixture thereof. The cell vertical structures CVS including a semiconductor material may be used as channels of ground select, string select, and memory cell transistors included in a cell string of a vertical NAND Flash memory device.

Each of the cell vertical structures CVS may include a lower semiconductor pattern LSP, an upper semiconductor pattern USP, and a vertical dielectric pattern VP. A bit line contact pad PAD may be positioned on a top end of the upper semiconductor pattern USP. The bit line contact pad PAD may include an impurity-doped semiconductor material.

The lower semiconductor pattern LSP may directly contact the substrate 10 and may include a pillar-shaped epitaxial layer grown from the substrate 10. A gate dielectric layer 15 may be disposed on a portion of a sidewall of the lower semiconductor pattern LSP. The gate dielectric layer 15 may be disposed between the lowermost electrode EL and the lower semiconductor pattern LSP. The gate dielectric layer 15 may include a silicon oxide layer (e.g., a thermal oxide layer).

The upper semiconductor pattern USP may directly contact the lower semiconductor pattern LSP or the substrate 10, and may have a "U" or pipe shape with a closed bottom end. As shown in FIGS. 3A to 3D, the upper semiconductor pattern USP may have an inside filled with a buried dielectric pattern VI including a dielectric material. The vertical dielectric pattern VP may surround a sidewall of the upper semiconductor pattern USP.

The upper semiconductor pattern USP may include a semiconductor material, such as silicon (Si), germanium (Ge), or a mixture thereof. The upper semiconductor pattern USP may have a crystal structure different from that of the lower semiconductor pattern LSP; for example, the upper semiconductor pattern USP may have at least one selected from a single crystalline structure, an amorphous structure, and a polycrystalline structure.

Referring to FIGS. 3A, 3B, 3C, and 3D, the vertical dielectric pattern VP may include a tunnel dielectric layer TIL, a charge storage layer CIL, and a blocking dielectric layer BLK, and constitute a data storage structure of a NAND Flash memory device. The charge storage layer CIL may be a trap dielectric layer, a floating gate electrode, or a dielectric layer including conductive nano-dots. For example, the charge storage layer CIL may include one or more of a silicon nitride layer, a silicon oxynitride layer, a silicon-rich nitride layer, a nano-crystalline silicon layer, and a laminated trap layer. The tunnel dielectric layer TIL may be one of materials whose band gap is greater than that of the charge storage layer CIL, and the blocking dielectric layer BLK may be a high-k dielectric layer (e.g., an aluminum oxide layer or a hafnium oxide layer).

Referring to FIGS. 3A, 3B, and 3C, the first buffer dielectric layer 41 may directly cover the sidewalls of the electrodes EL. Referring to FIGS. 3B and 3C, a residual sidewall sacrificial pattern 43R may be disposed between the first buffer dielectric layer 41 and the common source plug CSP. The residual sidewall sacrificial pattern 43R may include the same material as that of the etch stop pattern 45 on the connection region CNR. As shown in FIG. 3B, the residual sidewall sacrificial pattern 43R may surround a sidewall of the common source plug CSP, and may surround a portion of the common source plug CSP. In some example embodiments (e.g., FIG. 3D), the first buffer dielectric layer 41 may not be present between the common source plug CSP and the sidewalls of the electrodes EL, and the residual sidewall sacrificial pattern 43R may fill a space between the common source plug CSP and the sidewalls of the electrodes EL.

The horizontal blocking dielectric layer HBLK may be provided between the vertical dielectric pattern VP and the sidewalls of the electrodes EL. The horizontal blocking dielectric layer HBLK may cover the sidewalls of the electrodes EL, and may also cover the top and bottom surfaces of the electrodes EL. The horizontal blocking dielectric layer HBLK may be a portion of a data storage structure of a NAND Flash memory device, and may include a blocking dielectric layer consisting of a high-k dielectric layer such as an aluminum oxide layer or a hafnium oxide layer.

The horizontal blocking dielectric layer HBLK may successively extend between the common source plug CSP and the sidewalls of the dielectric layers ILD. Referring to FIGS. 4A and 5A, the horizontal blocking dielectric layer HBLK may be connected to the horizontal dielectric layer HL.

On the connection region CNR, dummy vertical structures DVS may penetrate the planarized buried dielectric layer 55, the etch stop structure ES, the pad dielectric layer 25, and the electrode structure ST. The number of the electrodes EL through which the dummy vertical structures DVS penetrate may decrease as the dummy vertical structures DVS become farther away from the cell array region CAR.

The dummy vertical structures DVS may have the same or substantially similar stack structure and material as those of the cell vertical structures CVS. For example, like the cell vertical structures CVS, each of the dummy vertical structures DVS may include a lower semiconductor pattern, an upper semiconductor pattern, and a vertical dielectric pattern.

The dummy vertical structures DVS may have the same or substantially similar vertical length as that of the cell vertical structures CVS. For example, the dummy vertical structures DVS may have top surfaces at the same or substantially similar level as that of the top surfaces of the cell vertical structures CVS. The dummy vertical structures DVS may have widths greater than those of the cell vertical structures CVS. For example, each top surface of the dummy vertical structures DVS may have a bar shape or an oval shape having major and minor axes.

A plurality of the dummy vertical structures DVS may penetrate the pad portion of each electrode EL. For example, four dummy vertical structures DVS may penetrate the pad portion of each electrode EL, but the present inventive concepts are not limited thereto. An arrangement and the number of the dummy vertical structures DVS may be variously changed.

A first interlayer dielectric layer 60 may be disposed on the planarized buried dielectric layer 55, and may cover the top surfaces of the cell vertical structures CVS and the top surfaces of the dummy vertical structures DVS. The first interlayer dielectric layer 60 may further cover an uppermost top surface of the etch stop structure ES and an uppermost top surface of the pad dielectric layer 25.

When viewed in plan, the electrode structure ST may be disposed between first separation structures SS1 that extend in the first direction D1, and are disposed in parallel with the electrode structure ST. The first separation structures SS1 may extend from the cell array region CAR toward the connection region CNR, and may penetrate the first interlayer dielectric layer 60, the planarized buried dielectric layer 55, the etch stop structure ES, the pad dielectric layer 25, and the electrode structure ST.

On the cell array region CAR, second separation structures SS2 may be disposed between the first separation structures SS1 and spaced apart in the second direction D2 from each other at a regular interval. The second separation structures SS2 may penetrate the first interlayer dielectric layer 60 and the electrode structure ST, while extending along the first direction D1.

On the connection region CNR, third separation structures SS3 may be disposed between the first separation structures SS1 and spaced apart in the second direction D2 from each other. The third separation structures SS3 may penetrate the first interlayer dielectric layer 60, the planarized buried dielectric layer 55, the etch stop structure ES, the pad dielectric layer 25, and the electrode structure ST, while extending along the first direction D1. The third separation structures SS3 may be spaced apart in the first direction D1 from the second separation structures SS2.

Each of the first, second, and third separation structures SS1, SS2, and SS3 may include the common source plug CSP including a conductive material and a sidewall spacer SP between the common source plug CSP and the electrode structure ST.

The sidewall spacer SP may include a dielectric material different from the etch stop pattern 45, and may directly contact a sidewall of the etch stop pattern 45 on the connection region CNR. The sidewall spacer SP may include protrusions that horizontally protrude toward the etch stop pattern 45 and the electrodes EL. Referring to FIG. 5A, the first buffer dielectric layer 41 may be disposed between the sidewall spacer SP and the electrode structure ST. The sidewall spacer SP may include the same dielectric material as that of the first buffer dielectric layer 41.

The common source plug CSP may be coupled to a common source region CSR formed in the substrate 10. The common source region CSR may extend in the first direction D1 and parallel to the electrode structure ST. The common source region CSR may include second conductive type impurities doped in the substrate 10. The common source region CSR may include, for example, N-type impurities (e.g., arsenic (As) or phosphorous (P)). In other example embodiments, each of the first, second, and third separation structures SS1, SS2, and SS3 may be a linear pillar consisting of a dielectric material.

The first interlayer dielectric layer 60 may be provided thereon with a second interlayer dielectric layer 70 that covers top surfaces of the first, second, and third separation structures SS1, SS2, and SS3.

On the cell array region CAR, first bit line contact plugs BPLG1 may penetrate the first and second interlayer dielectric layers 60 and 70, and have connection with corresponding cell vertical structures CVS.

On the connection region CNR, cell contact plugs CPLG may penetrate the first and second interlayer dielectric layers 60 and 70, the planarized buried dielectric layer 55, and the etch stop structure ES, and may have connection with corresponding pad portions of the electrodes EL.

The cell contact plugs CPLG may have top surfaces at the same or substantially similar level, and may have different vertical lengths from each other. The top surfaces of the cell contact plugs CPLG may be substantially planar with each other, and the vertical lengths of the cell contact plugs CPLG may decrease as approaching the cell array region CAR.

Each of the cell contact plugs CPLG may be spaced apart from the dummy vertical structures DVS penetrating each pad portion of the electrodes EL. The top surfaces of the cell contact plugs CPLG may be located at a higher level than that of the top surfaces of the dummy vertical structures DVS and that of the top surfaces of the first, second, and third separation structures SS1, SS2, and SS3. Each of the cell contact plugs CPLG may have a sidewall whose portion is in direct contact with the etch stop structure ES.

Each of the cell contact plugs CPLG may include a barrier metal layer including metal nitride (e.g., TiN, TaN, or WN) and a metal layer including metal (e.g., Al, Ti, Ta, Co, or Cu).

On the cell array region CAR, the second interlayer dielectric layer 70 may be provided thereon with subsidiary bit lines SBL whose major axes extend in the second direction D2. Each of the subsidiary bit lines SBL may be connected through the first bit line contact plugs BPLG1 to two adjacent cell vertical structures CVS.

On the connection region CNR, lower connection lines LCL may be disposed on the second interlayer dielectric layer 70. The lower connection lines LCL may be coupled to corresponding cell contact plugs CPLG. The lower connection lines LCL may be electrically connected through the cell contact plugs CPLG to corresponding pad portions of the electrodes EL.

The second interlayer dielectric layer 70 may be provided thereon with a third interlayer dielectric layer 80 that covers the subsidiary bit lines SBL and the lower connection lines LCL.

On the cell array region CAR, bit lines BL may be disposed on a third interlayer dielectric layer 80, and upper connection lines UCL may be disposed on the third interlayer dielectric layer 80 on the connection region CNR. The bit lines BL may extend in the second direction D2 while running across the electrode structures ST, and may be connected to the subsidiary bit lines SBL through second bit line contact plugs BPLG2. The upper connection lines UCL may be coupled through upper contact plugs to corresponding lower connection lines LCL.

FIGS. 6 to 12 illustrate cross-sectional views showing three-dimensional semiconductor memory devices according to some example embodiments of the present inventive concepts. A detailed description of technical features the same as those of the three-dimensional semiconductor memory device discussed above with reference to FIG. 3 may be omitted for brevity of explanation, and a difference thereof will be described.

Referring to FIG. 6, the etch stop structure ES may have different thicknesses on a sidewall of each stair-step formed in the electrode structure ST and on a top surface of each stair-step. The etch stop structure ES may have a rounded profile at a portion covering each stair-step. The thickness of the etch stop structure ES on an upper stair-step may be different from that of the etch stop structure ES on a lower stair-step.

Figure 7:
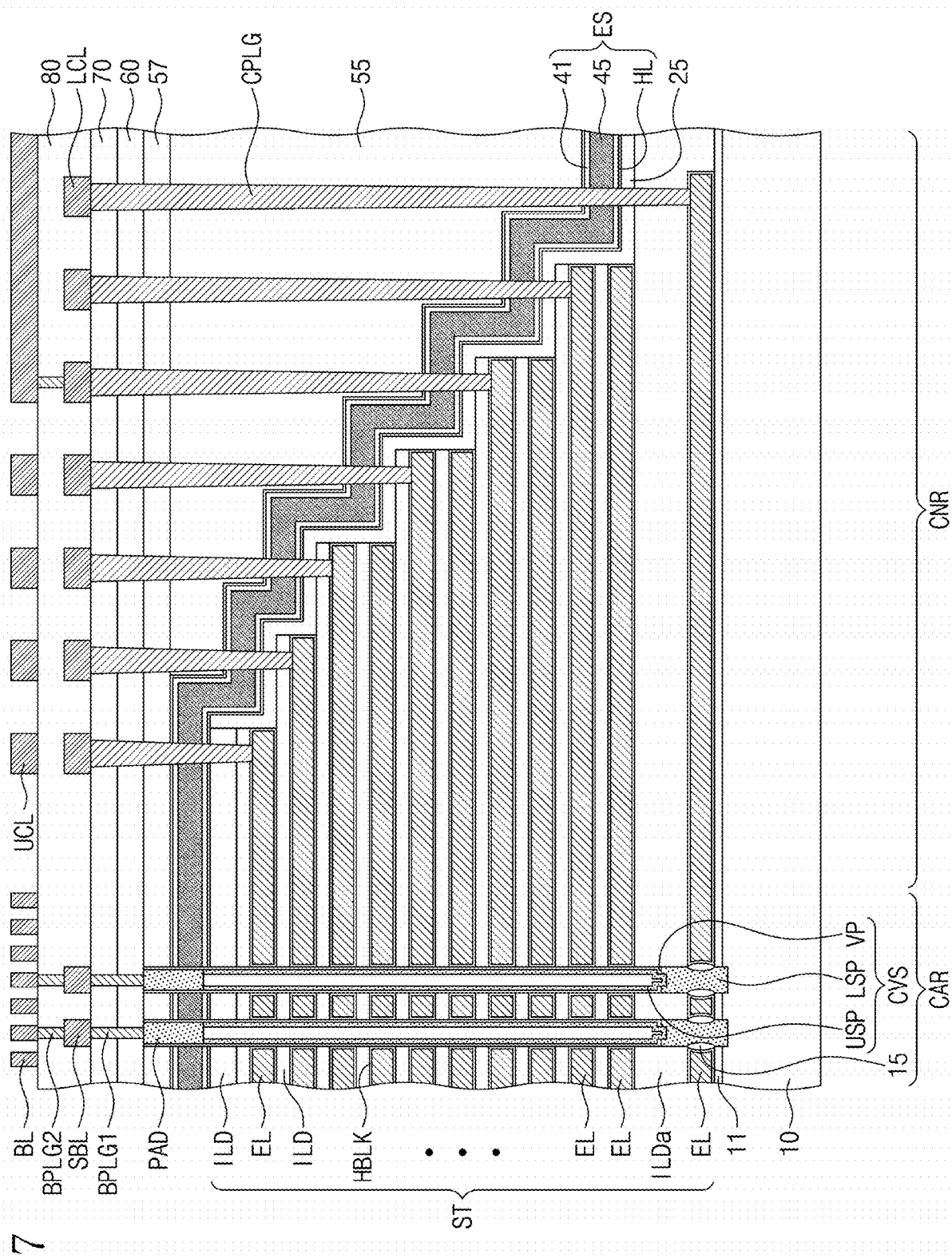

Referring to FIG. 7, the etch stop structure ES may extend from the connection region CNR toward the cell array region CAR. For example, on the cell array region CAR and the connection region CNR, the etch stop structure ES may conformally cover a top surface of the electrode structure ST. The etch stop structure ES may have a planarized portion on the electrode structure ST of the cell array region CAR and a stepwise portion on the electrode structure ST of the connection region CNR.

The planarized buried dielectric layer 55 may cover the stepwise portion of the etch stop structure ES, and may have a top surface at the same level as that of the planarized portion of the etch stop structure ES. A dummy interlayer dielectric layer 57 may cover the planarized portion of the etch stop structure ES and the planarized buried dielectric layer 55.

The cell vertical structures CVS may penetrate the dummy interlayer dielectric layer 57, the planarized portion of the etch stop structure ES, and the electrode structure ST.

As discussed above, the etch stop structure ES may include the horizontal dielectric layer HL, the first buffer dielectric layer 41, and the etch stop pattern 45. The top and bottom surfaces of the etch stop pattern 45 may be surrounded by the horizontal dielectric layer HL and the first buffer dielectric layer 41.

Figure 8:
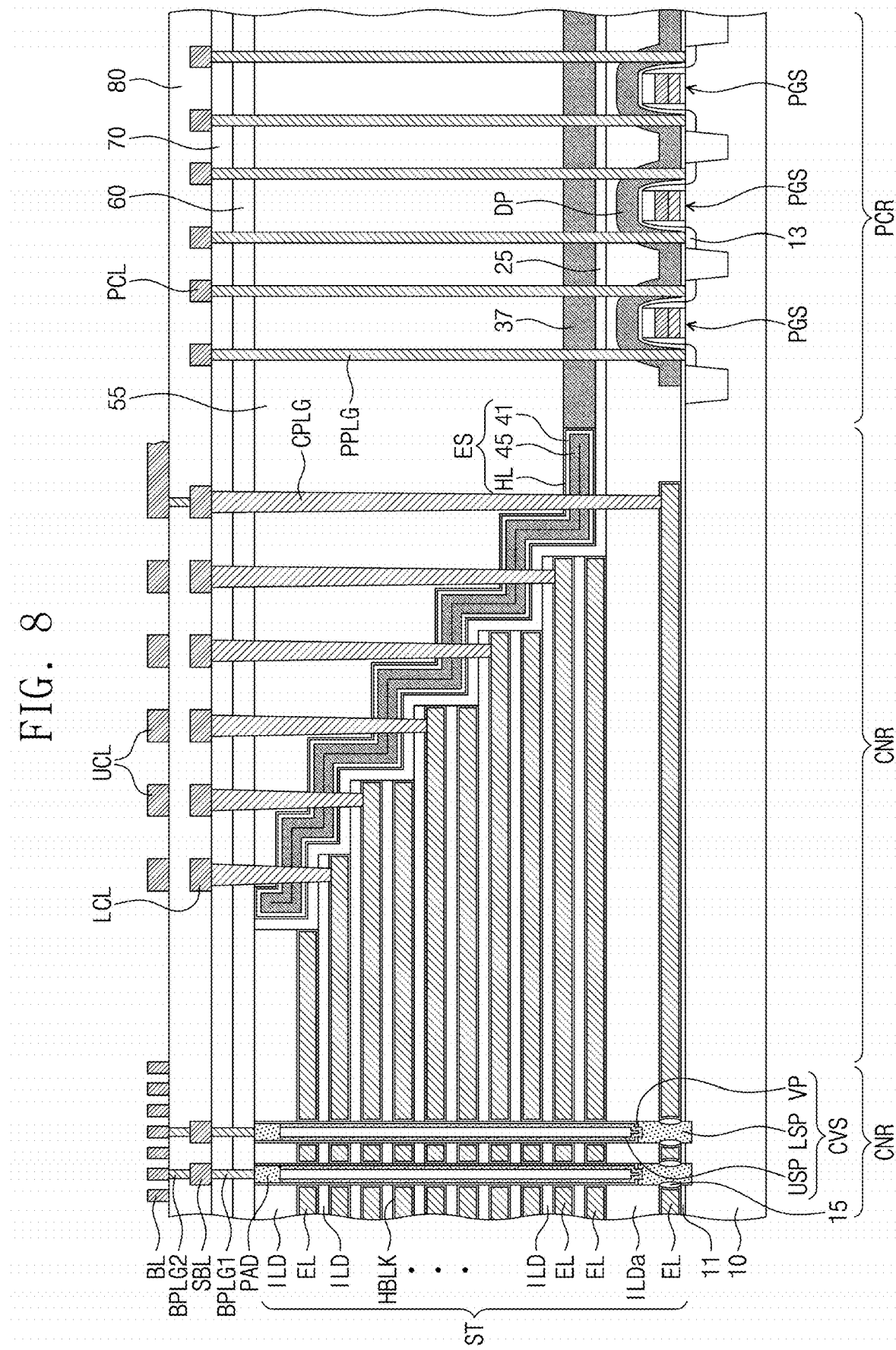

Referring to FIG. 8, the substrate 10 may include the cell array region CAR, the connection region CNR, and further include a peripheral circuit region PCR. The connection region CNR may be positioned between the cell array region CAR and the peripheral circuit region PCR.

On the peripheral circuit region PCR, the substrate 10 may be provided thereon with peripheral logic circuits such as row and column decoders, a page buffer, and control circuits. The peripheral logic circuits may include, for example, high-voltage and low-voltage transistors, a resistor, and a capacitor. On the peripheral circuit region PCR, peripheral gate stacks PGS may be disposed to be spaced apart from each other on the substrate 10. Source/drain impurity regions 13 may be provided in the substrate 10 on opposite sides of each of the peripheral gate stacks PGS. On the cell array region CAR, the substrate 10 may be provided thereon with the electrode structure ST spaced apart from the peripheral logic circuits.

The electrode structure ST may extend along the first direction D1 from the cell array region CAR toward the connection region CNR, and may have a stepwise portion on the connection region CNR. The buffer dielectric layer 11 may include a silicon oxide layer interposed between the electrode structure ST and the substrate 10. The buffer dielectric layer 11 may extend onto the peripheral circuit region PCR and conformally cover the peripheral gate stacks PGS.

The electrode structures ST may include the electrodes EL and the dielectric layers ILD that are vertically and alternately stacked. In the electrode structure ST, the lowermost dielectric layer ILDa covering the lowermost electrode EL may successively extend from the cell array region CAR toward the peripheral circuit region PCR. The lowermost electrode EL may have a top surface lower than those of the peripheral gate stacks PGS.

On the peripheral circuit region PCR, a dummy sacrificial pattern DP may conformally cover the peripheral gate stacks PGS. The dummy sacrificial pattern DP may include a dielectric material having an etch selectivity with respect to the dielectric layers ILD. For example, the dummy sacrificial pattern DP may include a silicon nitride layer. The dummy sacrificial pattern DP may be covered with the lowermost dielectric layer ILDa of the electrode structure ST.

On the connection region CNR, the etch stop structure ES may conformally cover the electrode structure ST. The pad dielectric layer 25 may be disposed between the etch stop structure ES and the electrode structure ST, and may extent onto the lowermost dielectric layer ILDa of the peripheral circuit region PCR.

In certain example embodiments, a residual pad sacrificial layer 37 may be disposed on the pad dielectric layer 25 of the peripheral circuit region PCR. The residual pad sacrificial layer 37 may include the same material as that of the etch stop pattern 45, and may be thicker than the etch stop pattern 45. A portion of the horizontal dielectric layer HL and a portion of the first buffer dielectric layer 41 may be interposed between the residual pad sacrificial layer 37 and one sidewall of the etch stop pattern 45.

On the peripheral circuit region PCR, peripheral contact plugs PPLG may penetrate the first and second interlayer dielectric layers 60 and 70, the planarized buried dielectric layer 55, the residual pad sacrificial layer 37, the pad dielectric layer 25, the lowermost dielectric layer ILDa, and the dummy sacrificial pattern DP, and may be connected to the source/drain impurity regions 13. The residual pad sacrificial layer 37 may be used as an etch stopper when the peripheral contact plugs PPLG are formed on the peripheral circuit region PCR.

On the peripheral circuit region PCR, peripheral circuit connection lines PCL may be disposed on the second interlayer dielectric layer 70 and coupled to the peripheral contact plugs PPLG.

Figure 9A:
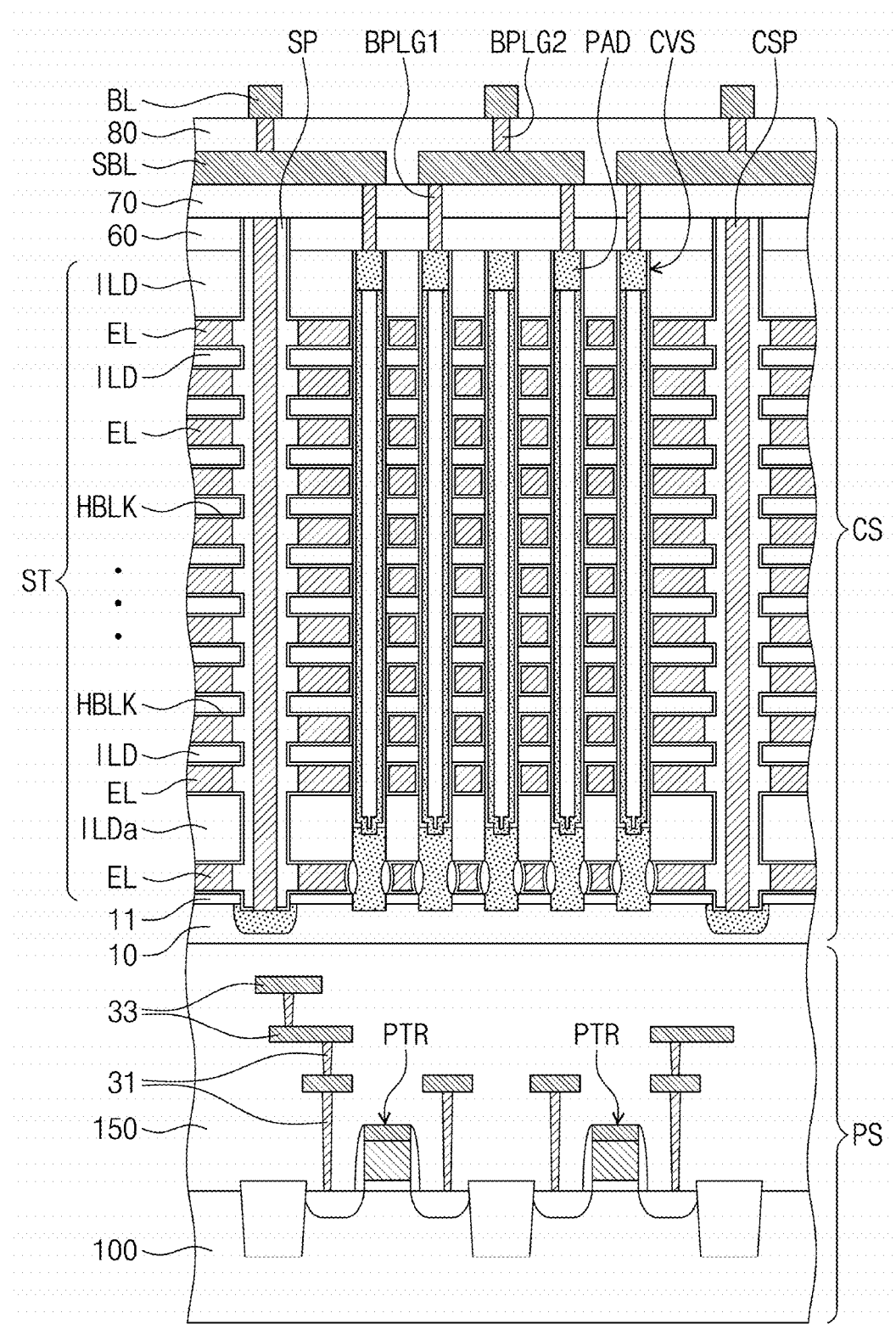
Figure 9B:
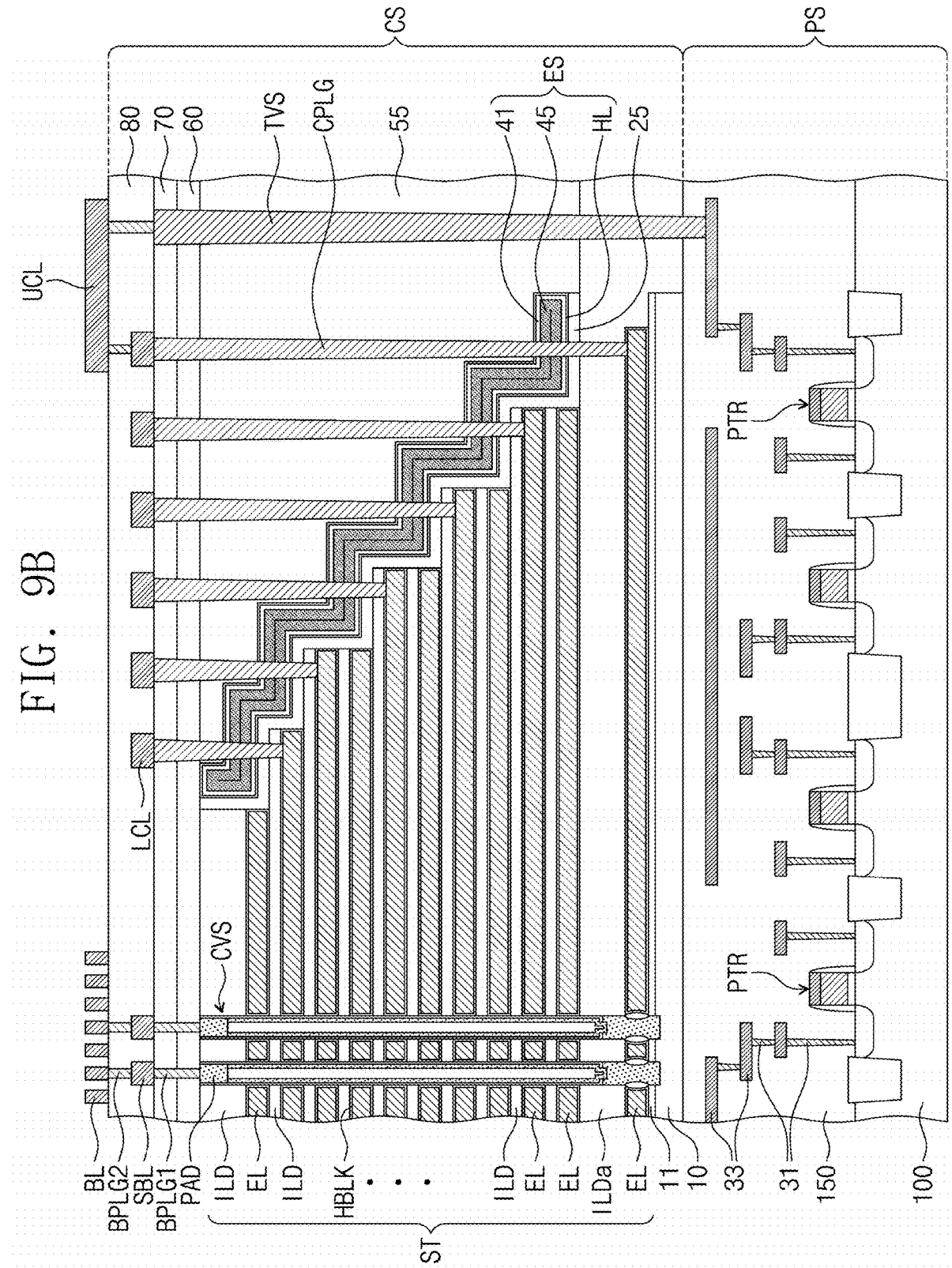

Referring to FIGS. 9A and 9B, a three-dimensional semiconductor memory device according to an example embodiment of the present inventive concepts may include a peripheral logic structure PS on a semiconductor substrate 100 and a cell array structure CS on the peripheral logic structure PS.

The peripheral logic structure PS may include peripheral logic circuits PTR integrated on the semiconductor substrate 100 and a lower buried dielectric layer 150 covering the peripheral logic circuits PTR.

Peripheral circuit connection lines 33 may be electrically connected through peripheral circuit contact plugs 31 to the peripheral logic circuits PTR. For example, the peripheral circuit contact plugs 31 and the peripheral circuit connection lines 33 may be coupled to NMOS and PMOS transistors.

The cell array structure CS may include the three-dimensional semiconductor memory device discussed above with reference to FIGS. 2A, 2B, and 2C. For example, the cell array structure CS may include the substrate 10 on the peripheral logic structure PS, the electrode structure ST on the substrate 10, and the etch stop structure ES conformally covering the stepwise portion of the electrode structure ST. The cell array structure CS may be connected to the peripheral logic structure PS through a through connection structure TVS that vertically penetrates a portion of the cell array structure CS.

Figure 10:
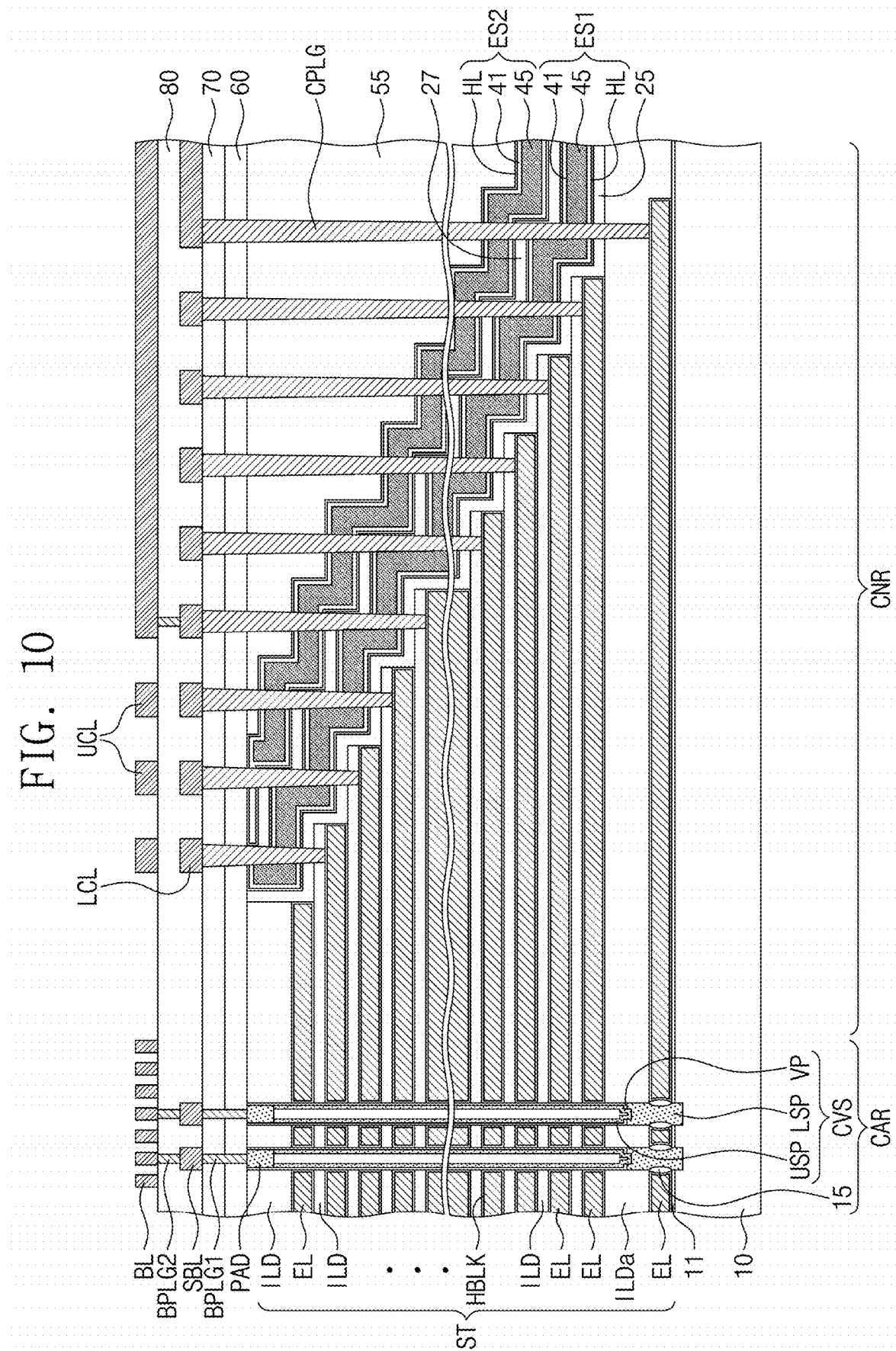
Figure 11:
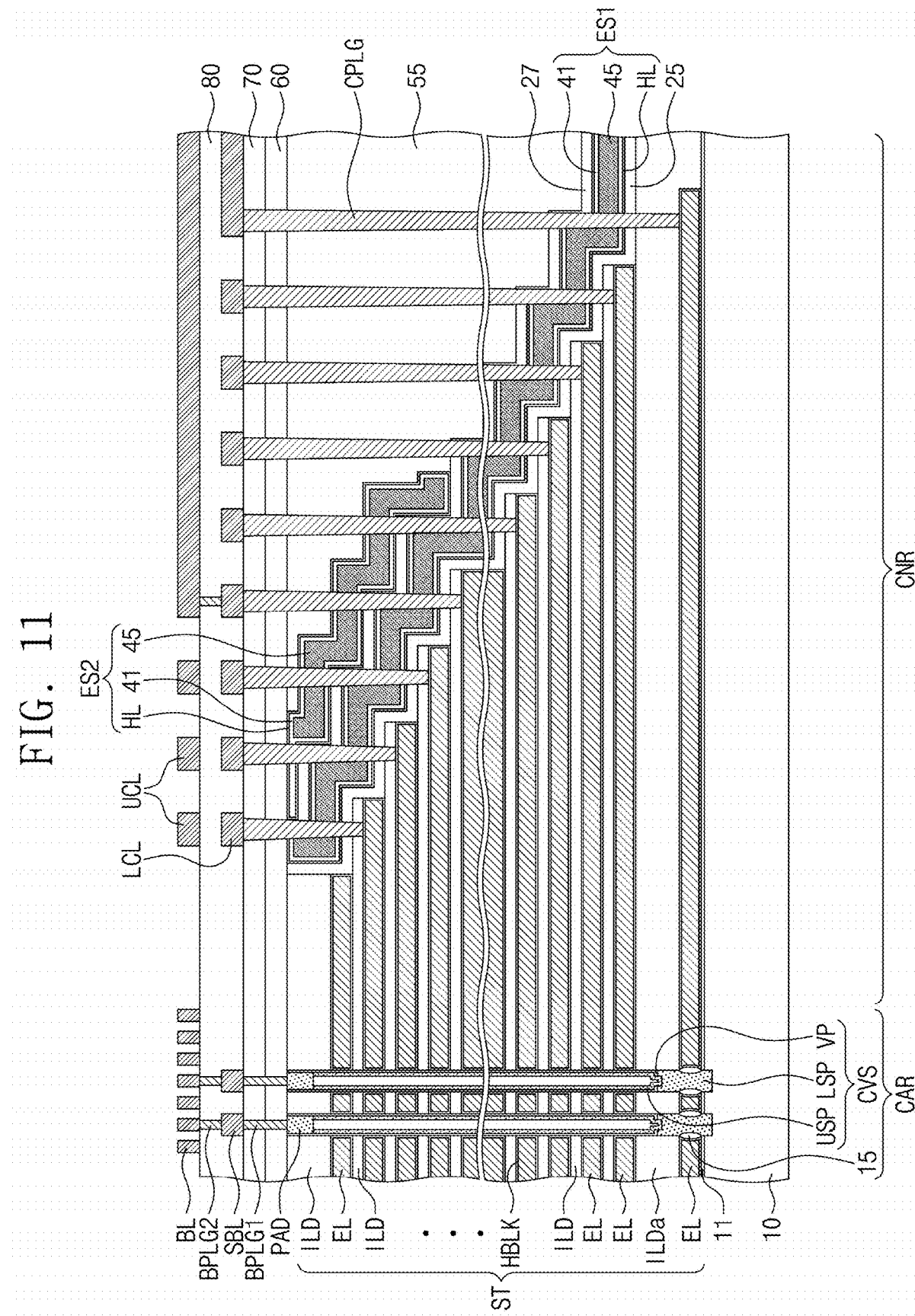
Figure 12:
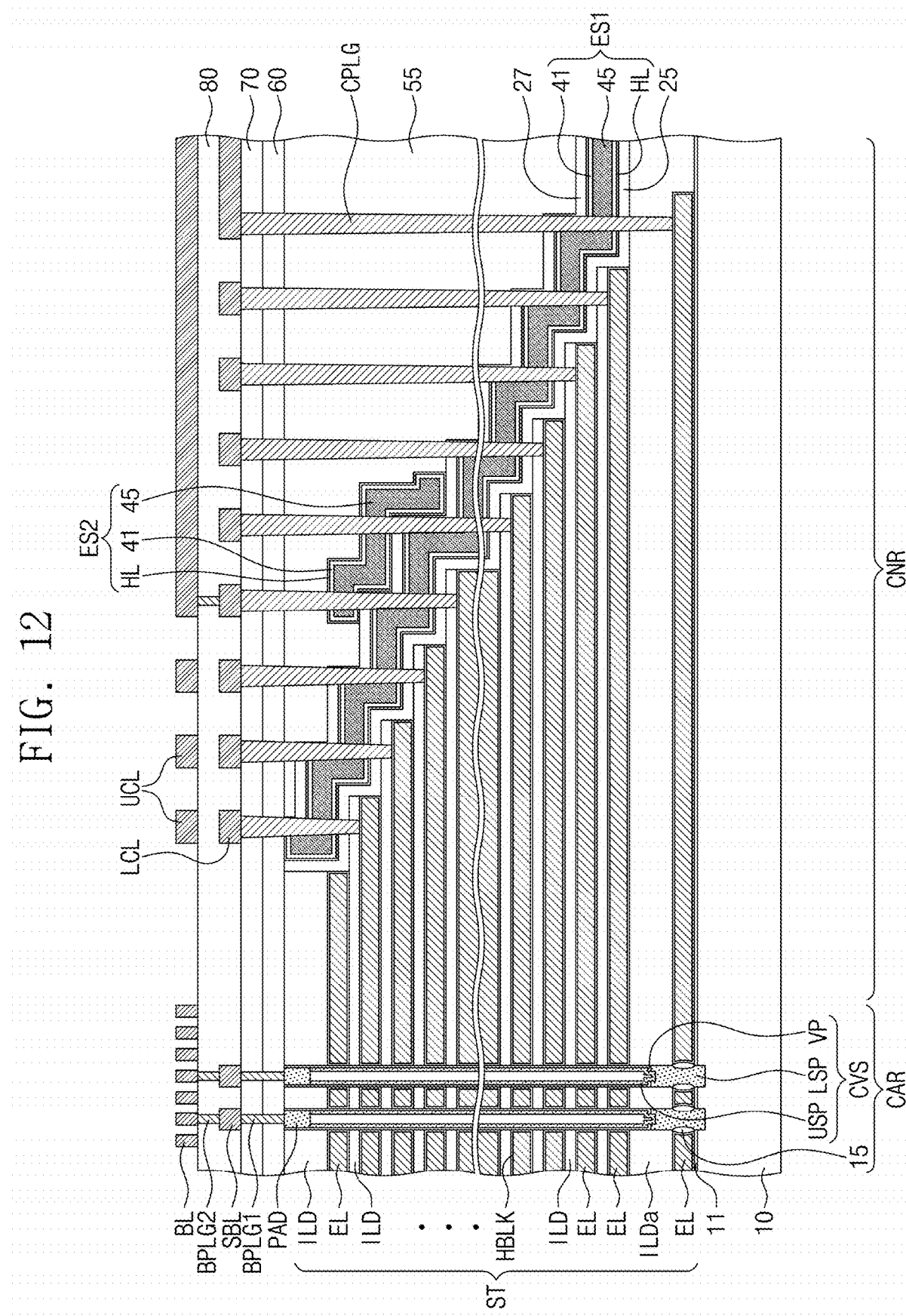
Figure 13A:
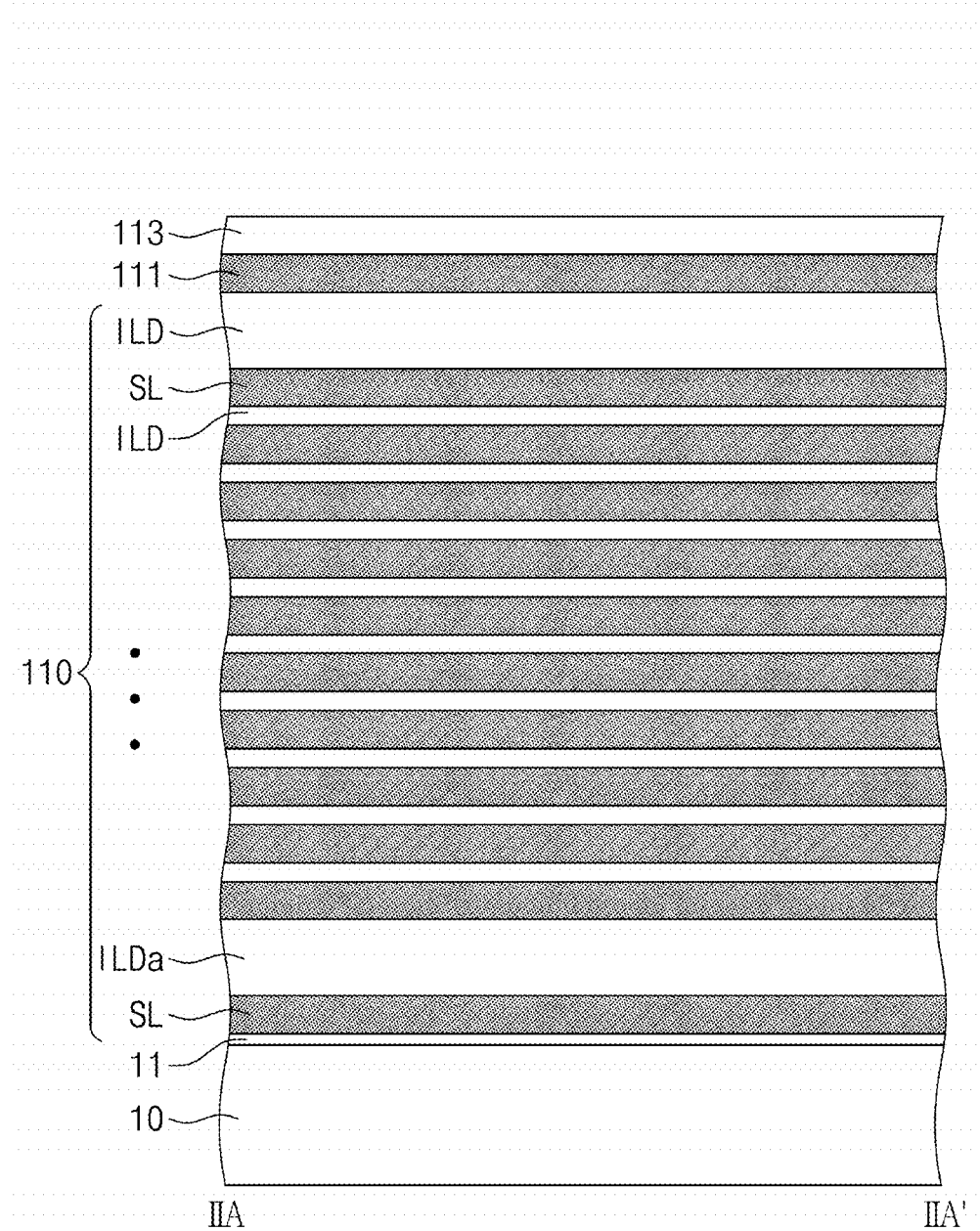
Figure 13B:
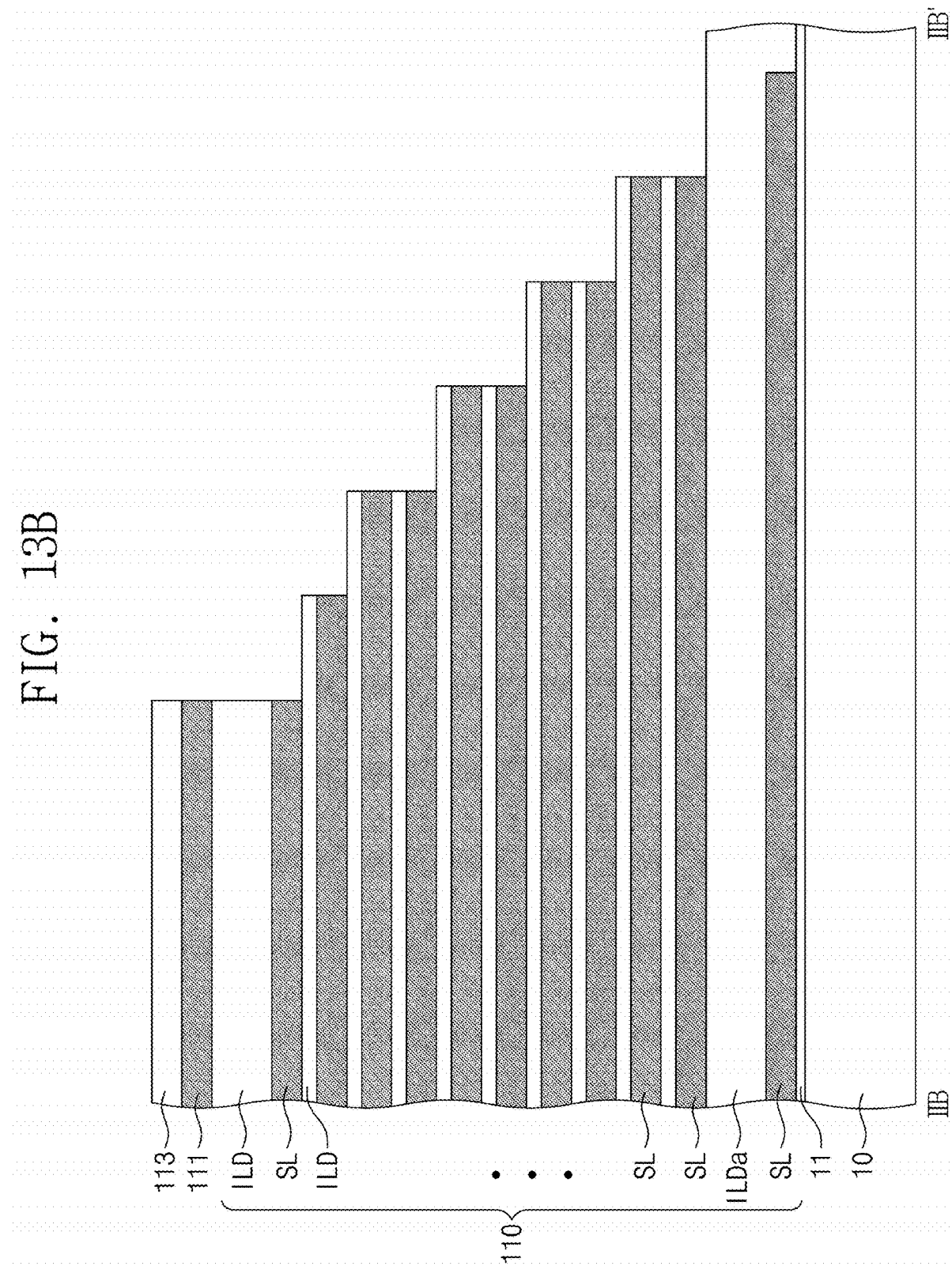
Figure 13C:
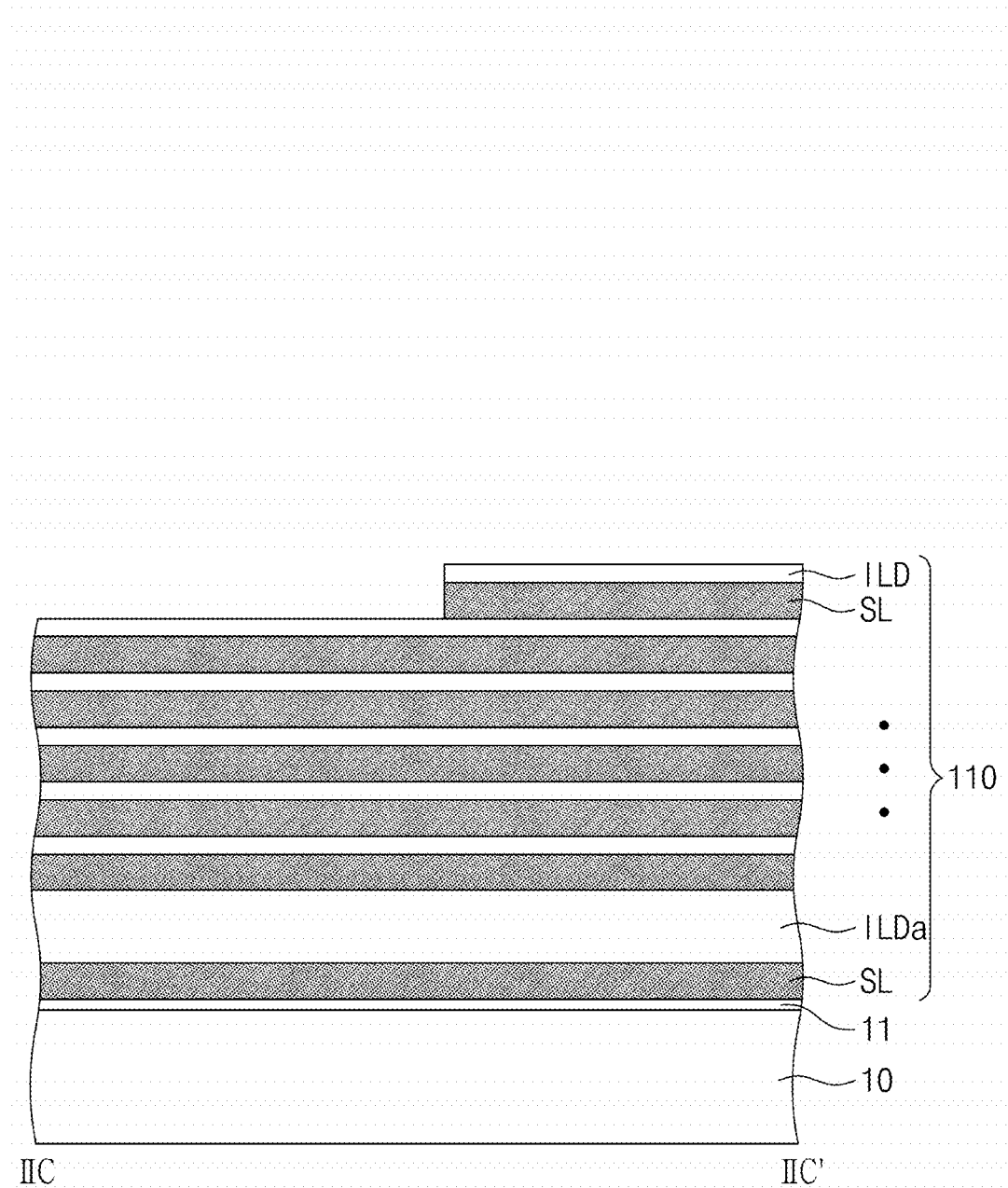

Referring to FIGS. 10, 11, and 12, the electrode structure ST may be disposed on the substrate 10, and may have the stepwise portion on the connection region CNR. Each stair-step of the stepwise portion may include one electrode EL and one dielectric layer ILD.

Referring to FIG. 10, a plurality of etch stop structures ES1 and ES2 may be stacked on the electrode structure ST on the connection region CNR. For example, the first and second etch stop structures ES1 and ES2 may conformally cover the stepwise portion of the electrode structure ST.

Like the etch stop structure ES discussed above with reference to FIGS. 2A, 2B, and 2C, each of the first and second etch stop structures ES1 and ES2 may include the etch stop pattern 45, the horizontal dielectric layer HL, and the first buffer dielectric layer 41.

The first etch stop structure ES1 and the electrode structure ST may be provided therebetween with a first pad dielectric layer 25 having a uniform thickness, and the first etch stop structure ES1 and the second etch stop structure ES2 may be provided therebetween with a second pad dielectric pattern 27 having a uniform thickness.

Referring to FIG. 10, the cell contact plugs CPLG may penetrate the first and second etch stop structures ES1 and ES2 on the connection region CNR, and may be connected to corresponding pad portions of the electrodes EL, respectively.

Referring to FIGS. 11 and 12, the first and second etch stop structures ES1 and ES2 may be disposed on the stepwise portion of the electrode structure ST, and the second etch stop structure ES2 may cover a portion (not an entirety) of the first etch stop structure ES1.

For example, as shown in FIG. 11, the second etch stop structure ES2 may conformally cover an upper portion of the stepwise portion of the electrode structure ST. Thus, the cell contact plugs CPLG coupled to the electrodes EL at relatively levels may penetrate the first and second etch stop structures ES1 and ES2. The cell contact plugs CPLG coupled to the electrodes EL at relatively low levels may penetrate only the first etch stop structure ES1.

For another example, as shown in FIG. 12, the second etch stop structure ES2 may conformally cover an intermediate portion of the stepwise portion of the electrode structure ST. Thus, the cell contact plugs CPLG coupled to the electrodes EL at intermediate levels may penetrate the first and second etch stop structures ES1 and ES2. The cell contact plugs CPLG coupled to the electrodes EL at levels higher and lower than the intermediate levels may penetrate only the first etch stop structure ES1.

FIGS. 13A to 21A, 13B to 21B, and 13C to 21C illustrate cross-sectional views taken along lines IIA-IIA', IIB-IIB', and IIC-IIC' of FIG. 1, showing a method of fabricating a three-dimensional semiconductor memory device according to an example embodiment of the present inventive concepts.

Referring to FIGS. 1, 13A, 13B, and 13C, a substrate 10 may be provided that includes a cell array region CAR and a connection region CNR. A mold structure 110 may be formed to include sacrificial layers SL and dielectric layers ILD that are vertically and alternately stacked on the substrate 10. A polishing stop layer 111 and a dummy dielectric layer 113 may be sequentially formed on the mold structure 110. Optionally, a dielectric material such as silicon oxide may be provided to form a buffer dielectric layer 11 between the substrate 10 and the mold structure 110.

When the mold structure 110 is formed, the sacrificial layers SL may be formed of a material having an etch selectivity with respect to the dielectric layers ILD. The sacrificial layers SL may include a dielectric material different from that of the dielectric layers ILD. For example, the sacrificial layers SL may be formed of a silicon nitride layer, and the dielectric layers ILD may be formed of a silicon oxide layer. The sacrificial layers SL each may have the same or substantially similar thickness, and the dielectric layers ILD may have different thicknesses depending on positions thereof.

In certain example embodiments, the mold structure 110 may have a stepwise portion in which end portions of the dielectric layers ILD are exposed on the connection region CNR. For example, the formation of the mold structure 110 may include forming a thin-layer structure (not shown), in which the sacrificial layers SL and the dielectric layers ILD are vertically and alternately stacked, on an entire surface of the substrate 10, and then performing a stepwise patterning process on the thin-layer structure.

The stepwise patterning process may include forming a mask pattern (not shown) to cover the thin-layer structure on the cell array region CAR and the connection region CNR, and then alternately performing a process to partially etch the thin-layer structure and a process to reduce a horizontal area of the mask pattern. The stepwise patterning process may provide the mold structure 110 with a stepwise portion along a first direction D1 on the connection region CNR.

A slope of the stepwise portion formed along the first direction D1 may depend on the number of the sacrificial layers SL etched when the thin-layer is partially etched in the stepwise patterning process. In some example embodiments, two or more sacrificial layers SL may be etched when the thin-layer is partially etched. After the stepwise patterning process, a pad etching process may be performed in which the mold structure 110 is partially etched on the connection region CNR to provide the mold structure 110 with stair-steps in a second direction D2.

Referring to FIGS. 1, 14A, 14B, and 14C, a pad dielectric layer 25 and a pad sacrificial layer 35 may be sequentially formed to conformally cover a surface of the mold structure 110.

The pad dielectric layer 25 may include a dielectric material (e.g., a silicon oxide layer) having an etch selectivity with respect to the sacrificial layers SL.

The pad sacrificial layer 35 may include a dielectric material having an etch selectivity with respect to the pad dielectric layer 25. In certain example embodiments, the pad sacrificial layer 35 may be formed of the same material as that of the sacrificial layers SL, and may be thicker than the sacrificial layers SL of the mold structure 110. For example, the pad sacrificial layer 35 may be a silicon nitride layer or a silicon oxynitride layer.

After the pad sacrificial layer 35 is formed, a buried dielectric layer (not shown) may be formed on the entire surface of the substrate 10. On the cell array region CAR, the buried dielectric layer may be deposited to have a thickness greater than that of the mold structure 110. The buried dielectric layer may include a dielectric material having an etch selectivity with respect to the pad sacrificial layer 35. The buried dielectric layer may include, for example, PE-TEOS (plasma enhanced tetraethylorthosilicate), $O_3$-TEOS ($O_3$-tetratthylorthosilicate), USG (undoped silicate glass), PSG (phosphosilicate glass), BSG (borosilicate glass), BPSG (borophosphosilicate glass), FSG (fluorosilicate glass), SOG (spin on glass), TOSZ (tonen silazene), or a combination thereof.

The buried dielectric layer may then undergo a planarization process to form a planarized buried dielectric layer 55. The planarization process may include a chemical mechanical polishing (CMP) process and an etching process, and the polishing stop layer 111 on the cell array region CAR may be used as a polishing end point. After the planarization process, the planarized buried dielectric layer 55 may have a substantially flat top surface on the connection region CNR.

Figure 14A:
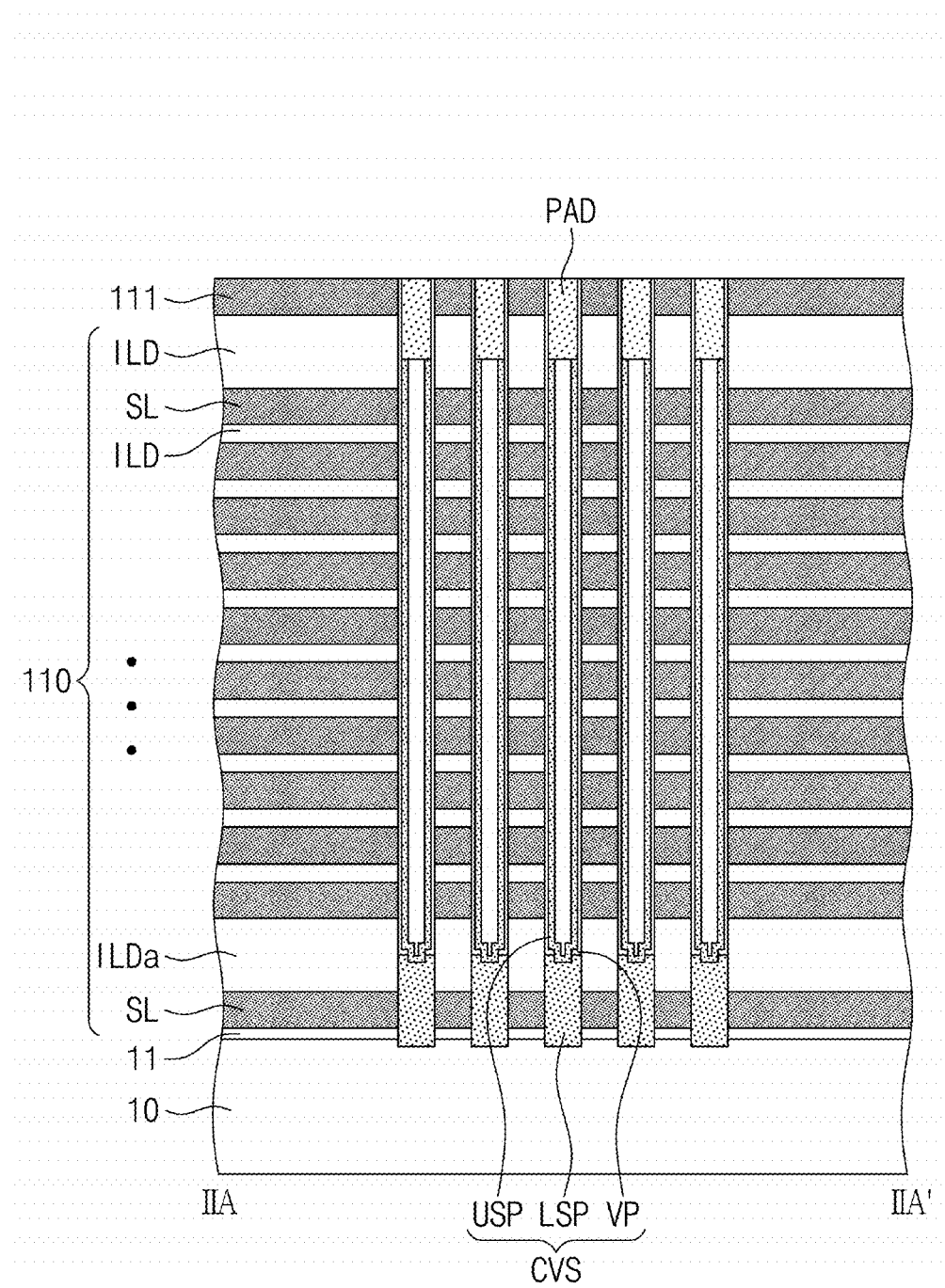
Figure 14B:
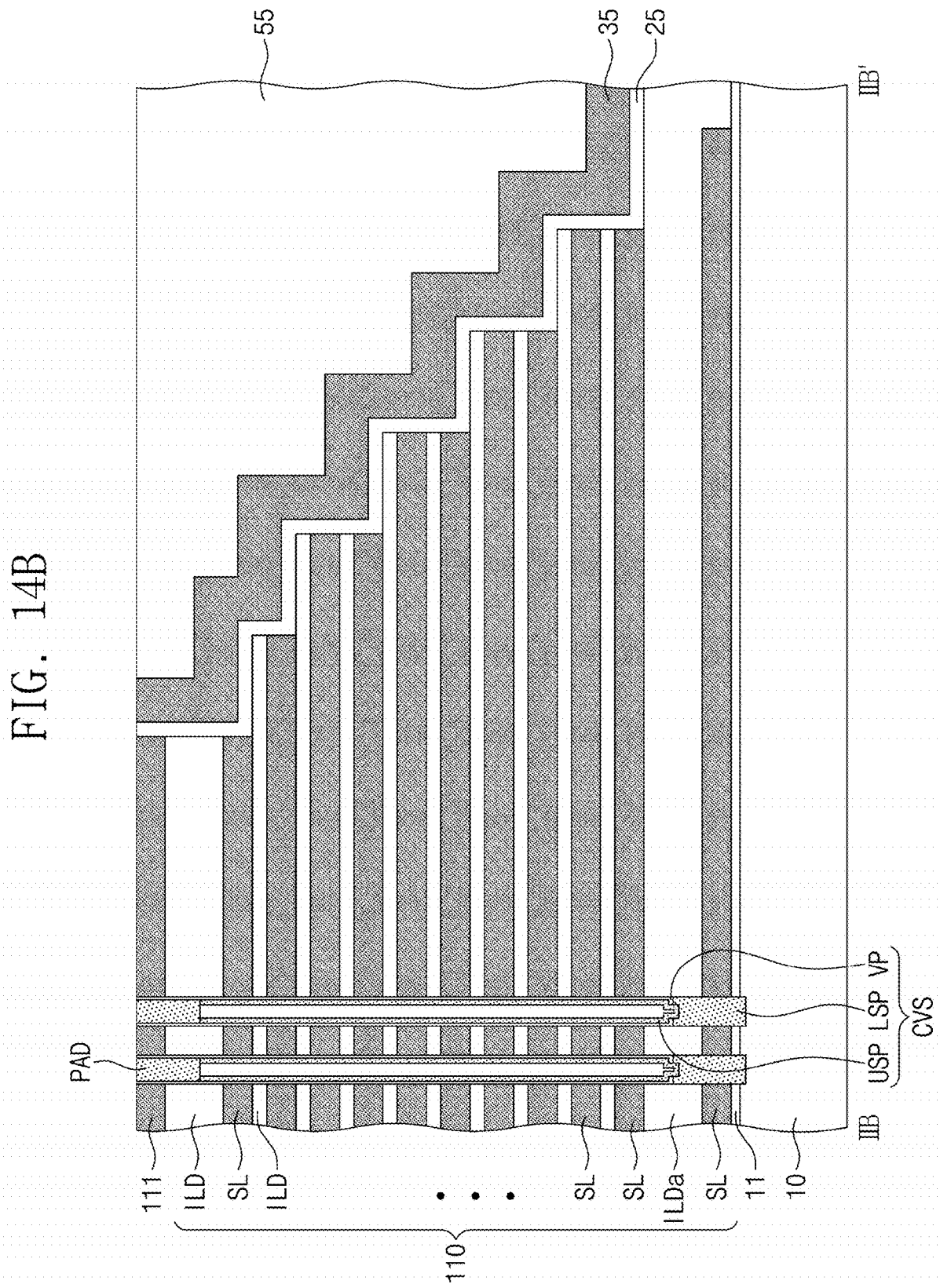
Figure 14C:
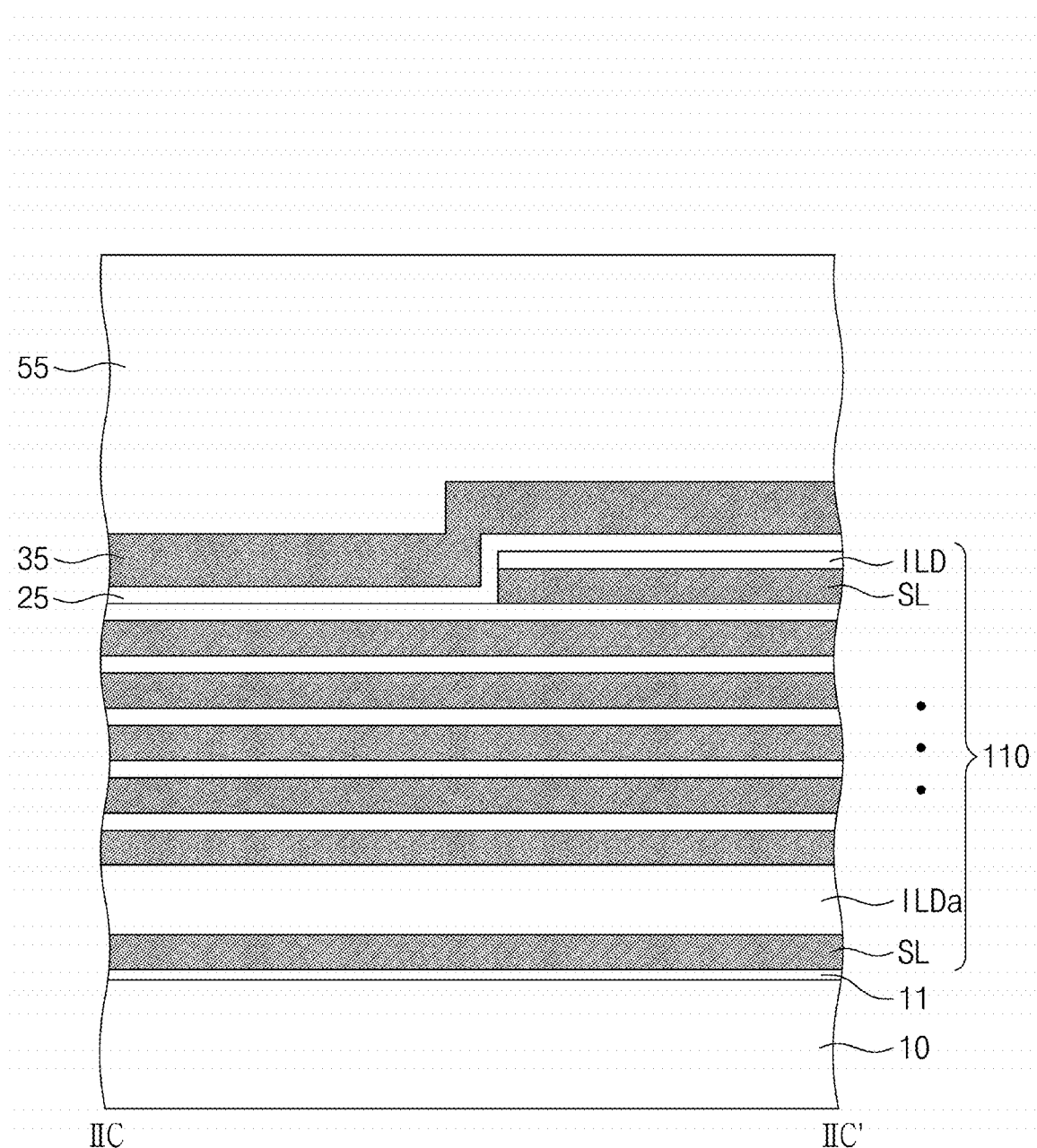
Figure 15A:
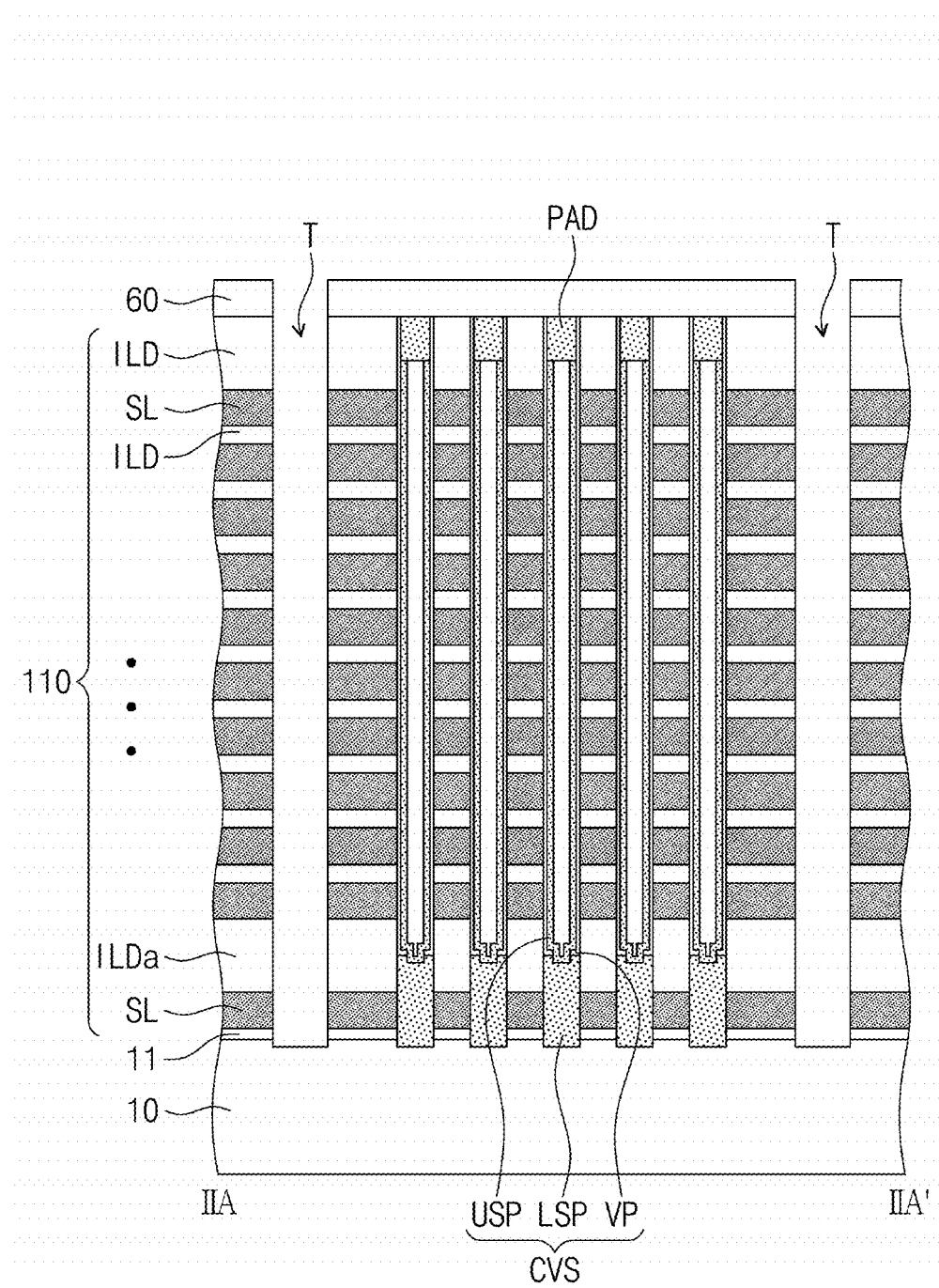
Figure 15B:
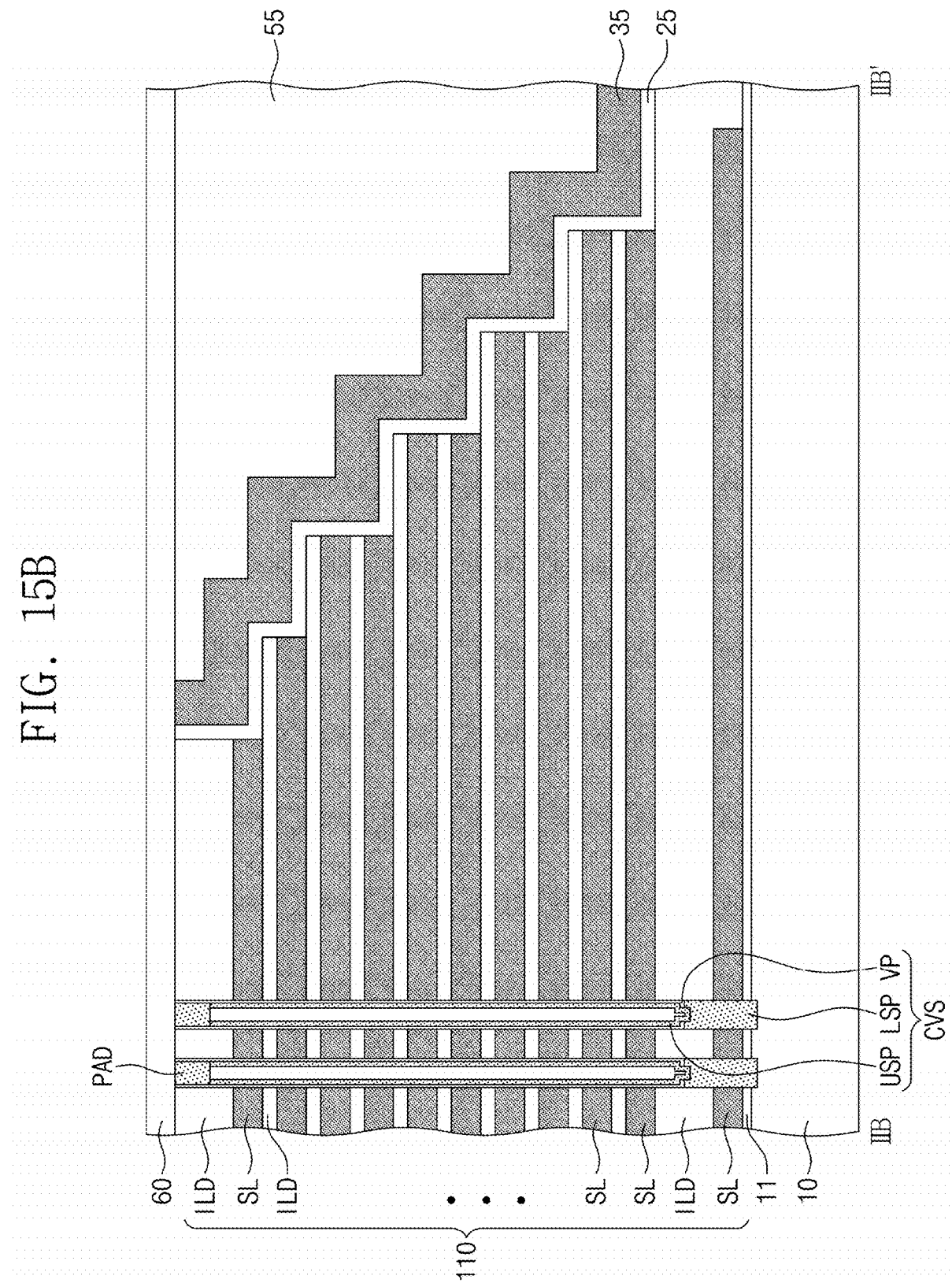
Figure 15C:
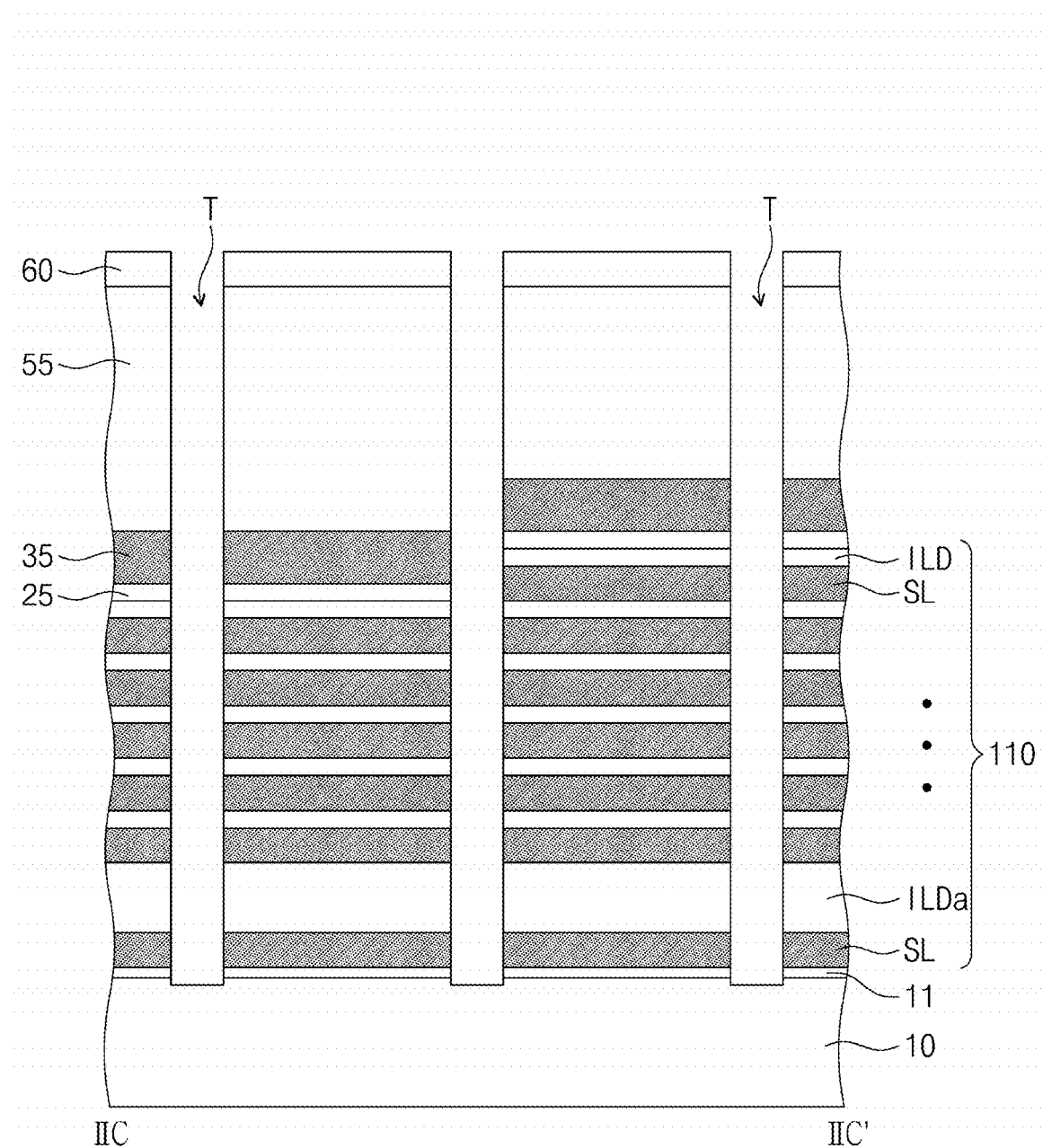
Figure 16A:
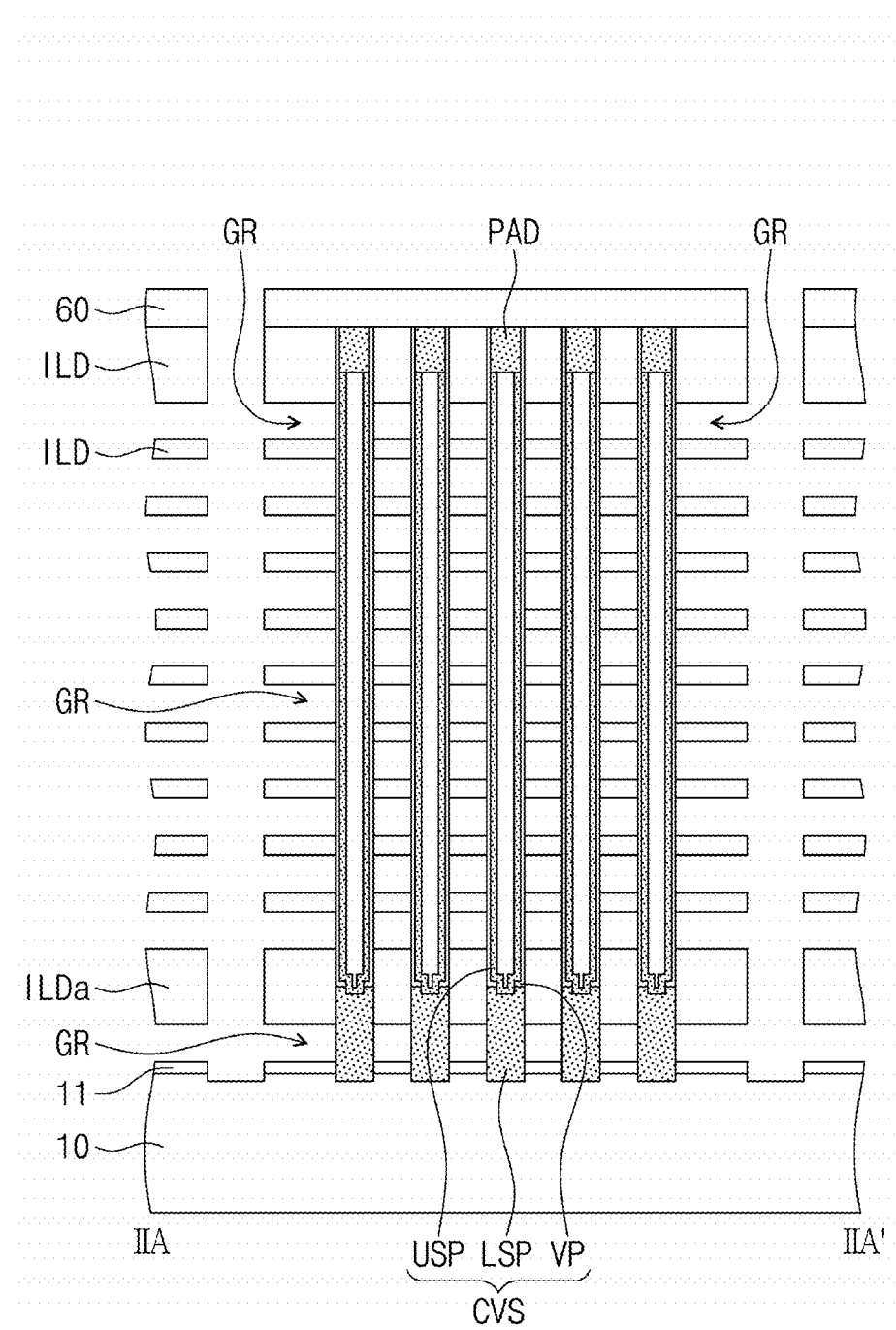
Figure 16B:
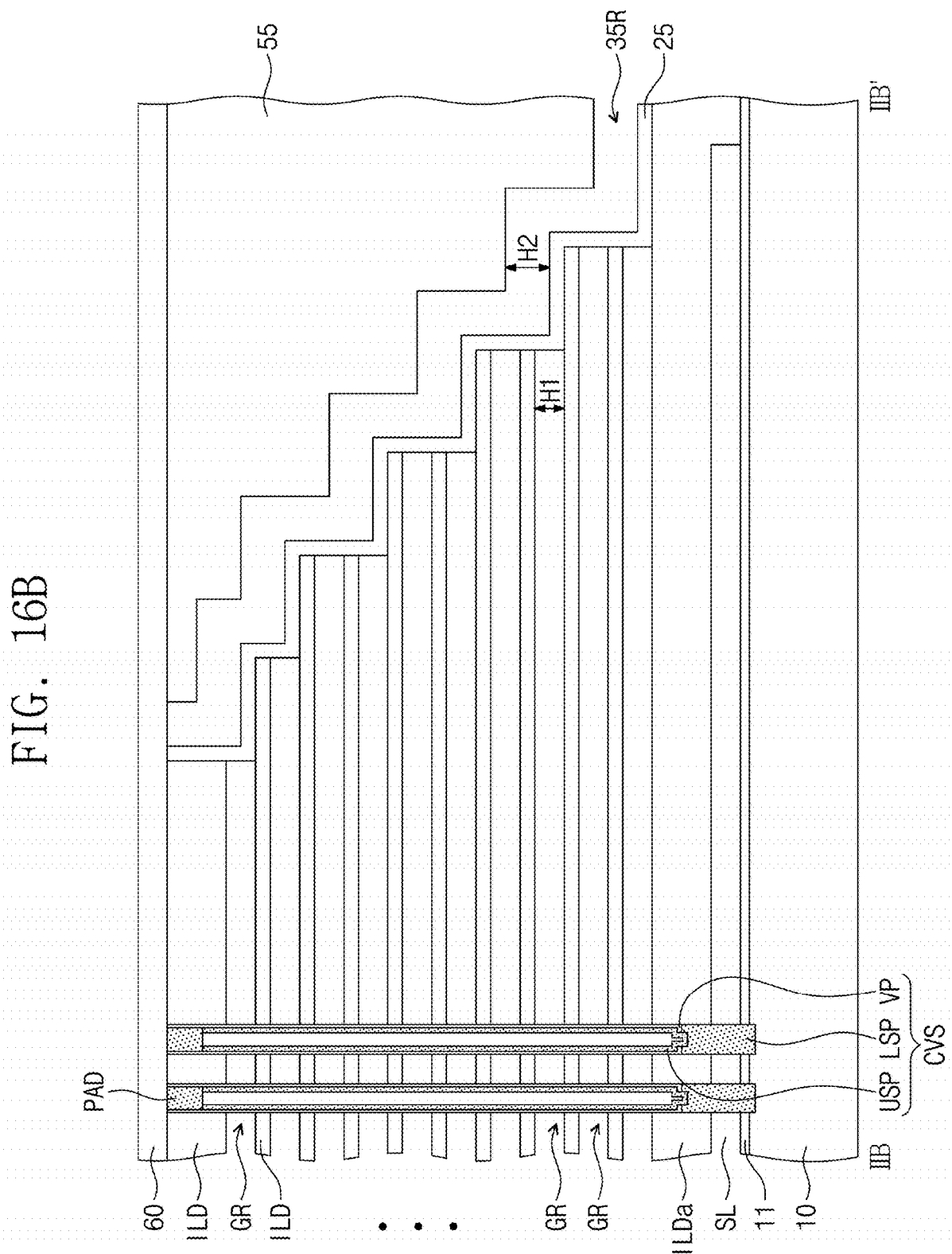
Figure 16C:
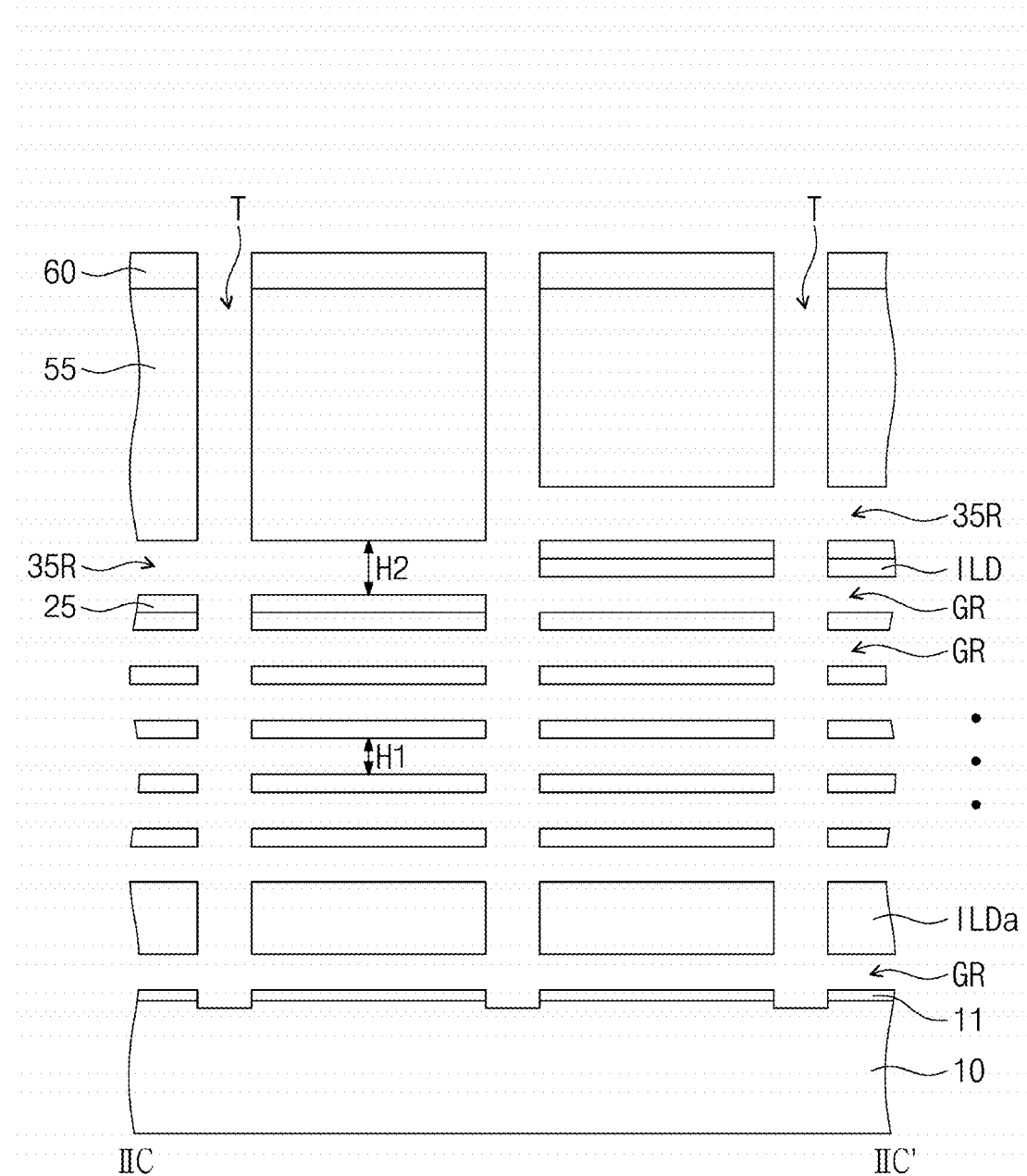
Figure 17A:
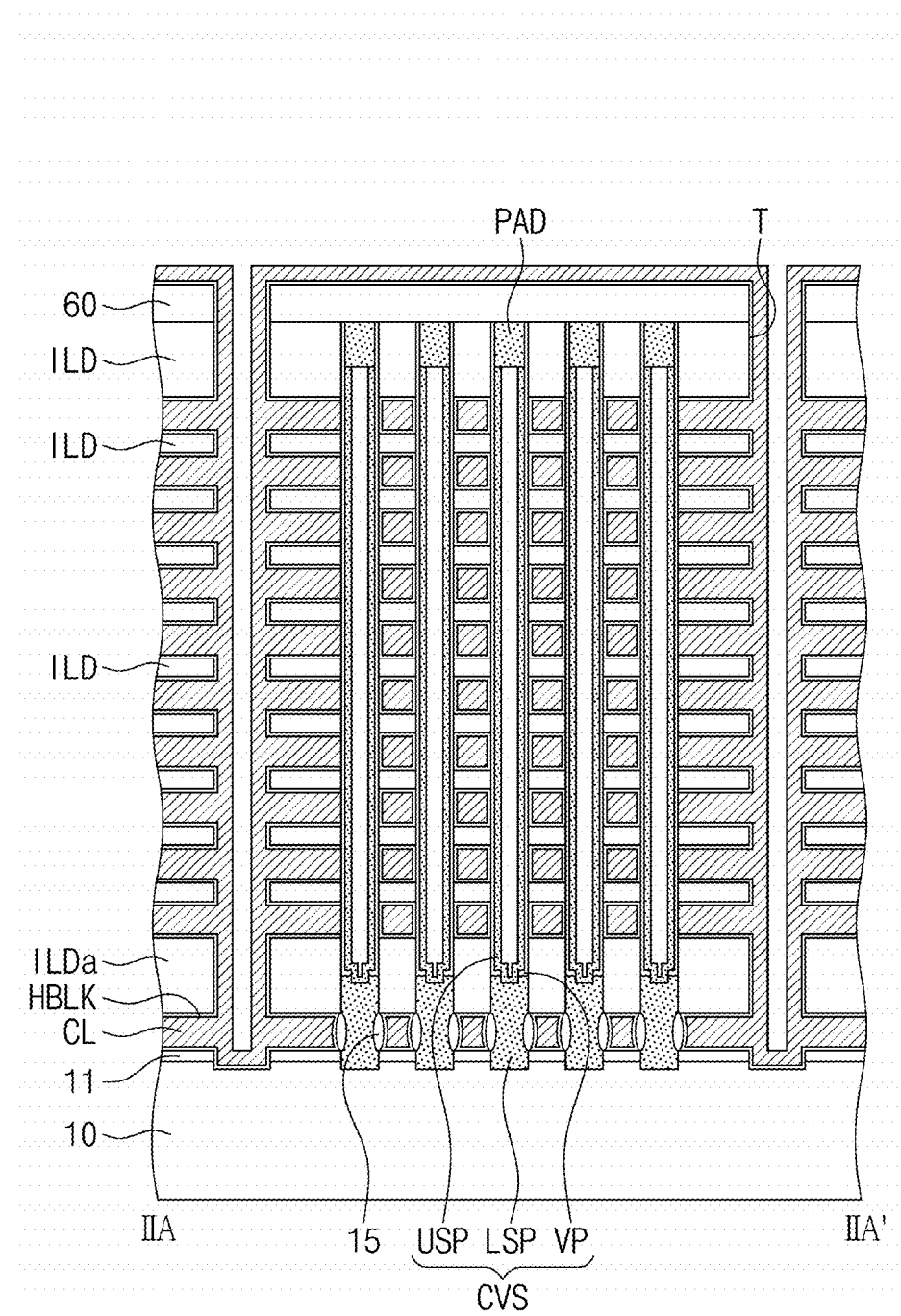
Figure 17B:
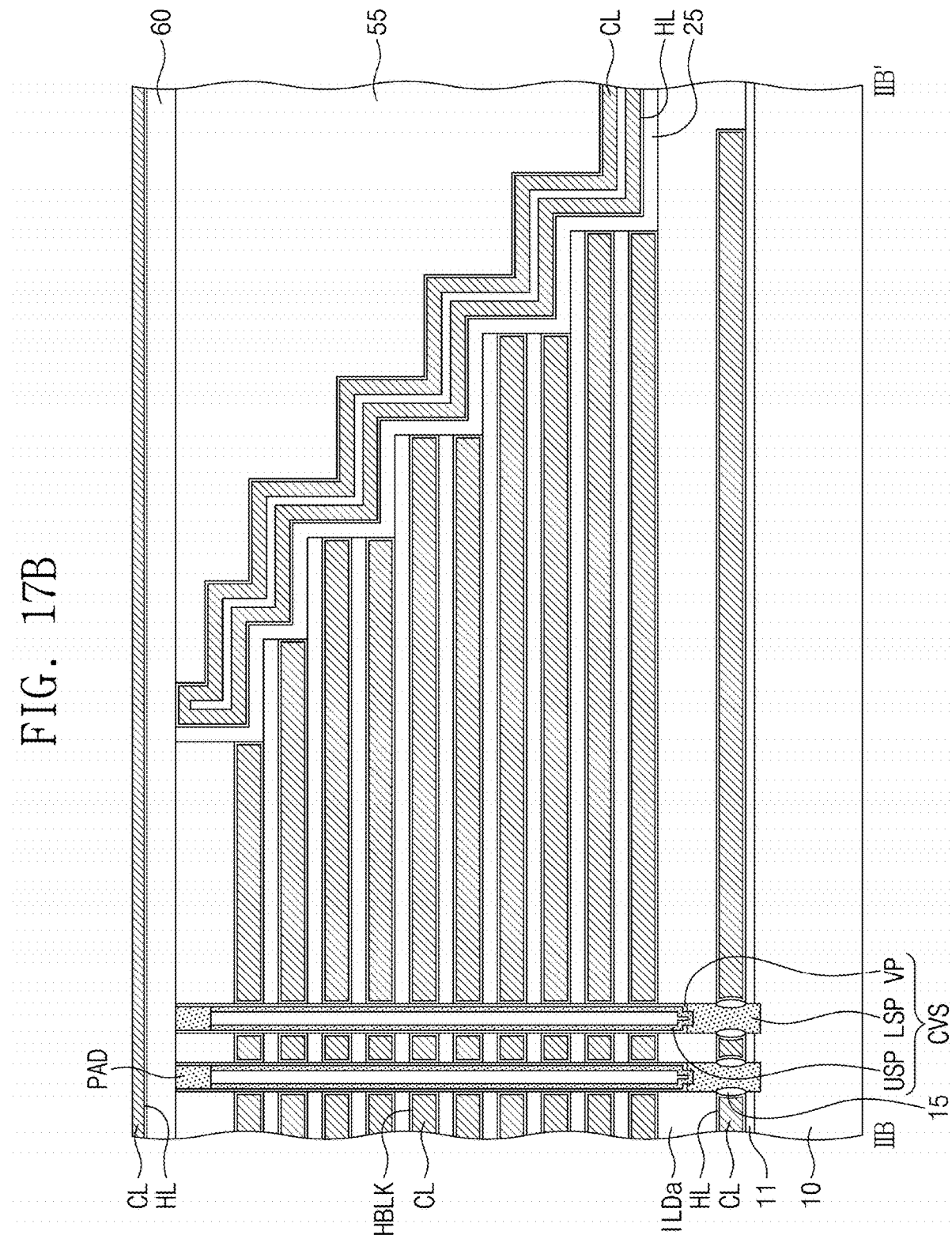
Figure 17C:
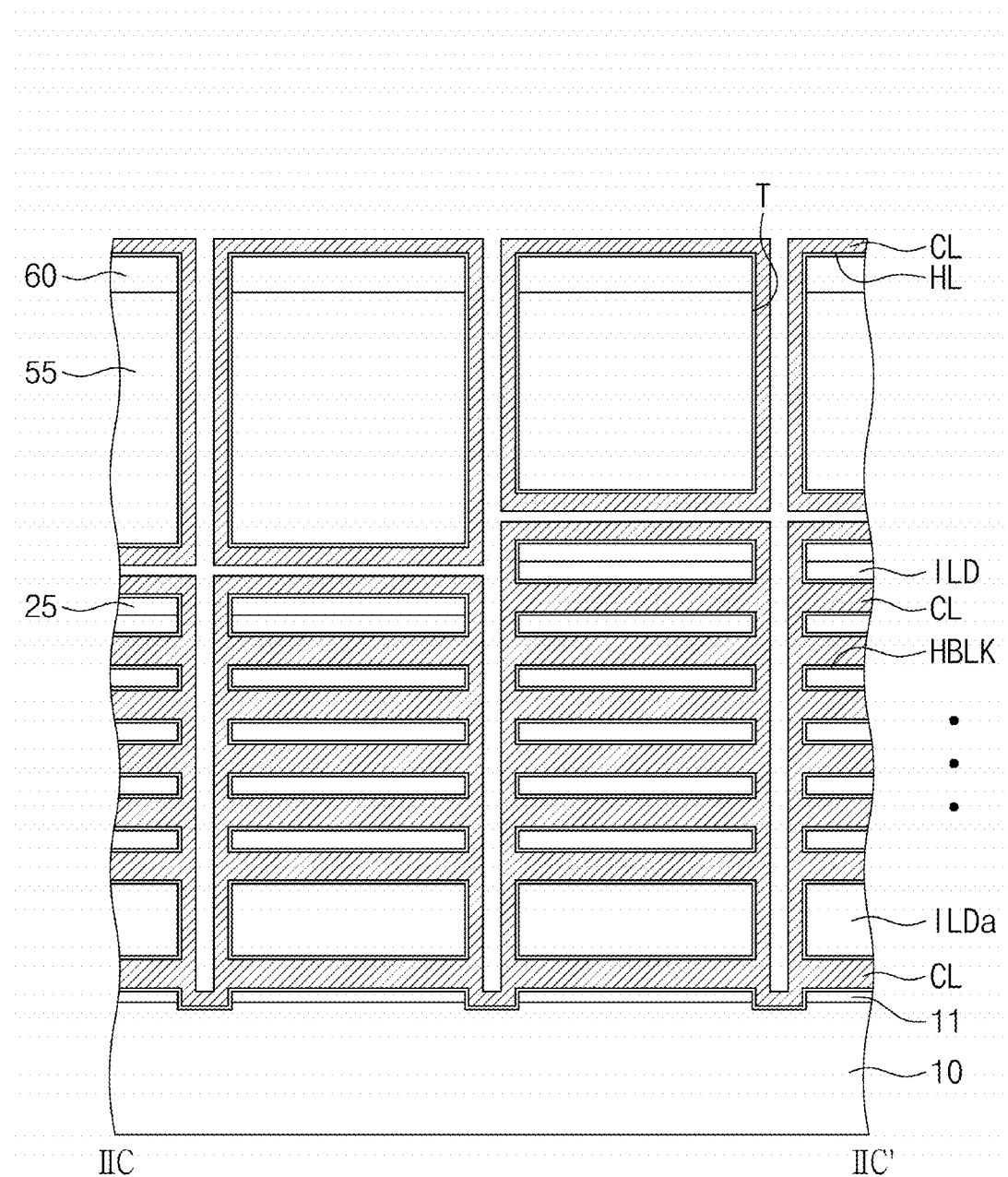
Figure 18A:
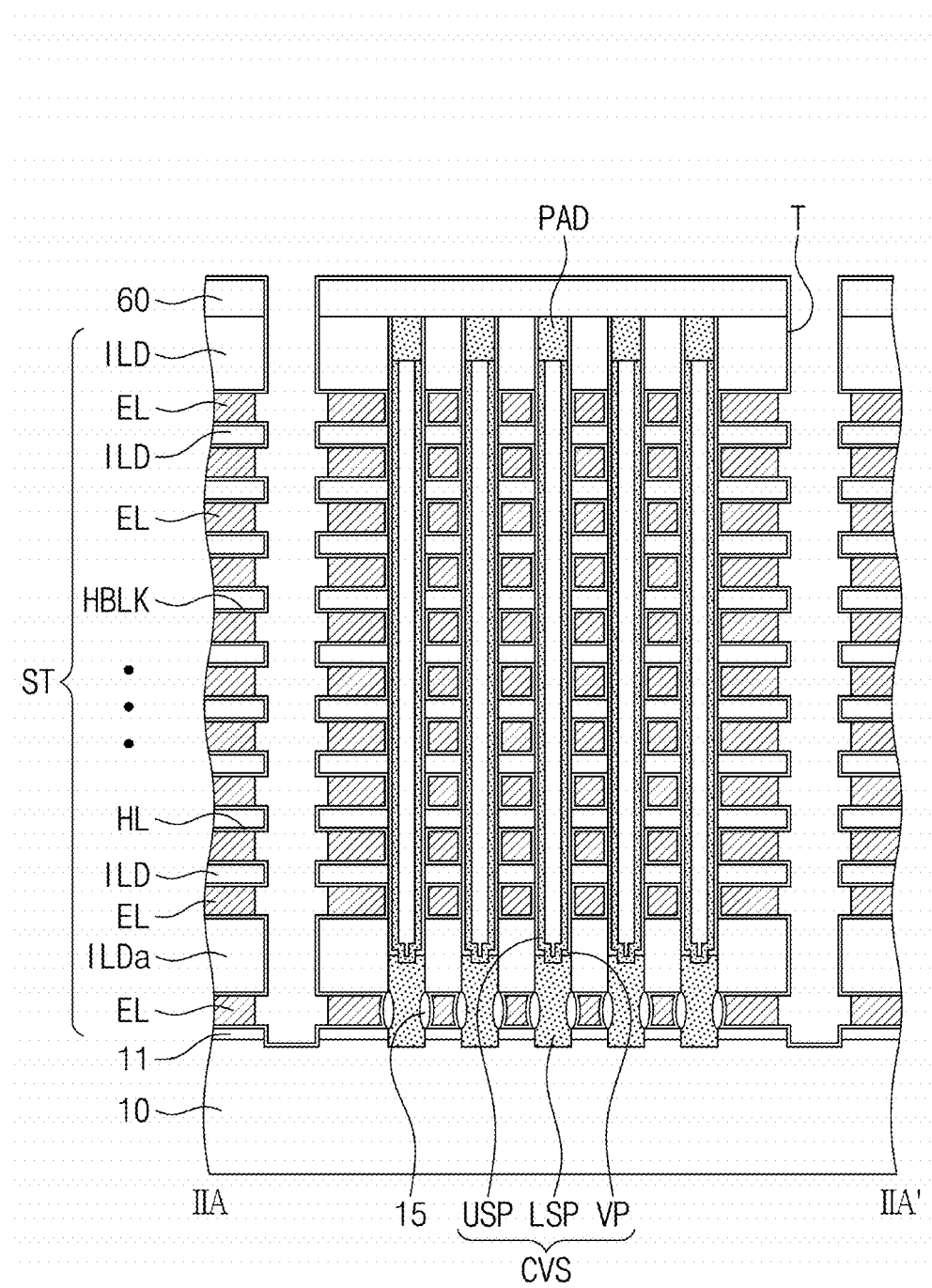
Figure 18C:
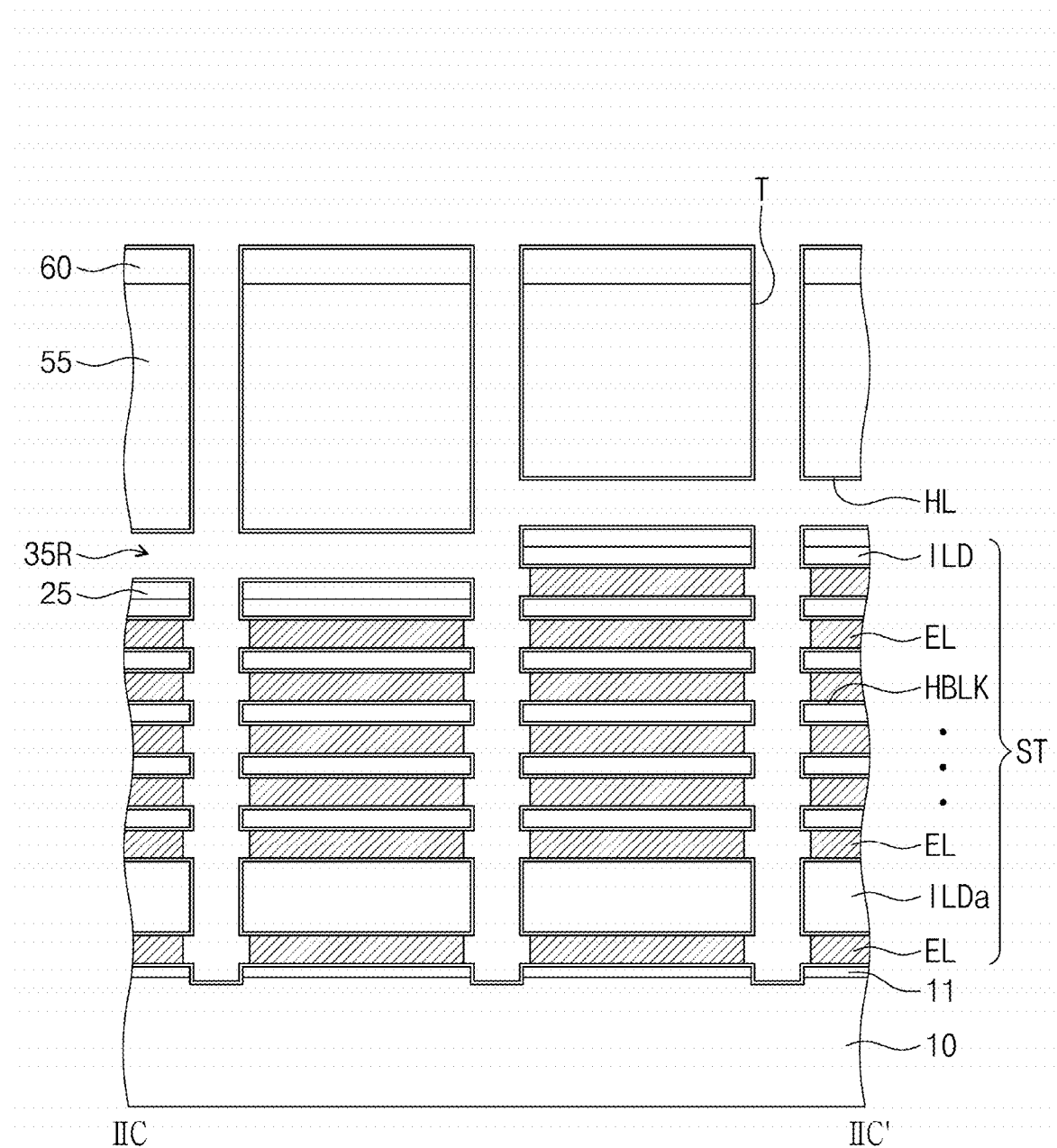
Figure 19A:
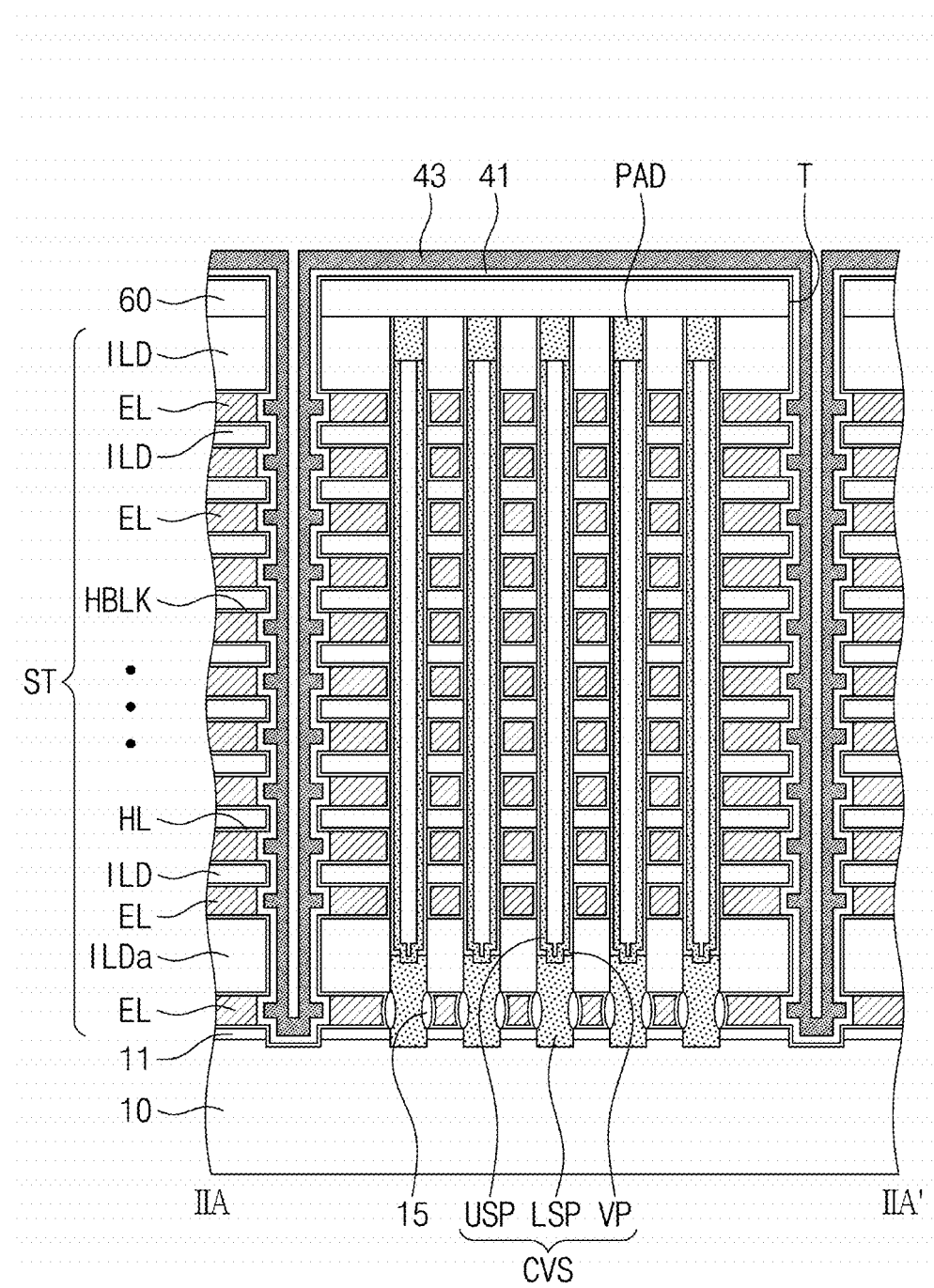
Figure 19B:
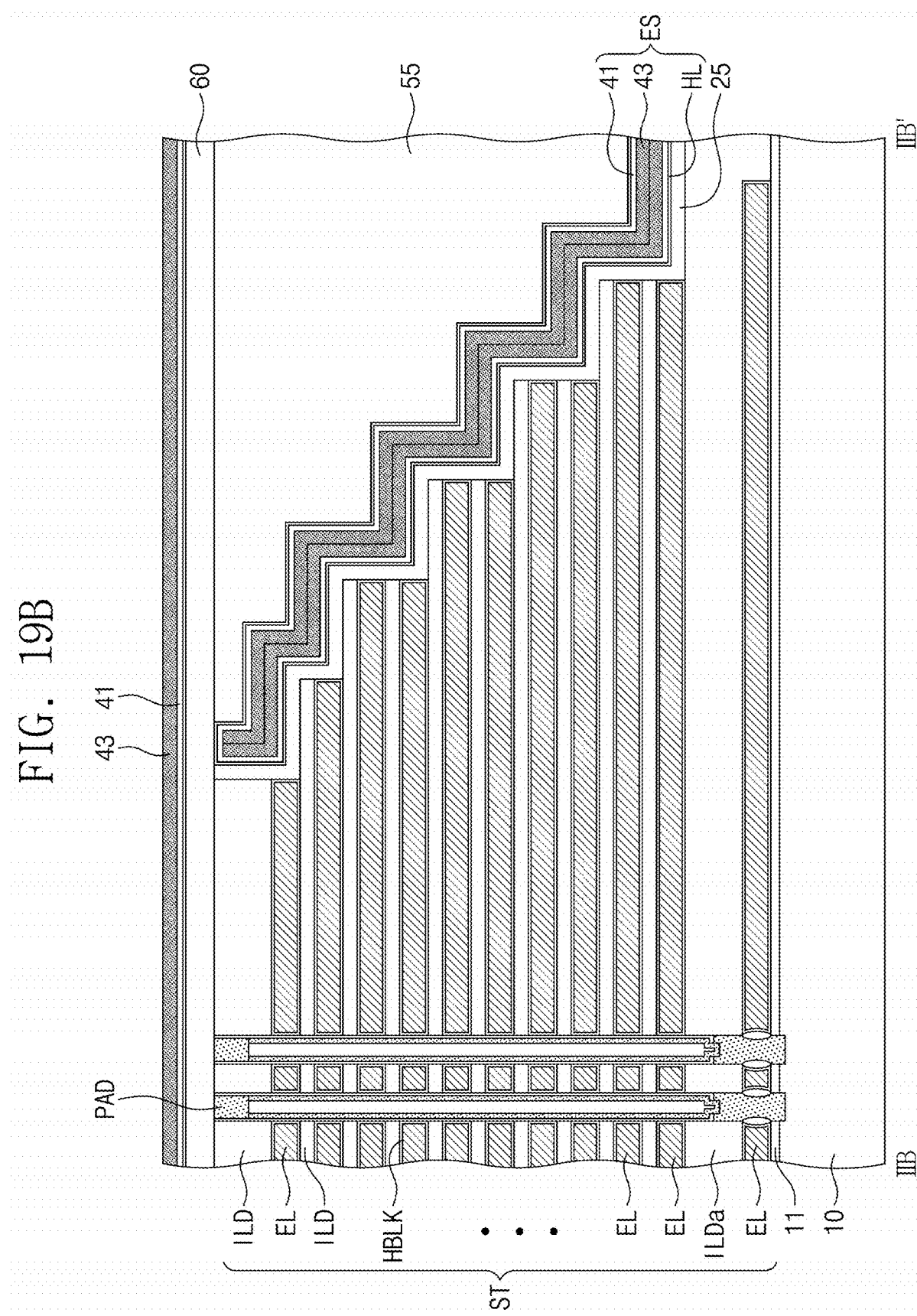
Figure 19C:
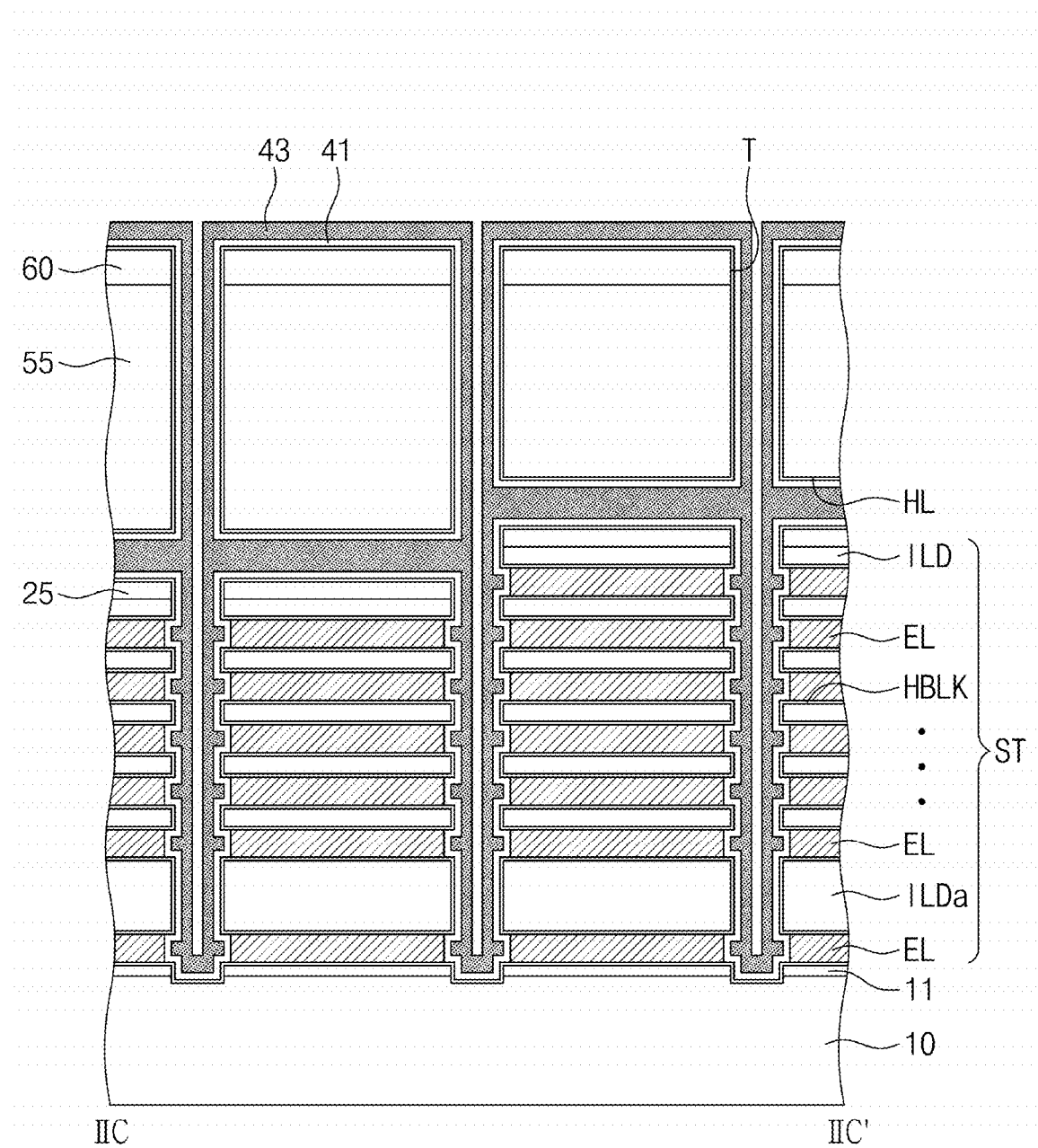
Figure 20A:
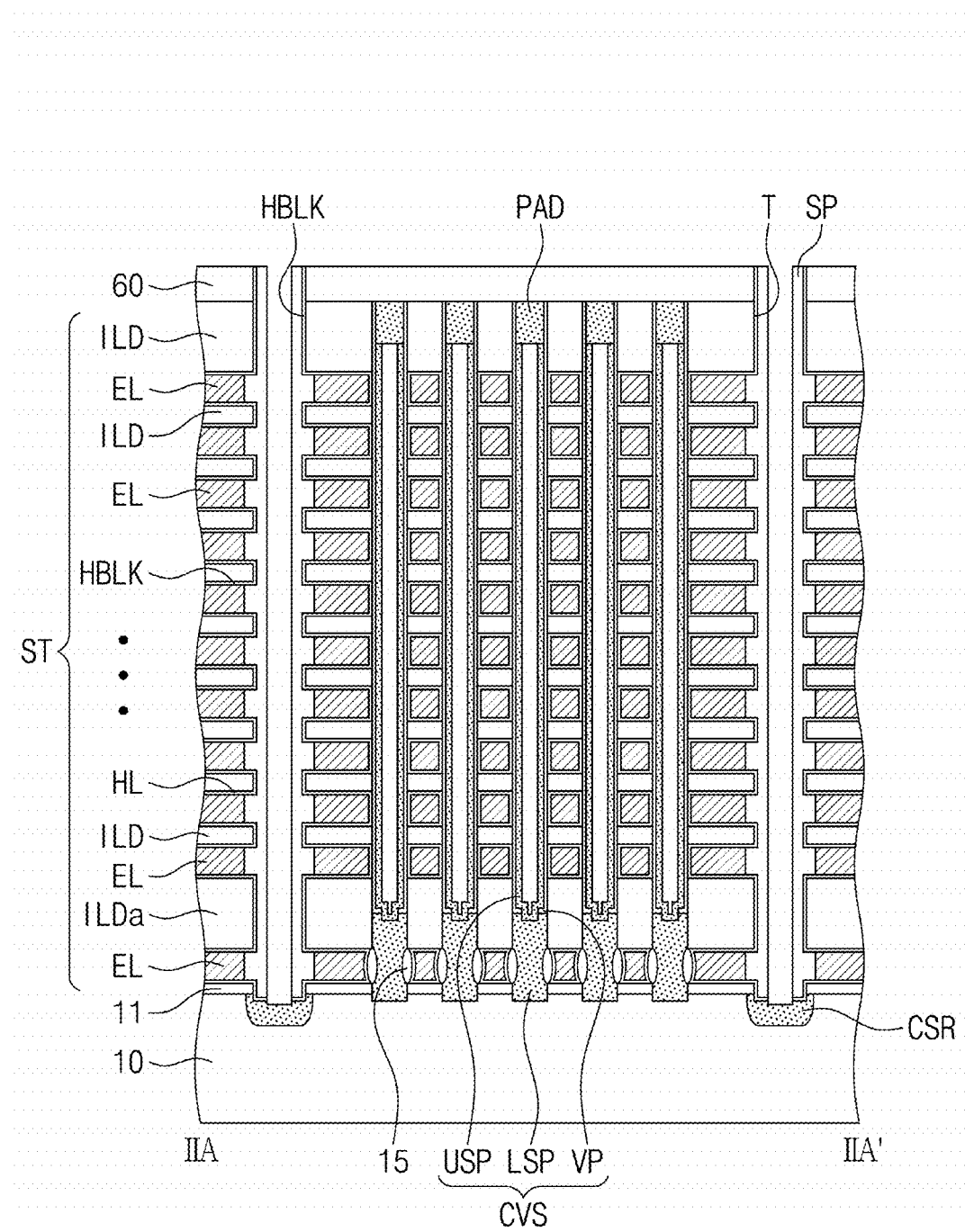
Figure 20B:
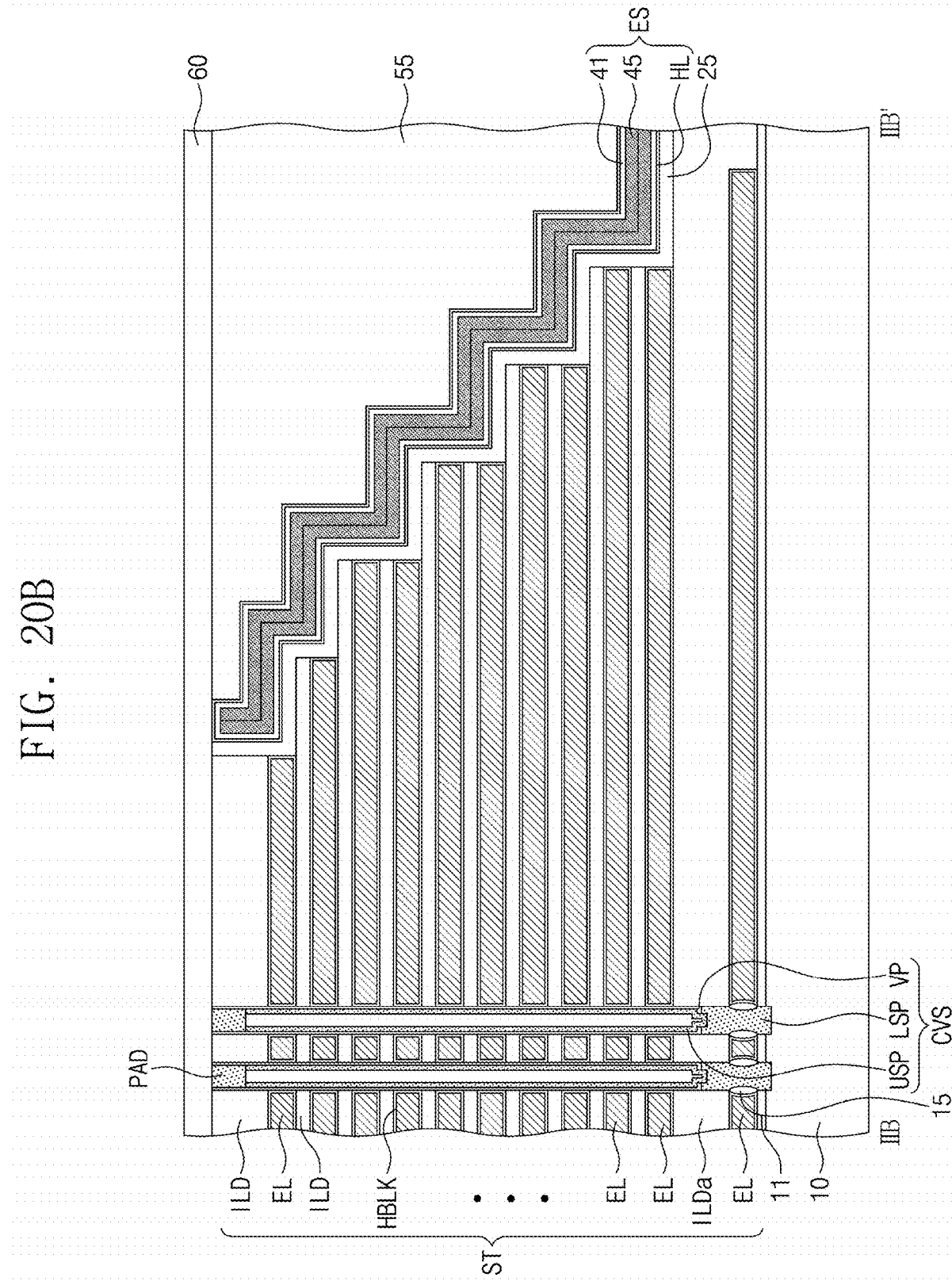
Figure 20C:
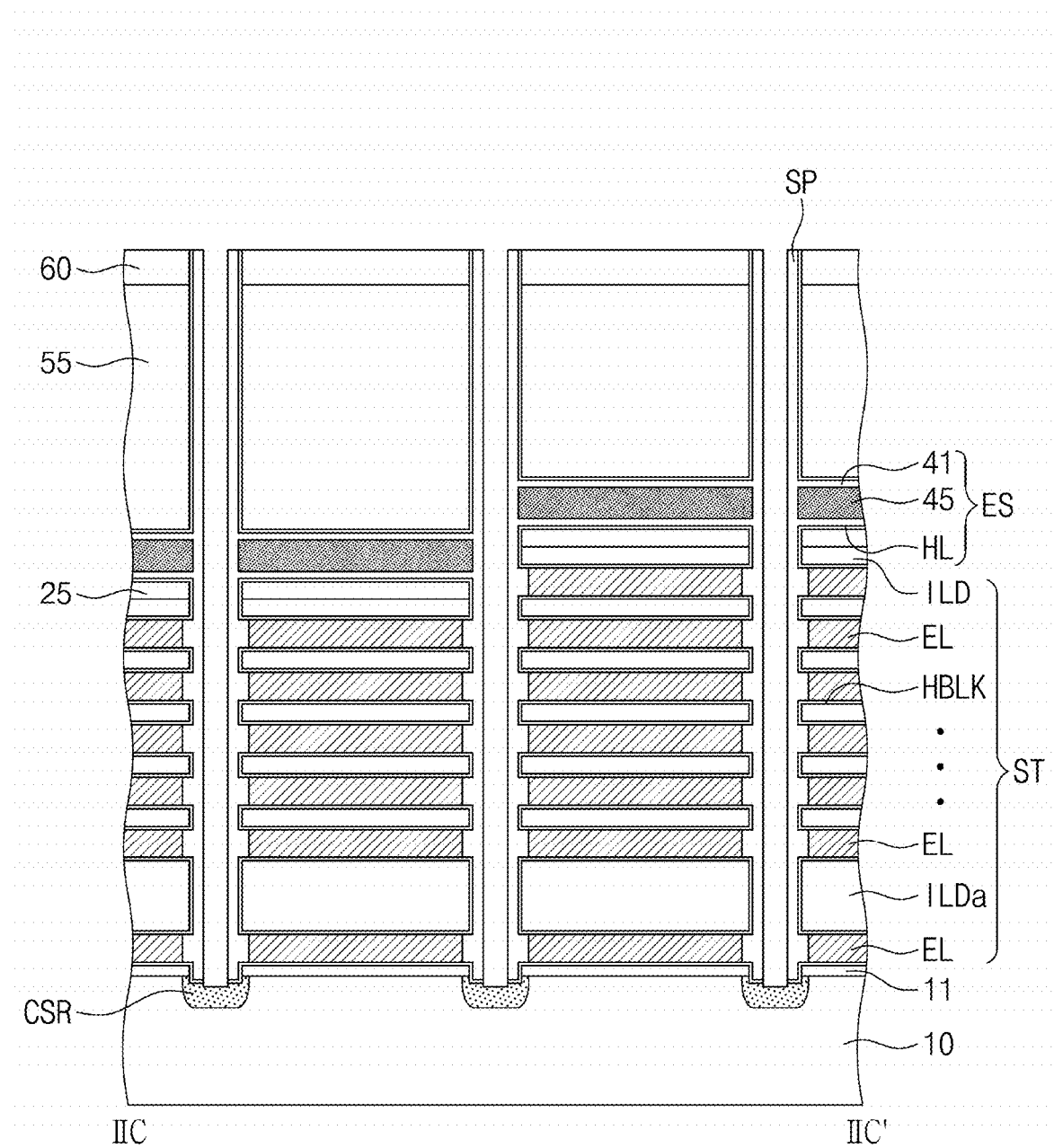
Figure 21A:
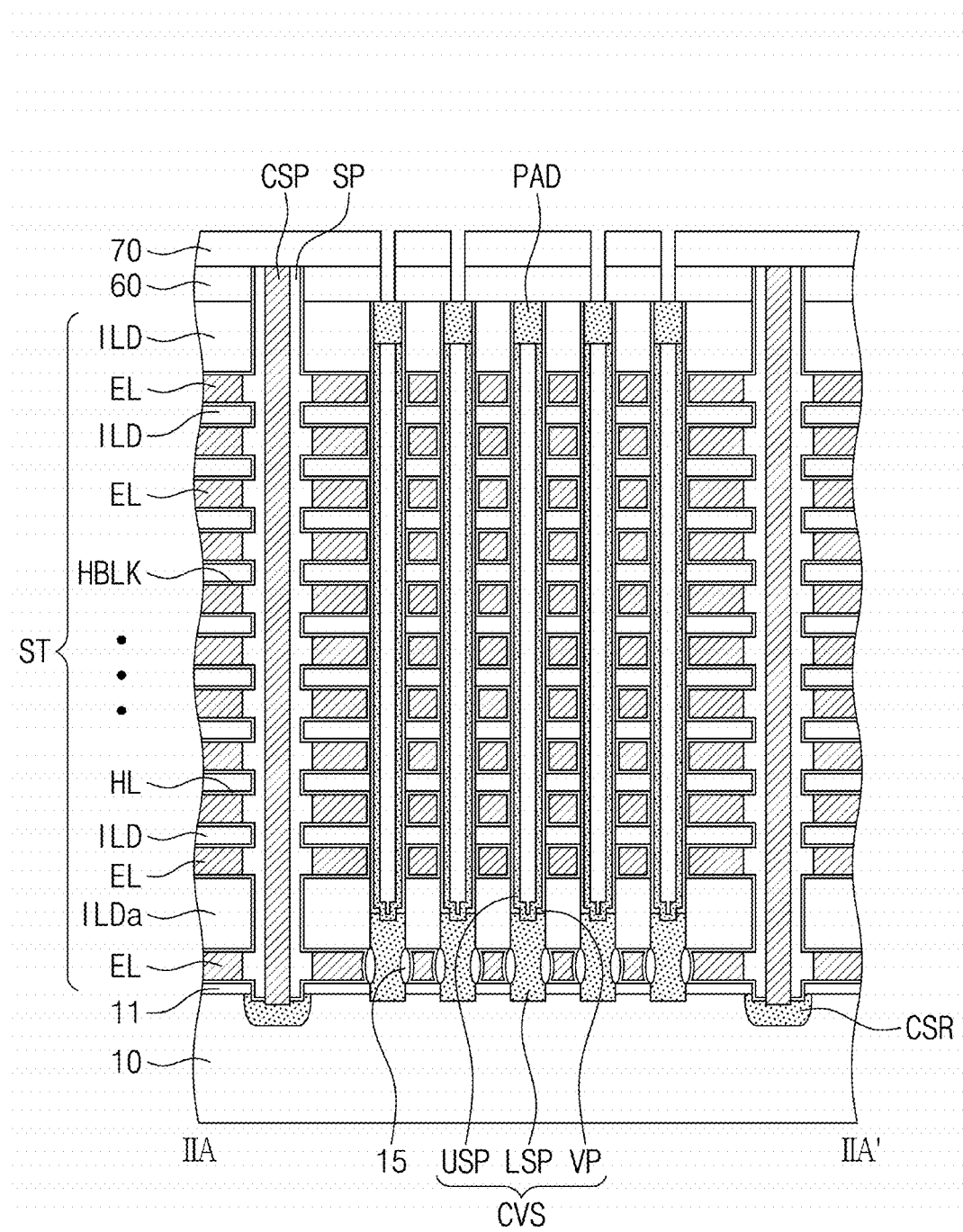
Figure 21C:
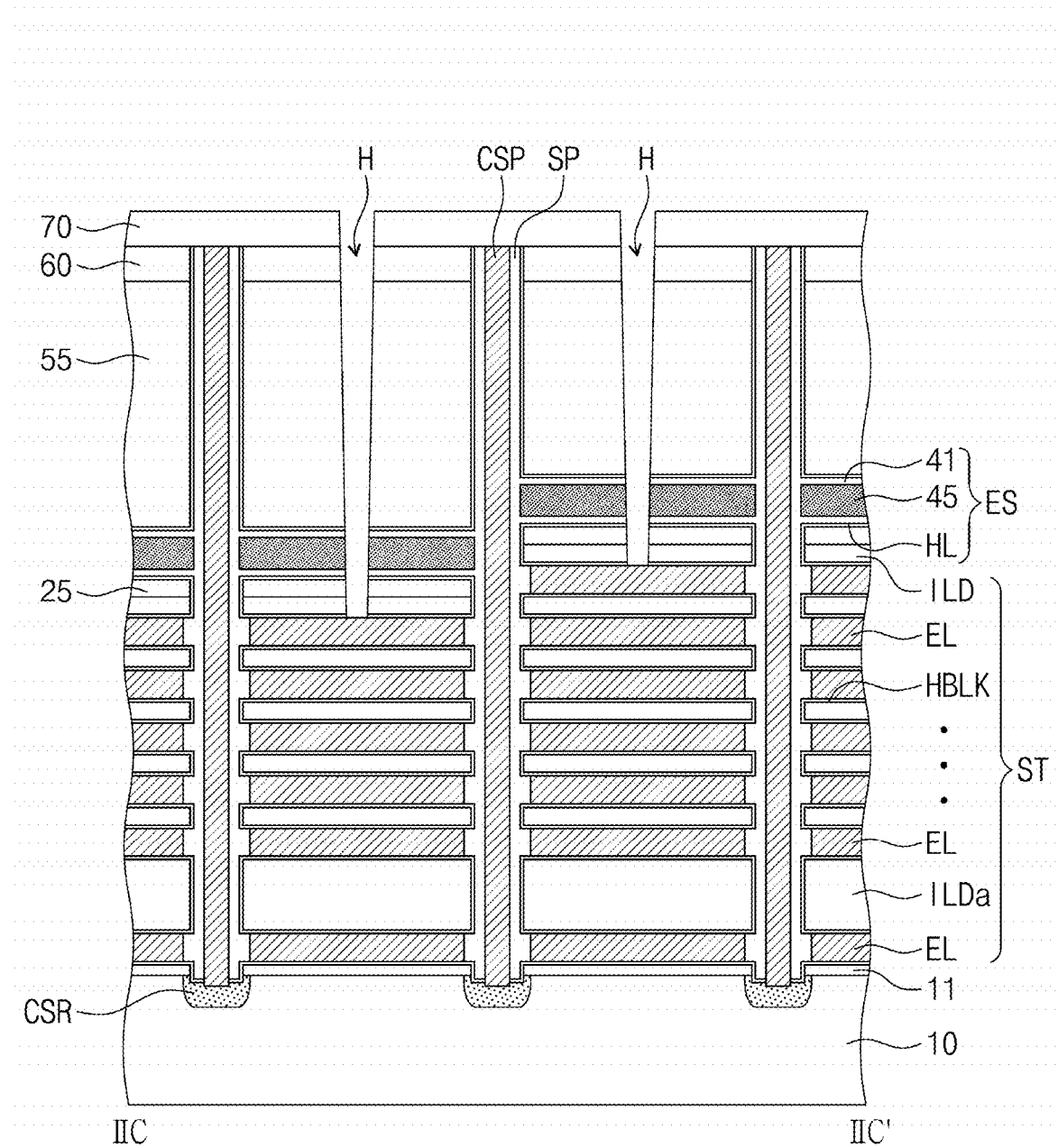

During the formation of the planarized buried dielectric layer 55, the pad sacrificial layer 35 and the pad dielectric layer 25 may be partially removed on the cell array region CAR. Although FIGS. 14A, 14B, and 14C show an example in which the pad sacrificial layer 35 and the pad dielectric layer 25 are partially removed on the cell array region CAR during the formation of the planarized buried dielectric layer 55, according to some example embodiments, the pad sacrificial layer 35 may undergo a patterning process to remove the pad dielectric layer 25 and the pad sacrificial layer 35 on the cell array region CAR before the buried dielectric layer is formed.

After the planarized buried dielectric layer 55 is formed, cell vertical structures CVS and dummy vertical structures DVS may be formed. The dummy vertical structures DVS and the cell vertical structures CVS may be formed at the same time, and may have the same or substantially similar structure.

On the cell array region CAR, the cell vertical structures CVS may penetrate the mold structure 110 and the buffer dielectric layer 11, and on the connection region CNR, the dummy vertical structures DVS may penetrate the planarized buried dielectric layer 55, the pad sacrificial layer 35, the pad dielectric layer 25, and the mold structure 110.

The formation of the cell and dummy vertical structures CVS and DVS may include forming vertical holes to penetrate the mold structure 110 and the buffer dielectric layer 11 and to expose the substrate 10, and then forming a lower semiconductor pattern LSP and an upper semiconductor pattern USP in each of the vertical holes.

In certain example embodiments, because the pad dielectric layer 25 includes the same material as that of the dielectric layers ILD of the mold structure 110, and because the pad sacrificial layer 35 includes the same material as that of the sacrificial layers SL of the mold structure 110, the same etching condition may be utilized on the cell array region CAR and the connection region CNR when an anisotropic etching process is performed to form the vertical holes.

The lower semiconductor pattern LSP may be formed by performing a selective epitaxial growth (SEG) process in which the substrate 10 exposed to the vertical holes is served as a seed layer. Accordingly, the lower semiconductor pattern LSP may be formed to have a pillar shape that fills lower portions of the vertical holes.

The upper semiconductor pattern USP may be formed by depositing a semiconductor layer in the vertical holes in which the lower semiconductor pattern LSP is formed, and may be in contact with the lower semiconductor pattern LSP. A vertical dielectric pattern VP may be formed in the vertical holes before the upper semiconductor pattern USP is formed. The vertical dielectric pattern VP may be a portion of a data storage structure.

A bit line contact pad PAD may be formed on a top end of each of the upper semiconductor patterns USP. The bit line contact pad PAD may be an impurity doped region or may be formed of a conductive material.

Referring to FIGS. 1, 15A, 15B, and 15C, a first interlayer dielectric layer 60 may be formed on the planarized buried dielectric layer 55, covering top surfaces of the cell and dummy vertical structures CVS and DVS. The first interlayer dielectric layer 60, the planarized buried dielectric layer 55, and the mold structure 110 may be patterned to form line-shaped trenches T. The trenches T may extend in the first direction D1 and may be spaced apart from each other in the second direction D2 intersecting the first direction D1. The trenches T may include first trenches extending from the cell array region CAR toward the connection region CNR, second trenches between the first trenches on the cell array region CAR, and third trenches between the first trenches on the connection region CNR.

The trenches T may be spaced apart from the cell and dummy vertical structures CVS and DVS, and may expose sidewalls of the sacrificial layers SL and sidewalls of the pad sacrificial layer 35. The formation of the trenches T may allow the mold structure 110 to have a linear shape extending in the first direction D1 when viewed in plan.

Referring to FIGS. 1, 16A, 16B, and 16C, the sacrificial layers SL exposed to the trenches T may be removed to form gate regions GR between the dielectric layers ILD that are vertically adjacent to each other. The gate regions GR may expose portions of the cell vertical structures CVS.

In certain example embodiments, because the pad sacrificial layer 35 is formed of the same material as that of the sacrificial layers SL, the pad sacrificial layer 35 exposed to the trenches T may be removed while the sacrificial layers SL are removed. Therefore, an etch stop region 35R may be formed together with the gate regions GR. The etch stop region 35R may be an empty space between the pad dielectric layer 25 and the planarized buried dielectric layer 55. The etch stop region 35R may have a vertical height H2 greater than a vertical height H1 of each of the gate regions GR.

The gate regions GR and the etch stop region 35R may be formed by an isotropic etching process in which the sacrificial layers SL and the pad sacrificial layer 35 are isotropically etched with an etch recipe that has an etch selectivity with respect to the dielectric layers ILD, the pad dielectric layer 25, and the planarized buried dielectric layer 55. For example, when the sacrificial layers SL and the pad sacrificial layer 35 are silicon nitride layers, and when the dielectric layers ILD, the pad dielectric layer 25, and the planarized buried dielectric layer 55 are silicon oxide layers, an etchant including phosphorous acid may be used such that the sacrificial layers SL and the pad sacrificial layer 35 may be isotropically etched to form the gate regions GR and the etch stop region 35R.

Referring to FIGS. 1, 17A, 17B, and 17C, a gate dielectric layer 15 may be formed on a sidewall of the lower semiconductor pattern LSP exposed to a lowermost one of the gate regions GR. The gate dielectric layer 15 may be formed by, for example, an annealing process under a gaseous atmosphere including oxygen atoms. Thus, the sidewall of the lower semiconductor pattern LSP exposed to the gate region GR may be thermally oxidized to form the gate dielectric layer 15.

A horizontal blocking dielectric layer HBLK and a horizontal dielectric layer HL may be formed to conformally cover inner walls of the gate regions GR and an inner wall of the etch stop region 35R, respectively. The horizontal blocking dielectric layer HBLK and the horizontal dielectric layer HL may be formed to have substantially uniform thicknesses on a surface of the mold structure 110 in which the gate regions GR and the etch stop region 35R are formed. The horizontal blocking dielectric layer HBLK and the horizontal dielectric layer HL may be formed by chemical vapor deposition or atomic layer deposition.

The horizontal blocking dielectric layer HBLK and the horizontal dielectric layer HL may include a single thin layer or a plurality of thin layers. In certain example embodiments, the horizontal blocking dielectric layer HBLK and the horizontal dielectric layer HL may be a portion of a data storage structure included in NAND Flash memory devices. For example, the horizontal dielectric layer HL may include a high-k dielectric layer (e.g., an aluminum oxide layer or a hafnium oxide layer).

A gate conductive layer CL may be formed in the gate regions GR in which the horizontal blocking dielectric layer HBLK is formed and in the etch stop region 35R in which the horizontal dielectric layer HL is formed. The gate conductive layer CL may be formed by, for example, chemical vapor deposition or atomic layer deposition.

Because the etch stop region 35R has a vertical thickness greater than those of the gate regions GR, the gate conductive layer CL may completely fill the gate regions GR and partially fill the etch stop region 35R. For example, the gate conductive layer CL may define a gap, or an empty space, in the etch stop region 35R. In addition, the gate conductive layer CL may partially or completely fill the trenches T.

For example, the formation of the gate conductive layer CL may include sequentially depositing a barrier metal layer and a metal layer. The barrier metal layer may include metal nitride (e.g., TiN, TaN, or WN). The metal layer may include metal (e.g., W, Al, Ti, Ta, Co, or Cu).

Referring to FIGS. 1, 18A, 18B, and 18C, the gate conductive layer CL in the trenches T may be partially removed to locally form electrodes EL in corresponding gate regions GR.

For example, the electrodes EL may be formed by anisotropically etching the gate conductive layer CL deposited in the trenches T. For another example, the electrodes EL may be formed by isotropically etching the gate conductive layer CL deposited in the trenches T. When the gate conductive layer CL is etched, the horizontal blocking dielectric layer HBLK and the horizontal dielectric layer HL may be used as an etch stopper, and the formation of the electrodes EL may expose the horizontal blocking dielectric layer HBLK and the horizontal dielectric layer HL deposited on sidewalls of the dielectric layers ILD. The electrodes EL may have sidewalls that are recessed relative to the sidewalls of the dielectric layers ILD.

The partial removal of the gate conductive layer CL from the trenches T may form an electrode structure ST in which the dielectric layers ILD and the electrodes EL are alternately and repeatedly stacked. The electrode structure ST may extend in the first direction D1, and sidewalls of the electrode structure ST may be exposed to the trenches T. The substrate 10 may also be exposed between neighboring electrode structures ST.

In certain example embodiments, when the gate conductive layer CL is etched on sidewalls of the trenches T, the gate conductive layer CL may also be etched in the etch stop region 35R to expose the horizontal dielectric layer HL deposited in the etch stop region 35R.

Referring to FIGS. 1, 19A, 19B, and 19C, a first buffer dielectric layer 41 and an etch stop layer 43 may be sequentially formed in the trenches T, covering sidewalls of the electrode structure ST. The first buffer dielectric layer 41 and the etch stop layer 43 may be formed by, for example, chemical vapor deposition or atomic layer deposition.

The first buffer dielectric layer 41 may conformally cover the etch stop region 35R in which the horizontal dielectric layer HL is formed, and may extend on the sidewall of the electrode structure ST. For example, the first buffer dielectric layer 41 may extend onto the sidewalls of the dielectric layers ILD and the electrodes EL exposed to the trenches T. The first buffer dielectric layer 41 may include a dielectric material (e.g., silicon oxide) different from that of the horizontal dielectric layer HL.

The etch stop layer 43 may fill the etch stop region 35R in which the first buffer dielectric layer 41 is formed. The etch stop layer 43 may include a dielectric material (e.g., silicon nitride), having an etch selectivity with respect to the first buffer dielectric layer 41. The etch stop layer 43 may completely fill the etch stop region 35R and may cover the sidewalls of the trenches T in which the first buffer dielectric layer 41 is formed. The etch stop layer 43 may partially or completely fill the trenches T.

Because a deposition technique is used to form the etch stop layer 43, the etch stop layer 43 may be deposited from an inner wall of the etch stop region 35R and thus a seam or void may be formed inside the etch stop layer 43.

Referring to FIGS. 1, 20A, 20B, and 20C, the etch stop layer 43 may be removed from inner walls of the trenches T such that an etch stop pattern 45 may be locally formed in the etch stop region 35R. The etch stop pattern 45 may be formed by an isotropic etching process on the etch stop layer 43.

When the isotropic etching process is performed on the etch stop layer 43, the first buffer dielectric layer 41 covering the sidewalls of the trenches T may be used as an etch stopper. The formation of the etch stop pattern 45 may expose the first buffer dielectric layer 41 deposited on the sidewalls of the electrodes EL. According to some example embodiments (e.g., FIGS. 3B and 3C), a portion of the etch stop layer 43 may remain on the sidewalls of the trenches T.

By forming the etch stop pattern 45 in the etch stop region 35R, an etch stop structure ES including the horizontal dielectric layer HL, the first buffer dielectric layer 41, and the etch stop pattern 45 may be formed.

After the etch stop pattern 45 is formed, a second buffer dielectric layer (not shown) may be formed to cover inner walls of the trenches T. The second buffer dielectric layer may cover a sidewall of the etch stop pattern 45 exposed to the trenches T. The second buffer dielectric layer may be formed of the same material as that of the first buffer dielectric layer 41. In some embodiments, no second buffer dielectric layer may be formed.

After the second buffer dielectric layer is deposited, the second buffer dielectric layer may undergo an etch-back process to form a sidewall spacer SP covering the sidewall of the electrode structure ST and to expose the substrate 10 between neighboring electrode structures ST.

Common source region CSR may be formed in the substrate 10 exposed between the electrode structures ST. The common source regions CSR may extend in parallel along the first direction D1, and may be spaced apart from each other in the second direction D2. The common source regions CSR may be formed by doping the substrate 10 with impurities whose conductive type is different from that of the substrate 10.

Referring to FIGS. 1, 21A, 21B, and 21C, common source plugs CSP may be formed in the trenches T in which the sidewall spacer SP is formed. The common source plugs CSP may be formed by depositing a conductive layer to fill the trenches T in which the sidewall spacer SP is formed and then performing a planarization process until the first interlayer dielectric layer 60 is exposed. The common source plugs CSP may extend in the first direction D and parallel to the electrodes EL.

A second interlayer dielectric layer 70 may be formed on the first interlayer dielectric layer 60, covering the common source plugs CSP. On the connection region CNR, contact holes H may be formed to penetrate the second interlayer dielectric layer 70, the first interlayer dielectric layer 60, and the planarized buried dielectric layer 55.

The contact holes H may be formed by forming an etching mask (not shown) on the second interlayer dielectric layer 70, and then performing an anisotropic etching process in which plasma is used to anisotropically etch the first and second interlayer dielectric layers 60 and 70 and the planarized buried dielectric layer 55. On the connection region CNR, the contact holes H may exposed corresponding end portions of the electrodes EL. The contact holes H may have different vertical lengths (or lengths in a vertical direction to a top surface of the substrate 10).

When the anisotropic etching process using plasma is performed to form the contact holes H whose vertical lengths are different from each other, the etch stop structure ES may be used as an etching stopper and therefore it may be possible to mitigate or prevent earlier exposure of the electrodes EL in the contact holes H whose vertical lengths are relatively small.

After the contact holes H are formed by using the etch stop structure ES as an etch stopper, the pad dielectric layer 25 and the horizontal dielectric layer HL may be partially over-etched below the etch stop structure ES. Therefore, pad portions of the electrodes EL may be exposed to corresponding contact holes H.

Referring to FIGS. 2A, 2B, and 2C, on the connection regions CNR, cell contact plugs CPLG may be formed in the contact holes H. The formation of the cell contact plugs CPLG may include sequentially depositing a barrier metal layer and a metal layer in the contact holes H and performing a planarization process until a top surface of the second interlayer dielectric layer 70 is exposed.

First bit line contact plugs BPLG1 may be formed simultaneously with the cell contact plugs CPLG. Subsidiary bit lines SBL and lower connection lines LCL may be formed on the cell array region CAR and the connection region CNR, respectively, and a third interlayer dielectric layer 80 may be formed on the second interlayer dielectric layer 70.

Bit lines BL and upper connection lines UCL may be formed on the third interlayer dielectric layer 80.

According to some example embodiments of the present inventive concepts, an etch stop structure may be formed to conformally cover a stepwise portion of an electrode structure, and thus regardless of an etch selectivity between a planarized buried dielectric layer and electrodes, it may be possible to simultaneously form cell contact plugs that are correspondingly coupled to the electrodes. Further, when the cell contact plugs are simultaneously formed to be connected to corresponding electrodes, it may be possible to mitigate or prevent an undesirable connection between vertically adjacent electrodes.

Furthermore, because the etch stop structure includes a dielectric material, when forming a plurality of dummy vertical structures penetrating the electrode structure on a connection region, an etching process may be easily performed to form dummy vertical holes.

Although the present inventive concepts have been described in connection with some example embodiments illustrated in the accompanying drawings, it will be understood to those skilled in the art that various changes and modifications may be made to the example embodiments without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A three-dimensional semiconductor memory device, comprising:
   a substrate including a cell array region and a connection region;
   an electrode structure including a plurality of electrodes and a plurality of dielectric layers alternately stacked on the substrate, the electrode structure having a stepwise portion on the connection region;
   an etch stop structure on the stepwise portion of the electrode structure; and
   a plurality of contact plugs on the connection region, the contact plugs penetrating the etch stop structure and connected to corresponding pad portions of the electrodes, respectively,
   wherein the etch stop structure includes an etch stop pattern and a horizontal dielectric layer, the horizontal dielectric layer having a uniform thickness and covering a top surface and a bottom surface of the etch stop pattern.

2. The device of claim 1, wherein the horizontal dielectric layer includes:
   a first portion covering the top surface of the etch stop pattern; and
   a second portion covering the bottom surface of the etch stop pattern,
   wherein the first portion and the second portion include a same material.

3. The device of claim 1, wherein the etch stop pattern includes a dielectric material different from a dielectric material of the horizontal dielectric layer and a dielectric material of the dielectric layers.

4. The device of claim 1, further comprising:
   a vertical structure on the cell array region, the vertical structure penetrating the electrode structure; and
   a horizontal blocking dielectric layer covering both a top surface and a bottom surface of the electrodes,
   wherein a first portion of the horizontal blocking dielectric layer covers first sidewalls of the electrodes, the first sidewalls of the electrodes being adjacent to the vertical structure.

5. The device of claim 4, wherein the horizontal dielectric layer includes:
   a first portion covering the top surface of the etch stop pattern; and
   a second portion covering the bottom surface of the etch stop pattern,
   wherein each of the first portion and the second portion of the horizontal dielectric layer has a thickness less than a thickness of the first portion of the horizontal blocking dielectric layer.

6. The device of claim 1, further comprising:
   a buffer dielectric layer between the etch stop pattern and the horizontal dielectric layer.

7. The device of claim 6, wherein the buffer dielectric layer includes a dielectric material different from a dielectric material of the etch stop pattern and a dielectric material of the horizontal dielectric layer.

8. The device of claim 6, further comprising:
   a common source plug penetrating the electrode structure, the common source plug extending in a first direction and being parallel to the electrode structure,
   wherein a portion of the buffer dielectric layer is between the common source plug and second sidewalls of the electrodes, the second sidewalls of the electrodes being adjacent to the common source plug.

9. The device of claim 8, wherein a thickness of the buffer dielectric layer between the etch stop pattern and the horizontal dielectric layer is greater than a thickness of the buffer dielectric layer on the second sidewalls of the electrodes.

10. The device of claim 1, further comprising:
    a common source plug penetrating the electrode structure, the common source plug extending in a first direction and being parallel to the electrode structure; and
    a sidewall spacer between the common source plug and the electrode structure,
    wherein the sidewall spacer covers a sidewall of the etch stop pattern.

11. The device of claim 10, wherein
    sidewalls of the electrodes are spaced apart at a first horizontal distance from a sidewall of the common source plug,
    the sidewall of the etch stop pattern is spaced apart at a second horizontal distance from the common source plug, and
    the second horizontal distance is greater than the first horizontal distance.

12. The device of claim 1, wherein
    each of the electrodes has a first thickness in a second direction perpendicular to a top surface of the substrate, and
    the etch stop structure has a second thickness in the second direction on the stepwise portion, the second thickness being greater than the first thickness.

13. The device of claim 1, further comprising:
    a pad dielectric layer between the etch stop structure and the stepwise portion of the electrode structure,
    wherein the pad dielectric layer includes a dielectric material different from a dielectric material of the etch stop pattern.

14. A three-dimensional semiconductor memory device, comprising:
    a substrate including a cell array region and a connection region;

an electrode structure including a plurality of electrodes and a plurality of dielectric layers alternately stacked in a first direction perpendicular to a top surface of the substrate, the electrode structure extending in a second direction parallel to the top surface of the substrate, the electrode structure having a stepwise portion on the connection region;

an etch stop pattern covering the stepwise portion of the electrode structure; and a common source plug penetrating the electrode structure in the first direction and extending in the second direction, wherein a first distance between a sidewall of the common source plug and a sidewall of the etch stop pattern is different from a second distance between the sidewall of the common source plug and sidewalls of the electrodes.

15. The device of claim 14, further comprising:

a plurality of vertical structures penetrating the electrode structure;

a horizontal blocking dielectric layer covering the vertical structures, the sidewalls of the electrodes, and top surfaces and bottom surfaces of the electrodes; and a horizontal dielectric layer covering both a top surface and a bottom surface of the etch stop pattern, wherein the horizontal dielectric layer includes a same material as the horizontal blocking dielectric layer, the electrodes have first sidewalls adjacent to the vertical structures, and the horizontal dielectric layer includes, a first portion covering the first sidewalls of the electrodes, a second portion covering the top surface of the etch stop pattern, and a third portion covering the bottom surface of the etch stop pattern, each of the second and third portions each having a thickness less than a thickness of the first portion.

16. The device of claim 15, further comprising:

a buffer dielectric layer between the etch stop pattern and the horizontal dielectric layer, wherein a portion of the buffer dielectric layer is between the common source plug and the sidewalls of the electrodes, and wherein a thickness of the buffer dielectric layer between the etch stop pattern and the horizontal dielectric layer is greater than a thickness of the buffer dielectric layer on the sidewalls of the electrodes.

17. The device of claim 14, wherein the etch stop pattern has a rounded sidewall that is adjacent to the common source plug.

18. The device of claim 14, further comprising:

a sidewall spacer between the common source plug and the electrode structure, wherein the sidewall spacer includes a protrusion that horizontally protrudes toward the sidewall of the etch stop pattern.

19. The device of claim 14, wherein the etch stop pattern includes a dielectric material different from a dielectric material of the dielectric layers.

20. The device of claim 14, further comprising:

a pad dielectric layer between the etch stop pattern and the stepwise portion of the electrode structure, wherein the pad dielectric layer includes a dielectric material different from a dielectric material of the etch stop pattern.

* * * * *